United States Patent
Cho et al.

(10) Patent No.: US 9,293,710 B2
(45) Date of Patent: Mar. 22, 2016

(54) ORGANIC LIGHT-EMITTING DIODE

(71) Applicant: SAMSUNG DISPLAY CO., LTD., Yongin-si, Gyeonggi-do (KR)

(72) Inventors: Se-Jin Cho, Yongin-si (KR); Chang-Ho Lee, Yongin-si (KR); Dae-Yup Shin, Yongin-si (KR); Young-Mok Son, Yongin-si (KR); Il-Soo Oh, Yongin-si (KR); Hee-Joo Ko, Yongin-si (KR); Jin-Young Yun, Yongin-si (KR); Bo-Ra Lee, Yongin-si (KR); Seok-Hwan Hwang, Yongin-si (KR); Young-Kook Kim, Yongin-si (KR); Yoon-Hyun Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 199 days.

(21) Appl. No.: 13/630,855

(22) Filed: Sep. 28, 2012

(65) Prior Publication Data

US 2013/0228755 A1  Sep. 5, 2013

(30) Foreign Application Priority Data

Mar. 2, 2012 (KR) .......................... 10-2012-0022038

(51) Int. Cl.
*H01L 51/54* (2006.01)
*H01L 51/00* (2006.01)
*H01L 51/50* (2006.01)

(52) U.S. Cl.
CPC ........ *H01L 51/0053* (2013.01); *H01L 51/0061* (2013.01); *H01L 51/5096* (2013.01)

(58) Field of Classification Search
None
See application file for complete search history.

(56) References Cited

U.S. PATENT DOCUMENTS

2007/0252521 A1*  11/2007  Kondakov et al. ............ 313/506
2010/0164371 A1*  7/2010  Jeong et al. ................... 313/504
2011/0210320 A1*  9/2011  Shin et al. ....................... 257/40

FOREIGN PATENT DOCUMENTS

KR  10-2011-0027484 A  3/2011

* cited by examiner

*Primary Examiner* — J. L. Yang
(74) *Attorney, Agent, or Firm* — Lewis Roca Rothgerber Christie LLP

(57) ABSTRACT

An organic light-emitting diode including a buffer layer including an amine-based compound.

23 Claims, 3 Drawing Sheets

ORGANIC LIGHT-EMITTING DIODE

CROSS-REFERENCE TO RELATED PATENT APPLICATION

This application claims priority to and the benefit of Korean Patent Application No. 10-2012-0022038, filed on Mar. 2, 2012, in the Korean Intellectual Property Office, the disclosure of which is incorporated herein in its entirety by reference.

BACKGROUND

1. Field

One or more embodiments of the present invention relate to an organic light-emitting diode.

2. Description of the Related Art

Organic light-emitting diodes (OLEDs) are self-emitting devices, have advantages (such as a wide viewing angle, excellent contrast, quick response, high brightness, and excellent driving voltage) and can provide multicolored images.

A general OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic layers formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

An aspect of an embodiment of the present invention is directed toward an improved organic light-emitting diode including a novel buffer layer between an emission layer and an electron transport layer, and thus, having a high efficiency and a long lifetime.

According to an embodiment of the present invention, there is provided an organic light-emitting diode including a substrate; a first electrode; a second electrode facing the first electrode; an emission layer interposed between the first electrode and the second electrode; an electron transport layer interposed between the emission layer and the second electrode; and a buffer layer interposed between the emission layer and the electron transport layer, wherein the buffer layer includes an amine-based compound represented by Formula 1 below:

<Formula 1>

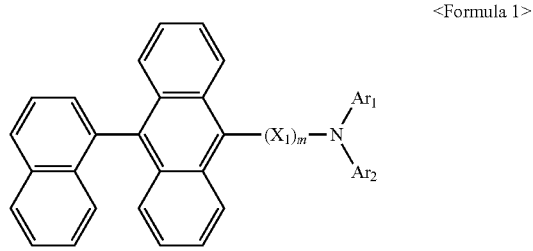

wherein in Formula 1, $Ar_1$ and $Ar_2$ are each independently a substituted or unsubstituted $C_6$-$C_{60}$ aryl group or a substituted or unsubstituted $C_2$-$C_{60}$ heteroaryl group;

$X_1$ is a substituted or unsubstituted $C_6$-$C_{60}$ arylene group or a substituted or unsubstituted $C_2$-$C_{60}$ heteroarylene group;

m is an integer of 1 to 5; and at least one substituent of the substituted $C_6$-$C_{60}$ aryl group, the substituted $C_2$-$C_{60}$ heteroaryl group, the substituted $C_6$-$C_{60}$ arylene group, and the substituted $C_2$-$C_{60}$ heteroarylene group is one of deuterium; —F; —Cl; —Br; —I; —CN; a hydroxyl group; —$NO_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, $C_6$-$C_{60}$ aryl group, and a $C_2$-$C_{60}$ heteroaryl group.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, one or more embodiments of an organic light-emitting diode (OLED) will be described in detail with reference to the accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
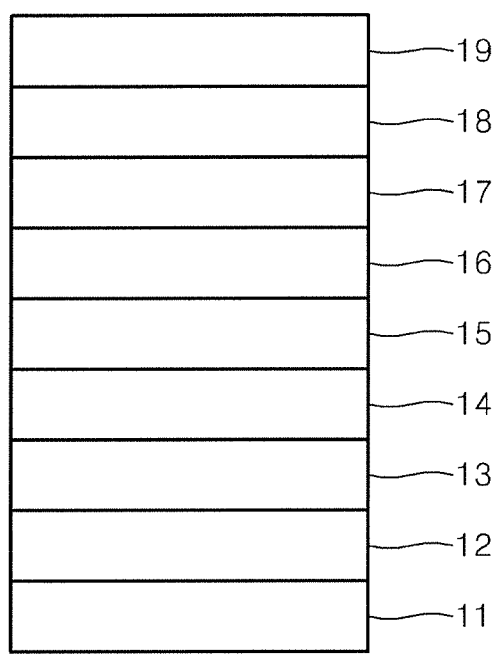
FIG. 1 is a schematic view illustrating a structure of an organic light-emitting diode (OLED) according to an embodiment of the present invention.

FIG. 1 is a schematic view illustrating a structure of an OLED according to an embodiment of the present invention.

Referring to FIG. 1, the OLED includes a substrate 11, a first electrode 12, a hole injection layer (HIL) 13, a hole transport layer (HTL) 14, an emission layer (EML) 15, a buffer layer 16, an electron transport layer (ETL) 17, an electron injection layer (EIL) 18, and a second electrode 19 that are sequentially stacked. The buffer layer 16 is interposed between the EML 15 and the ETL 17.

The substrate 11 may be a substrate used in a general OLED, and may be a glass substrate or a transparent plastic substrate having excellent mechanical strength, thermal stability, transparency, surface smoothness, ease of handling, and waterproofness.

The first electrode 12 may be formed by applying a first electrode material on the substrate 11 by deposition or sputtering. When the first electrode 12 is an anode, the first electrode material may be selected from materials having a high work function so as to facilitate hole injection. The first electrode 12 may be a reflective electrode, a semi-transparent electrode, or a transparent electrode. Examples of the first electrode material may include indium-tin oxide (ITO), indium-zinc-oxide (IZO), tin oxide ($SnO_2$), and zinc oxide (ZnO), which are transparent and highly conductive. Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 12 may be formed as a reflective electrode.

The first electrode 12 may be formed as a single layer or have a multi-layered structure having at least two layers. For example, the first electrode 12 may have a three-layered structure of ITO/Ag/ITO, but is not limited thereto.

The HIL 13 is formed on the first electrode 12. The HIL 13 may be formed on the first electrode 12 by using various suitable methods such as vacuum deposition, spin coating, casting, or LB deposition.

When the HIL 13 is formed by vacuum deposition, the deposition conditions may vary according to a compound used as a material for forming the HIL 13, a structure of a desired HIL, and thermal characteristics. For example, the deposition conditions may be, but are not limited to, a deposition temperature of about 100° C. to about 500° C., a degree of vacuum of about $10^{-8}$ torr to about $10^{-3}$ torr, and a deposition speed of about 0.01 Å/sec to about 100 Å/sec.

When the HIL 13 is formed by spin coating, the coating conditions may vary according to a compound used as a material for forming the HIL 13, a structure of a desired HIL, and thermal characteristics. For example, the coating conditions may be, but are not limited to, a coating speed of about 2,000 rpm to about 5,000 rpm and a heat treatment temperature for removing a solvent after coating of about 80° C. to about 200° C.

The material for forming the HIL 13 may be a known hole injection material. Examples of the known hole injection material include, but are not limited to, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate)(PEDOT/PSS), polyaniline/camphor sulfonicacid (Pani/CSA), and polyaniline)/poly(4-styrenesulfonate (PANI/PSS):

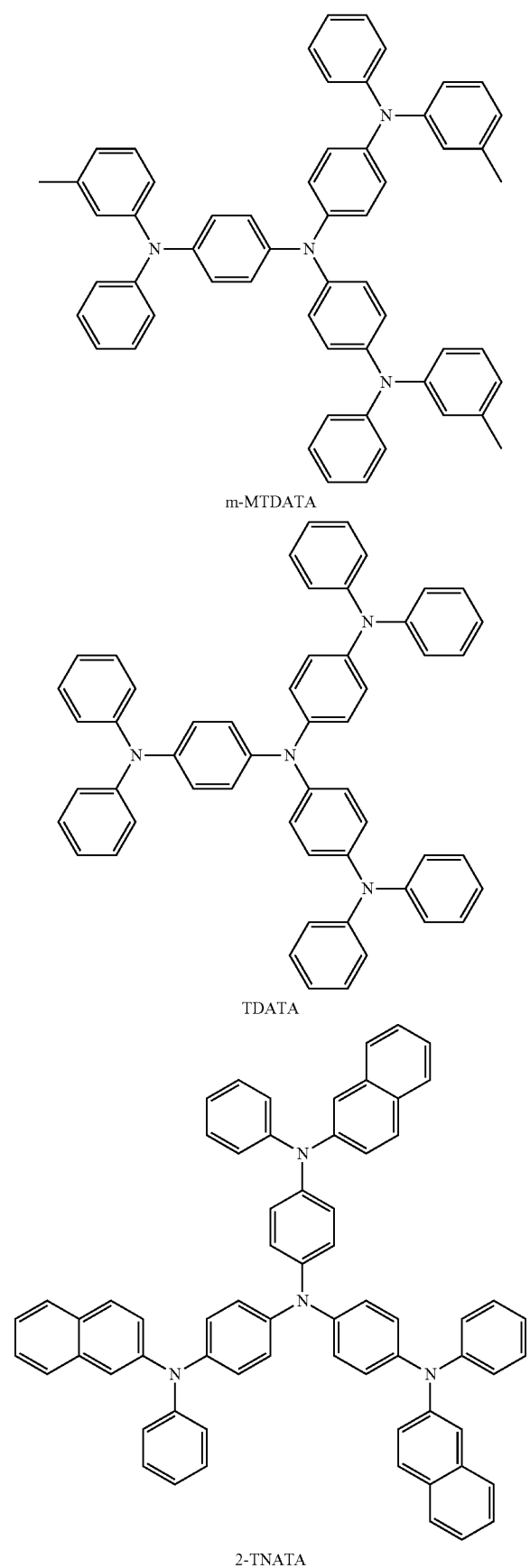

m-MTDATA

TDATA

2-TNATA

The thickness of the HIL 13 may be in the range of about 100 Å to about 10,000 Å. In some embodiments, the thickness of the HIL 30 may be in the range of about 100 Å to about 1,000 Å. When the thickness of the HIL 13 is within these ranges, satisfactory hole injection properties may be obtained without a substantial increase in driving voltage.

Next, the HTL 14 may be formed on the HIL 13 by using various suitable methods such as vacuum deposition, spin coating, casting, or LB deposition. When the HTL 14 is formed by vacuum deposition or spin coating, the deposition and coating conditions may vary according to used compounds. However, in general, the deposition and coating conditions may be almost the same as the conditions for forming the HIL 13.

A material for forming the HTL 14 may be a known hole transporting material. Examples of the known hole transporting material include, but are not limited to, carbazole derivatives such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB).

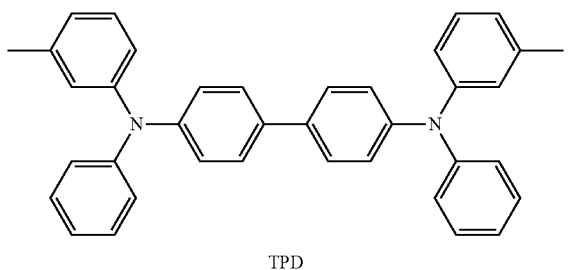

TPD

The thickness of the HTL 14 may be in the range of about 50 Å to about 2,000 Å. In some embodiments, the thickness of the HTL 14 may be in the range of about 100 Å to about 1,500 Å. When the thickness of the HTL 14 is within these ranges, satisfactory hole transport properties may be obtained without a substantial increase in driving voltage.

At least one of the HIL 13 and the HTL 14 may include at least one of a compound represented by Formula 300 below and a compound represented by Formula 350 below:

<Formula 300>

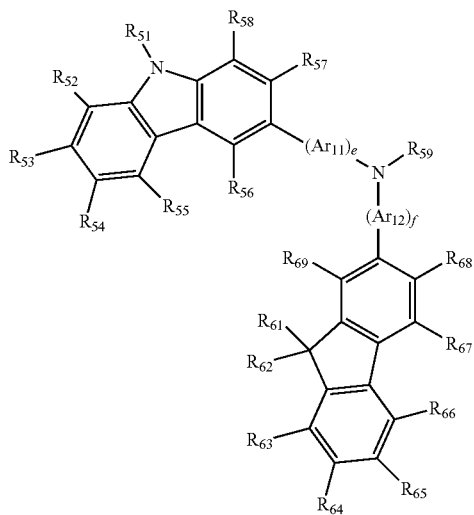

<Formula 350>

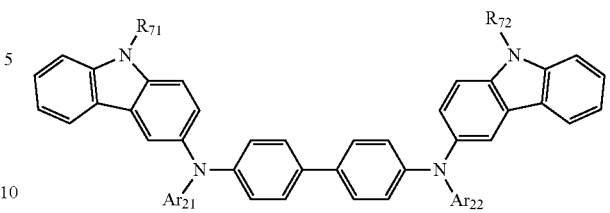

In Formula 300, $Ar_{11}$ and $Ar_{12}$ may be each independently a substituted or unsubstituted $C_6$-$C_{60}$ arylene group. For example, the $Ar_{11}$ and $Ar_{12}$ groups are the same as described below in connection with $X_1$.

In Formula 350, $Ar_{21}$ and $Ar_{22}$ may be each independently a substituted or unsubstituted $C_6$-$C_{60}$ aryl group or a substituted or unsubstituted $C_2$-$C_{60}$ heteroaryl group. For example, $Ar_{21}$ and $Ar_{22}$ may be each independently a substituted or unsubstituted phenyl group, a substituted or unsubstituted naphthyl group, a substituted or unsubstituted phenanthrenyl group, a substituted or unsubstituted anthryl group, a substituted or unsubstituted pyrenyl group, a substituted or unsubstituted chrysenyl group, a substituted or unsubstituted fluorenyl group, a substituted or unsubstituted carbazolyl group, a substituted or unsubstituted dibenzofuranyl group, or a substituted or unsubstituted dibenzothiophenyl group. In this regard, at least one substituent of the substituted phenyl group, the substituted naphthyl group, the substituted phenanthrenyl group, the substituted anthryl group, the substituted pyrenyl group, the substituted chrysenyl group, the substituted fluorenyl group, the substituted carbazolyl group, the substituted dibenzofuranyl group, and the substituted dibenzothiophenyl group may be selected from deuterium; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid or a salt thereof; a $C_1$-$C_{10}$ alkyl group; a $C_1$-$C_{10}$ alkoxy group; a phenyl group; a naphthyl group; a fluorenyl group; a phenanthrenyl group; an anthryl group; a triphenylenyl group; a pyrenyl group; a chrysenyl group; an imidazolyl group; an imidazolinyl group; an imidazopyridinyl group; an imidazopyrimidinyl group; a pyridinyl group; a pyrimidinyl group; an indolyl group; and a phenyl group, a naphthyl group, a fluorenyl group, a phenanthrenyl group, an anthryl group, a triphenylenyl group, a pyrenyl group, a chrysenyl group, an imidazolyl group, an imidazolinyl group, an imidazopyridinyl group, an imidazopyrimidinyl group, a pyridinyl group, a pyrazinyl group a pyrimidinyl group, and an indolyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{10}$ alkyl group, and a $C_1$-$C_{10}$ alkoxy group.

In Formula 300, e and f may be each independently an integer of 0 to 5, or 0, 1, or 2. For example, e may be 1 and f may be 0, but e and f are not limited to the above examples.

In Formulae 300 and 350, $R_{51}$ through $R_{58}$, $R_{61}$ through $R_{69}$, $R_{71}$, and $R_{72}$ may be each independently hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group. For example, $R_{51}$ through $R_{58}$, $R_{61}$ through $R_{69}$, $R_{71}$, and $R_{72}$ may be each independently one of hydrogen; deuterium; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid or a salt thereof; a $C_1$-$C_{10}$ alkyl group (e.g., a methyl group, an ethyl group, a propyl group, a butyl group, a pentyl group, a hexyl group, and the like); a $C_1$-$C_{10}$ alkoxy group (e.g., a methoxy group, an ethoxy group, a propoxy group, a butoxy group, a pentoxy group, and the like); a $C_1$-$C_{10}$ alkyl group and a $C_1$-$C_{10}$ alkoxy group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, and a phosphoric acid or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{10}$ alkyl group, and a $C_1$-$C_{10}$ alkoxy group, but are not limited thereto.

In Formula 300, $R_{59}$ may be one of a phenyl group; a naphthyl group; an anthryl group; a biphenyl group; a pyridyl group; and a phenyl group, a naphthyl group, an anthryl group, a biphenyl group, and a pyridyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a substituted or unsubstituted $C_1$-$C_{20}$ alkyl group, and a substituted or unsubstituted $C_1$-$C_{20}$ alkoxy group.

According to one embodiment, the compound of Formula 300 may be represented by Formula 300A below, but is not limited thereto:

<Formula 300A>

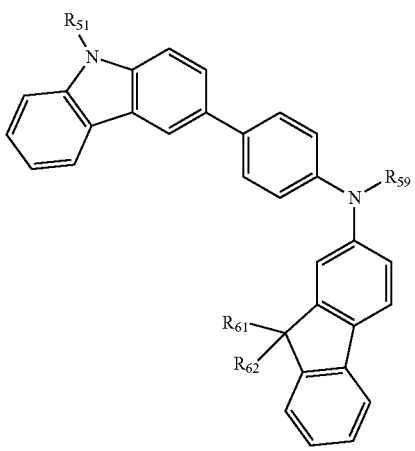

wherein in Formula 300A, $R_{51}$, $R_{60}$, $R_{61}$, and $R_{59}$ are the same as described above.

For example, at least one of the HIL 13 and the HTL 14 may include at least one of Compounds 301 to 320, but is not limited thereto:

301

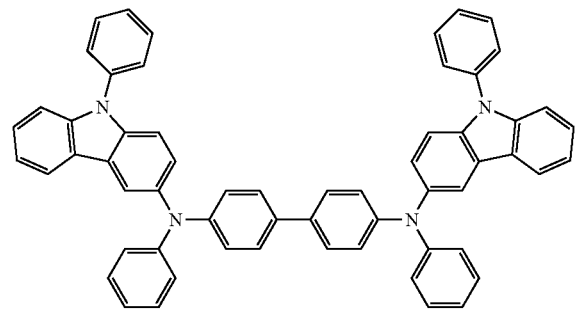

302

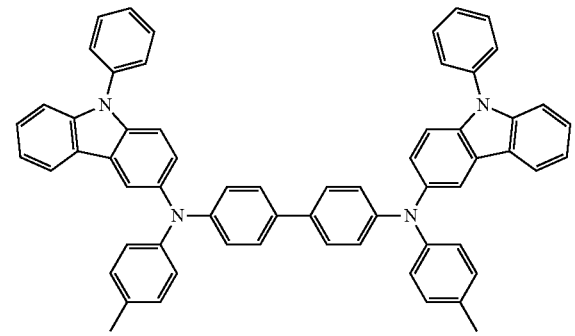

303

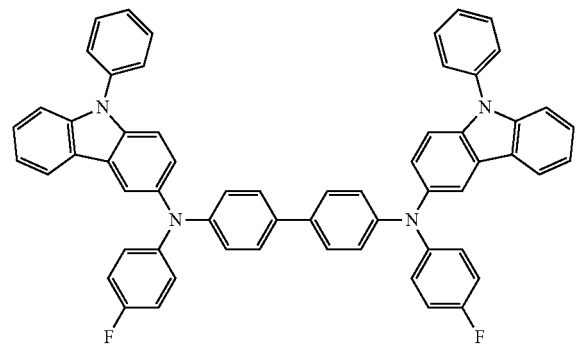

304

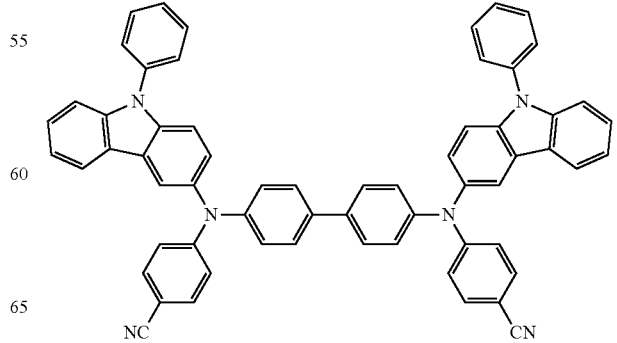

305
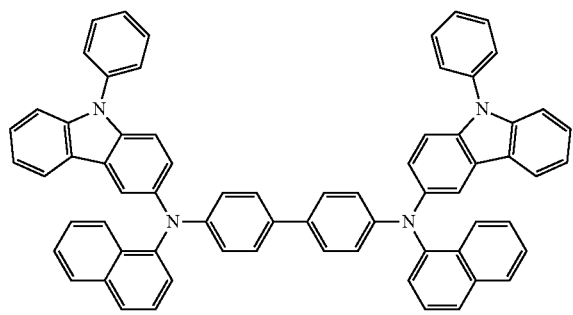
306
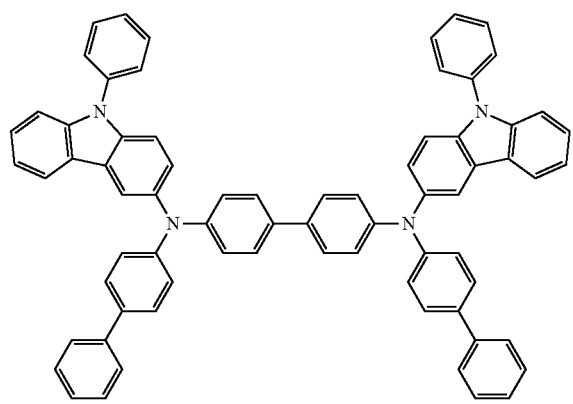
307
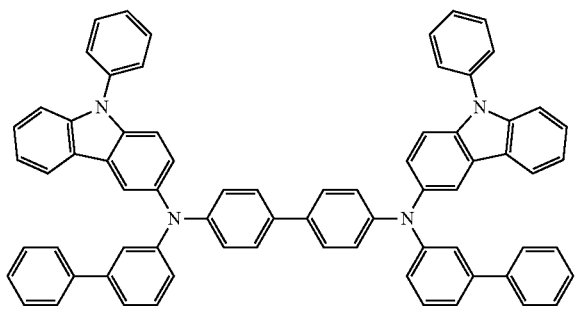
308
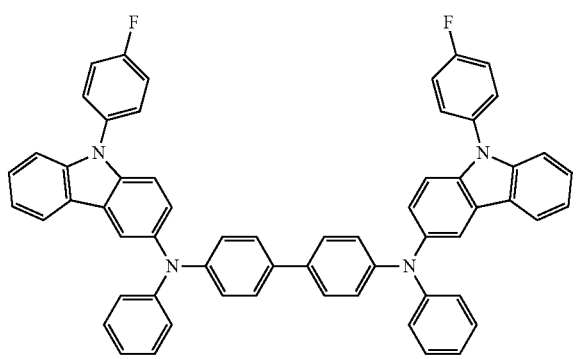
309
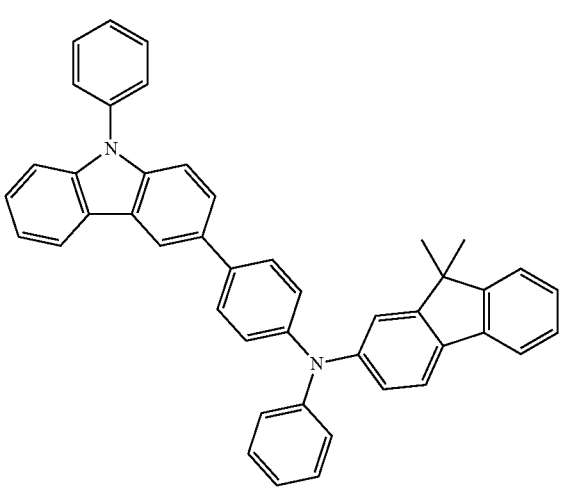
310
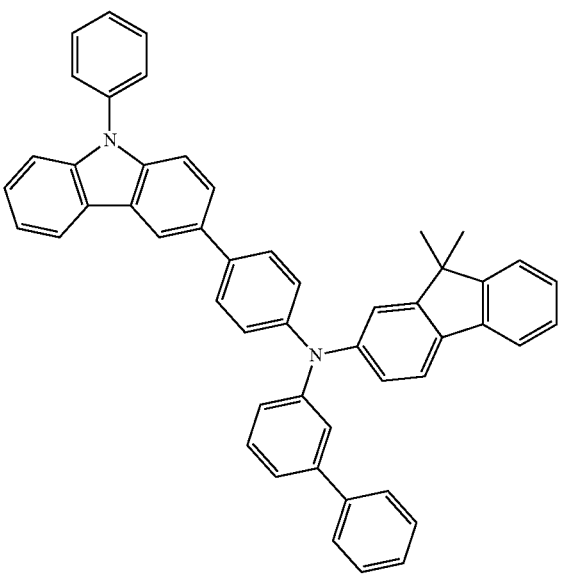

311
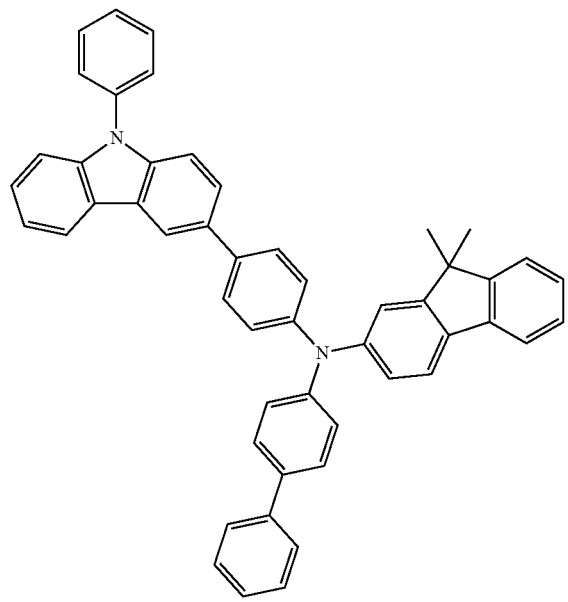
312
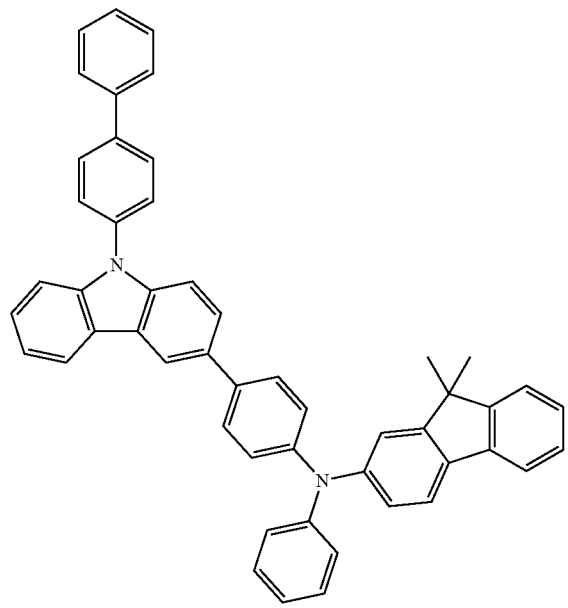
313
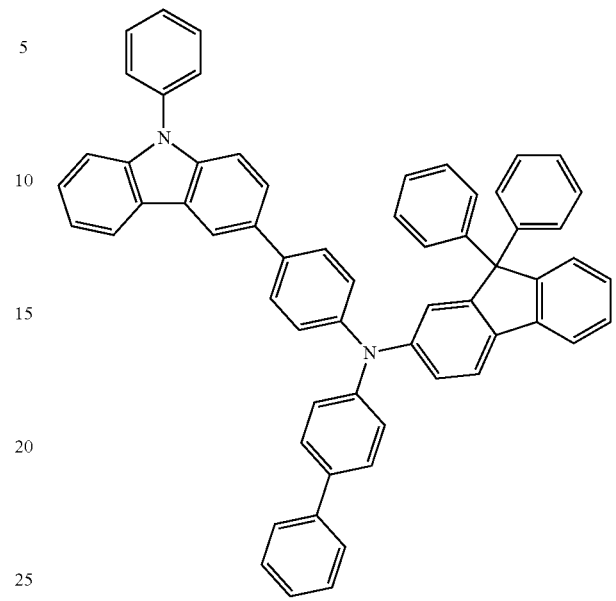
314
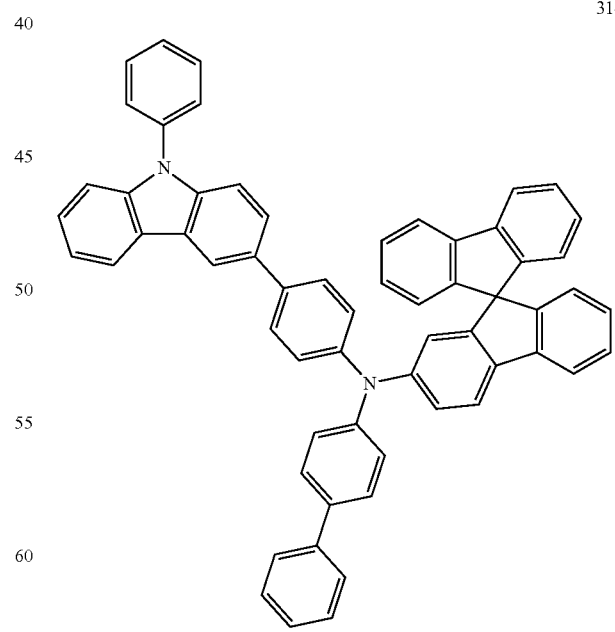

315
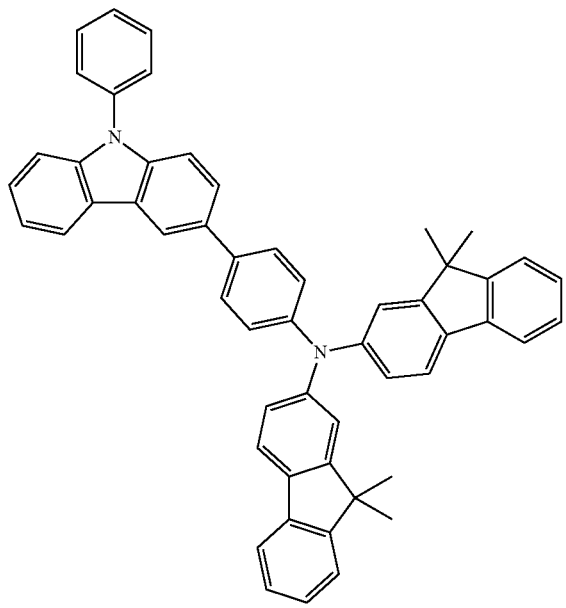
316
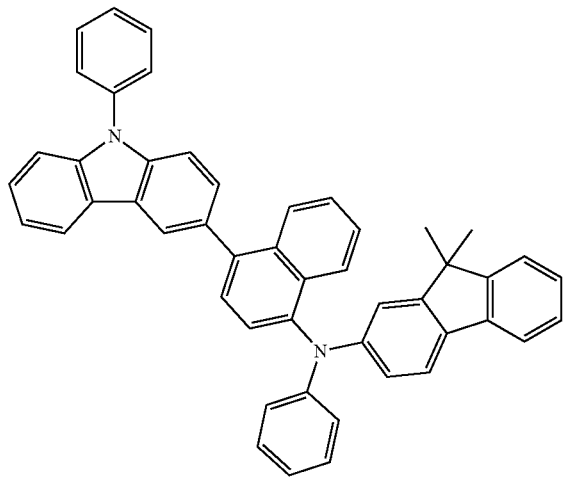
317
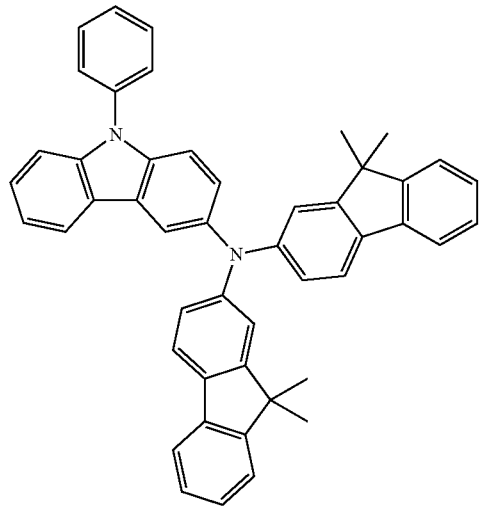
318
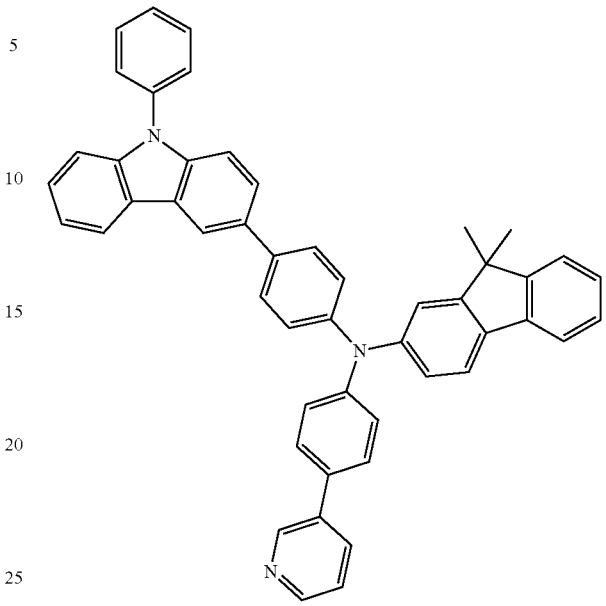
319
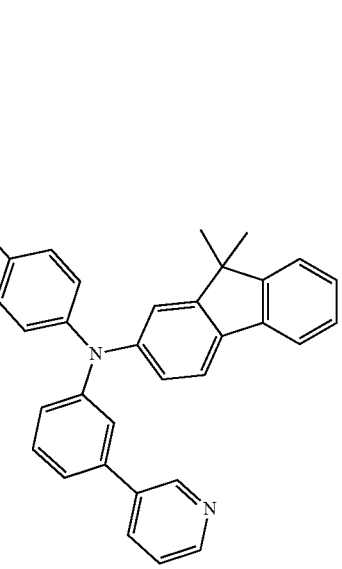

-continued

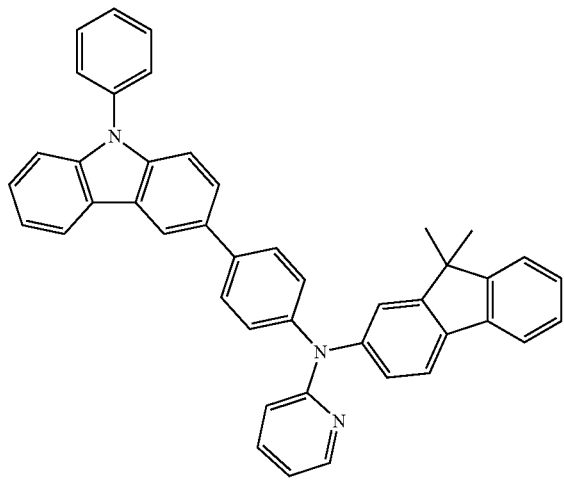
320

At least one of the HIL 13 and the HTL 14 may further include a charge-generating material so as to increase the conductivity of the layers.

The charge-generating material may be, for example, a p-dopant. The p-dopant may be one of a quinone derivative, a metal oxide, and a cyano-containing compound, but is not limited thereto. Non-limiting examples of the p-dopant may include, but are not limited to, quinone derivatives such as tetra-cyanoquinodimethane (TCNQ) and 2,3,5,6-tetrafluoro-tetracyano-1,4-benzoquinodimethane (F4-TCNQ); metal oxides such as a tungsten oxide and a molybdenum oxide; and cyano-containing compounds such as Compound 390 below and the like.

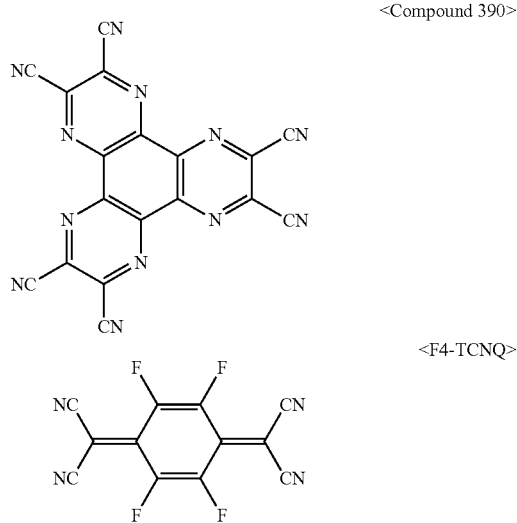

<Compound 390>

<F4-TCNQ>

When at least one of the HIL 13 and the HTL 14 further includes the charge-generating material, the charge-generating material may be homogeneously or inhomogeneously dispersed in at least one of the HIL 13 and the HTL 14.

In addition, an intermediate layer may be interposed between the HTL 14 and the EML 15. The intermediate layer may compensate for an optical resonance distance according to the wavelength of light emitted from the EML 15, thereby increasing an efficiency of an OLED. The intermediate layer may include a known hole injection material and a known hole transport material. Also, the intermediate layer may include the same material as one of the materials included in the HIL 13 and/or the HTL 14 formed below the intermediate layer.

Next, the EML 15 may be formed on the HTL 14 by using various suitable methods such as vacuum deposition, spin coating, casting, or LB deposition. When the EML 15 is formed by vacuum deposition or spin coating, the deposition and coating conditions may vary according to used compounds. However, in general, the conditions may be almost the same as the conditions for forming the HIL 13.

The EML 15 may include a known light-emitting material. For example, the EML 15 may include a known host and a known dopant.

Examples of the known host may include, but are not limited to, Alq$_3$, 4,4'-N,N'-dicarbazole-biphenyl (CBP), poly (n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see Formula below), and Compounds 501 to 509.

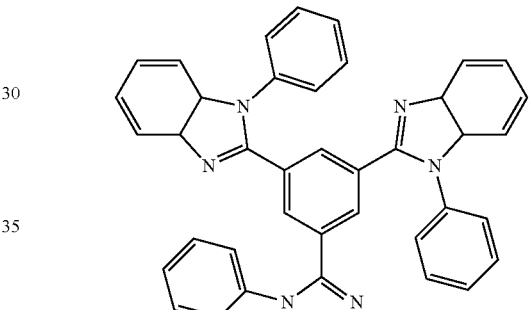

TPBI

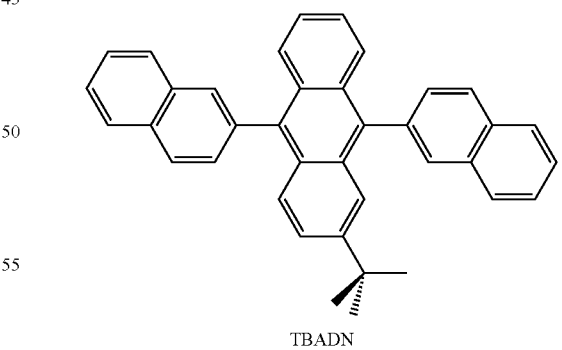

TBADN

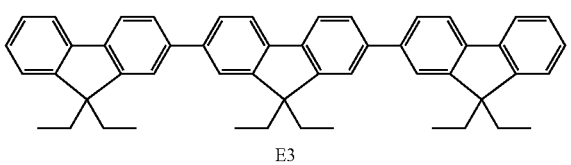

E3

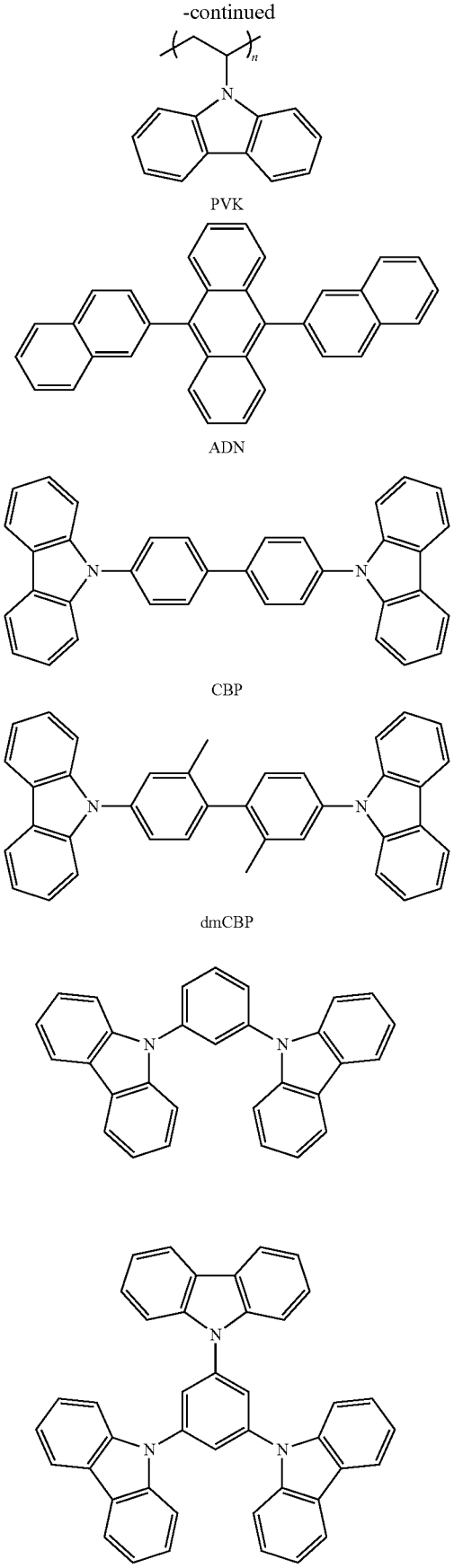
PVK
ADN
CBP
dmCBP
501
502
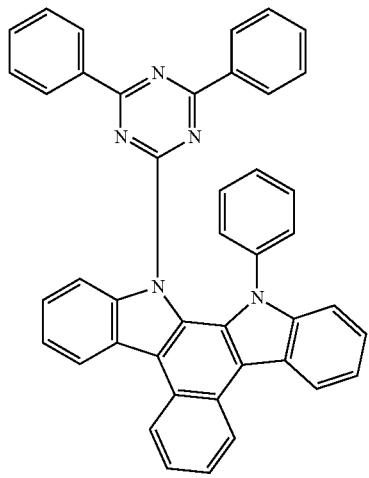
503
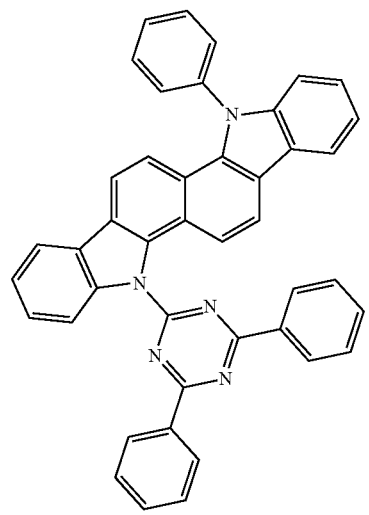
504
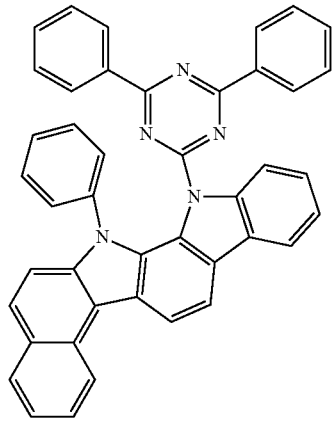
505

-continued

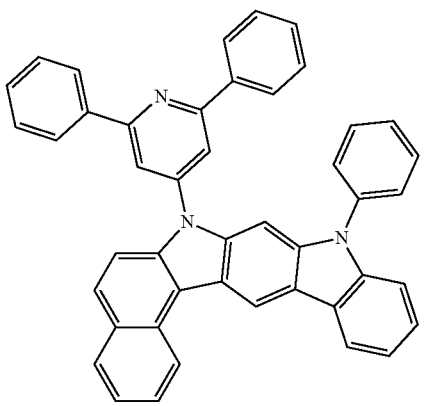

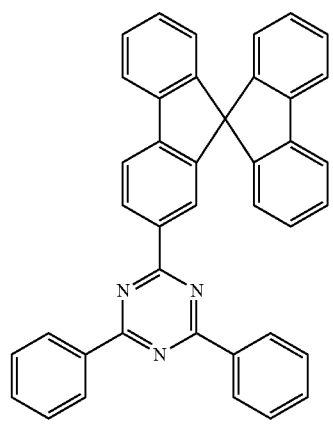

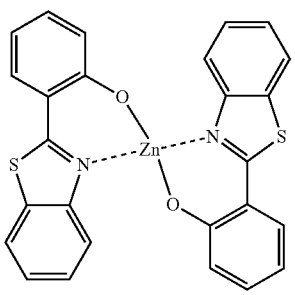

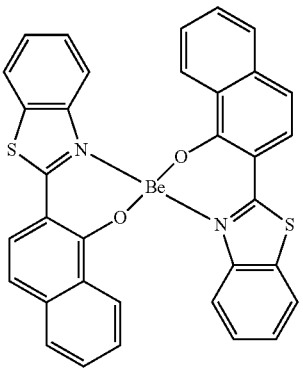

Alternatively, the host may be an anthracene-based compound represented by Formula 400 below:

<Formula 400>

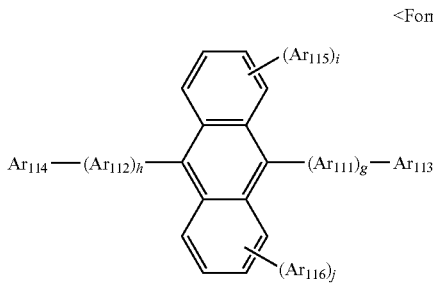

In Formula 400, $Ar_{111}$ and $Ar_{112}$ may be each independently a substituted or unsubstituted $C_6$-$C_{60}$ arylene group; $Ar_{113}$ through $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer of 0 to 4.

For example, in Formula 400, $Ar_{111}$ and $Ar_{112}$ may be each independently one of a phenylene group; a naphthylene group; a phenanthrenylene group; a pyrenylene group; and a phenylene group, a naphthylene group, a phenanthrenylene group, a fluorenyl group, and a pyrenylene group that are substituted with at least one of a phenyl group, a naphthyl group, and an anthryl group, but are not limited thereto.

In Formula 400, g, h, i, and j may be each independently 0, 1, or 2.

In Formula 400, $Ar_{113}$ through $Ar_{116}$ may be each independently a $C_1$-$C_{10}$ alkyl group that is substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

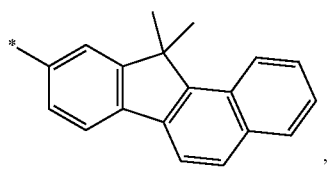 [SMILES: *c1ccc2c(c1)C(C)(C)c1c-2ccc2ccccc12]

but are not limited thereto.

For example, the anthracene-based compound of Formula 400 may be one of the following compounds, but is not limited thereto:

-continued
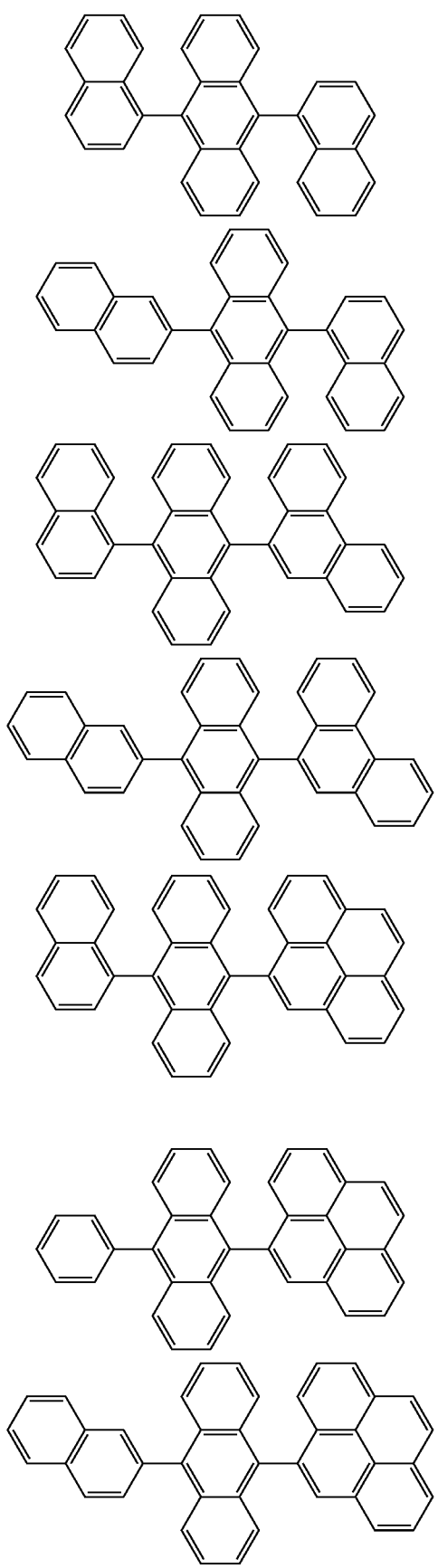
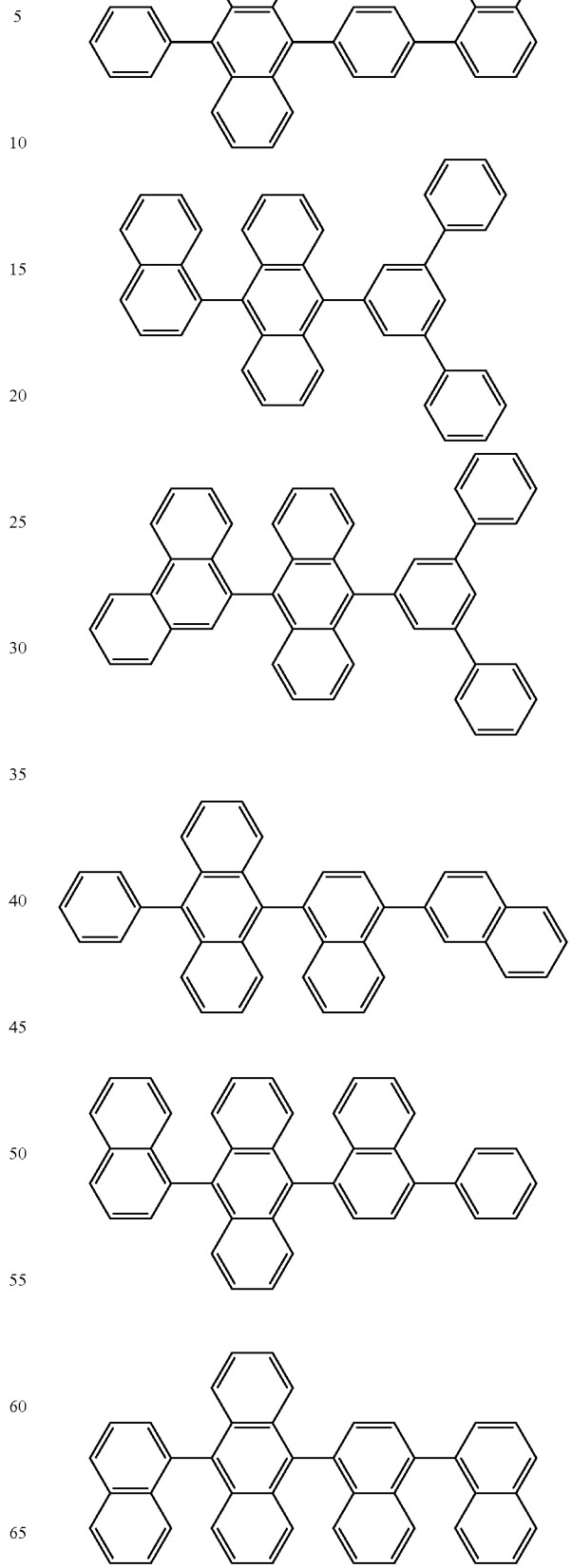

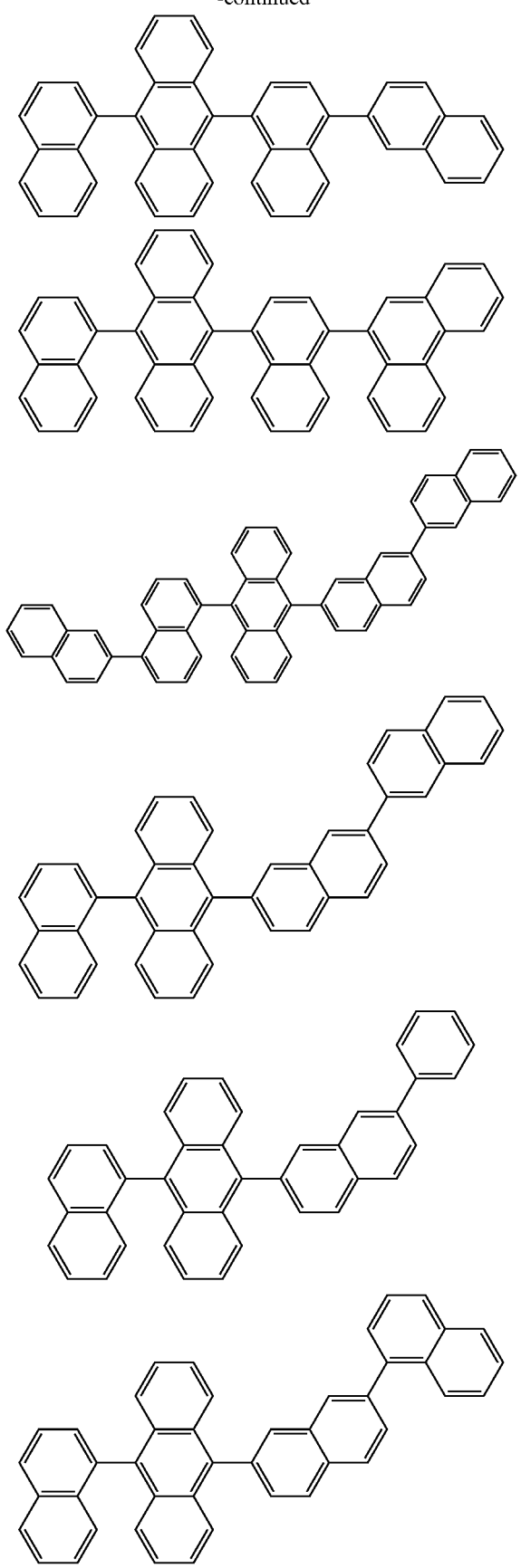
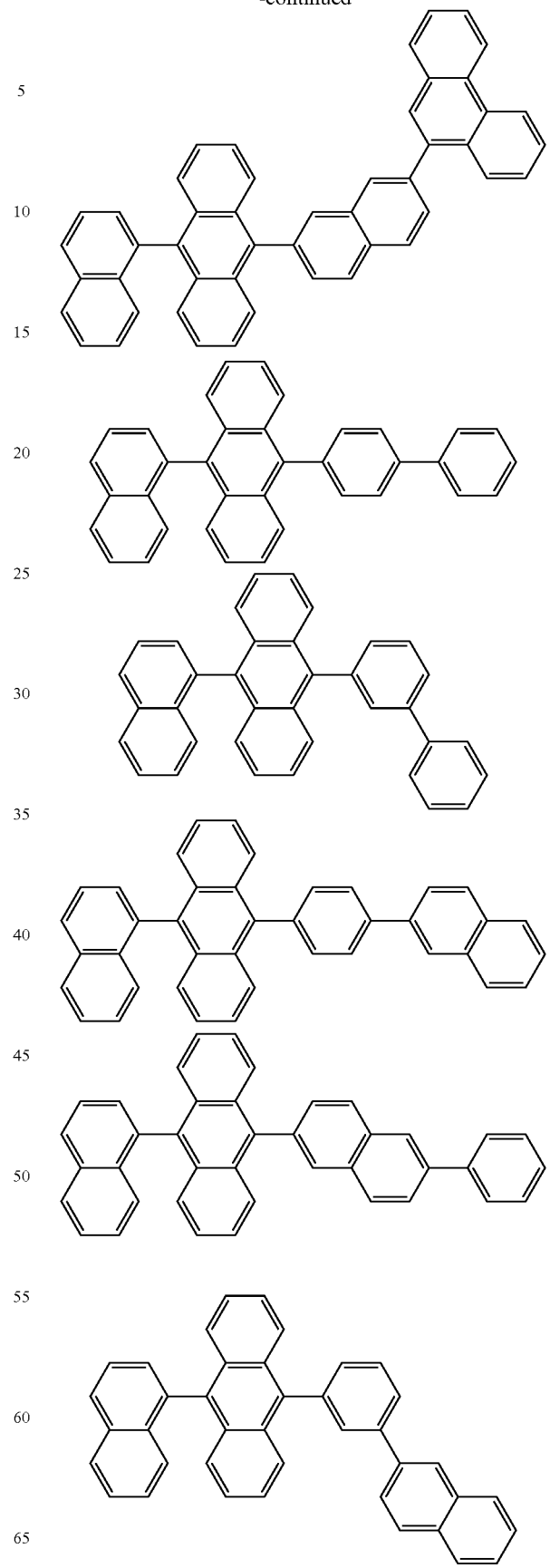

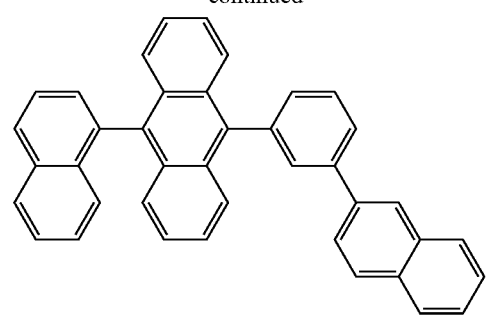
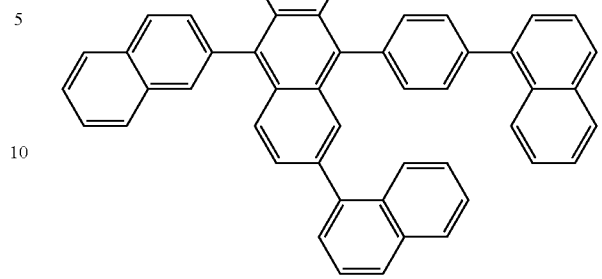
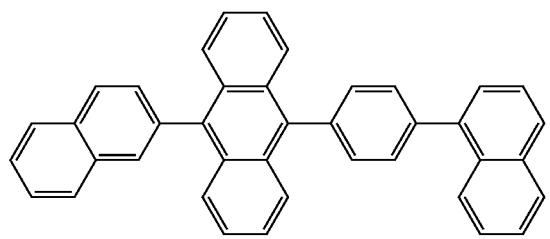
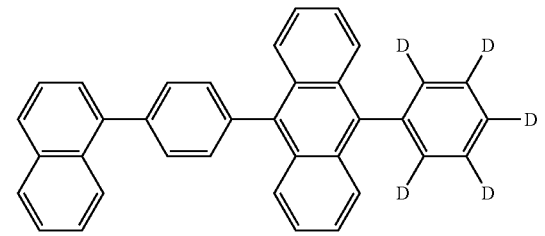
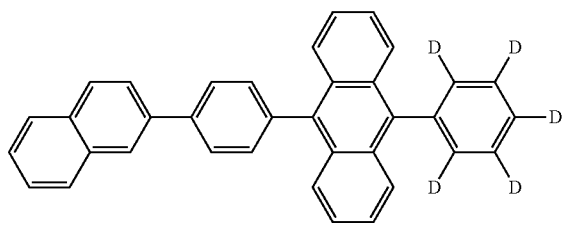
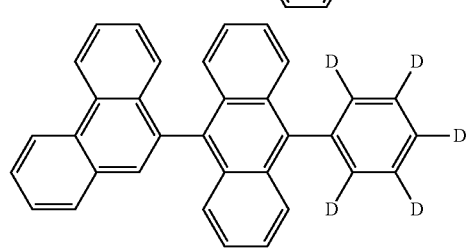
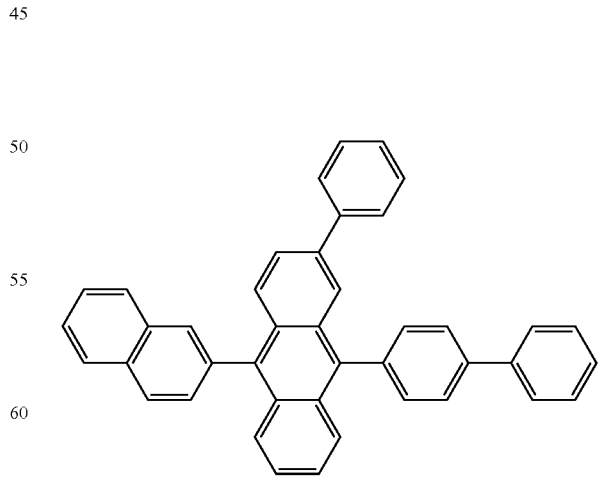
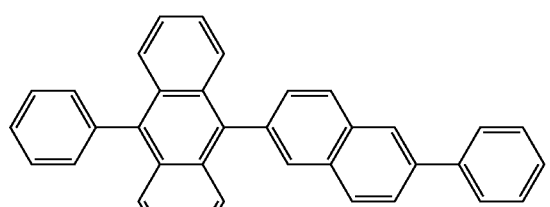
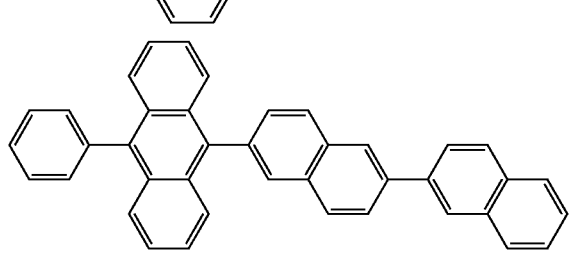

-continued

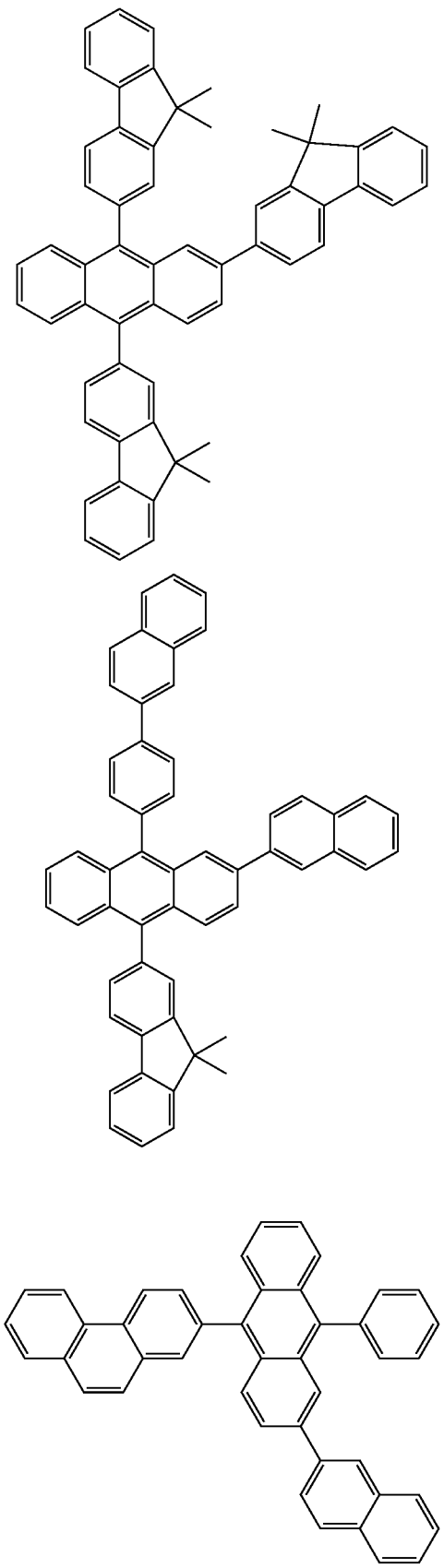

Also, the host may be an anthracene-based compound represented by Formula 401 below:

<Formula 401>

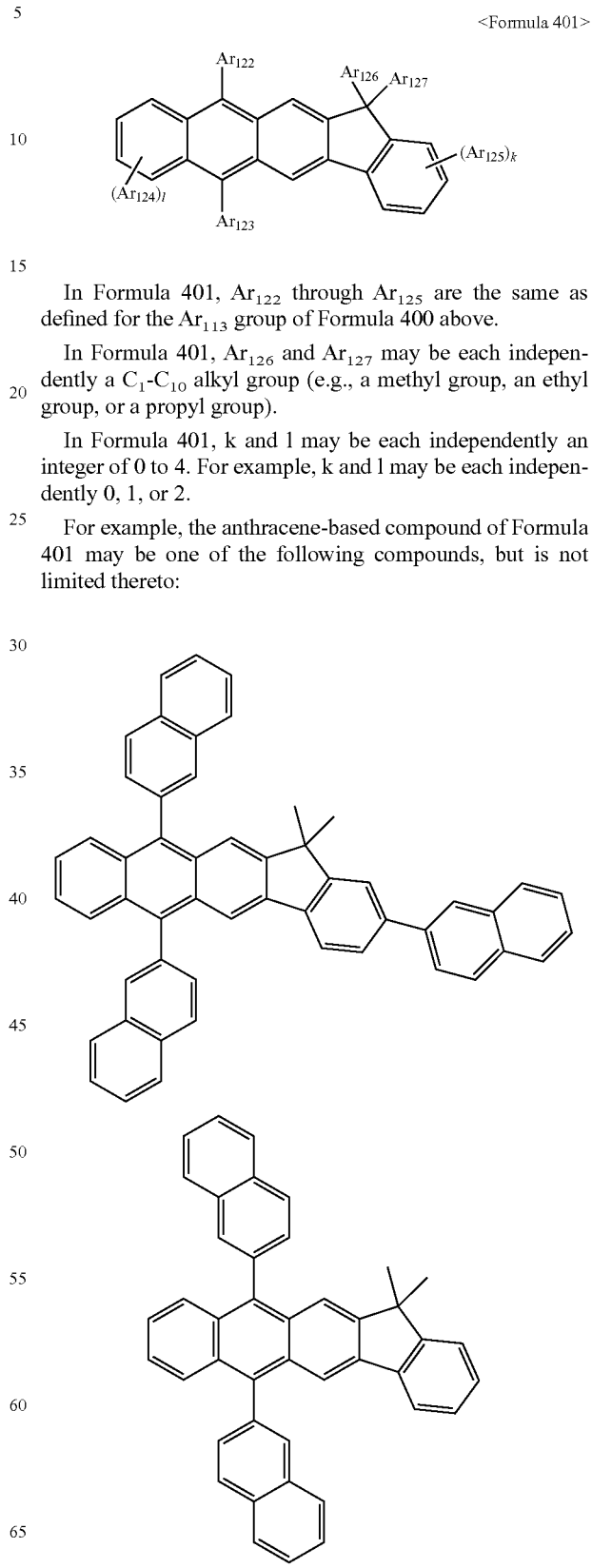

In Formula 401, $Ar_{122}$ through $Ar_{125}$ are the same as defined for the $Ar_{113}$ group of Formula 400 above.

In Formula 401, $Ar_{126}$ and $Ar_{127}$ may be each independently a $C_1$-$C_{10}$ alkyl group (e.g., a methyl group, an ethyl group, or a propyl group).

In Formula 401, k and l may be each independently an integer of 0 to 4. For example, k and l may be each independently 0, 1, or 2.

For example, the anthracene-based compound of Formula 401 may be one of the following compounds, but is not limited thereto:

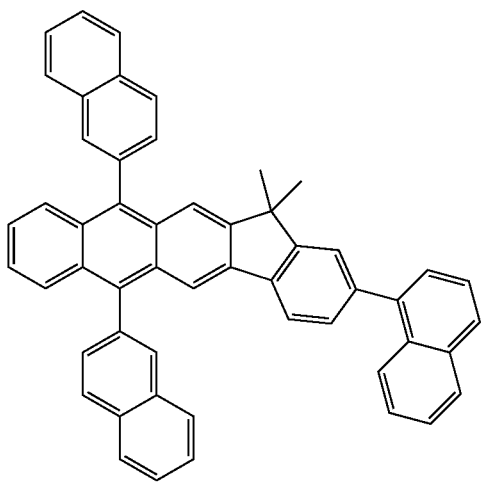
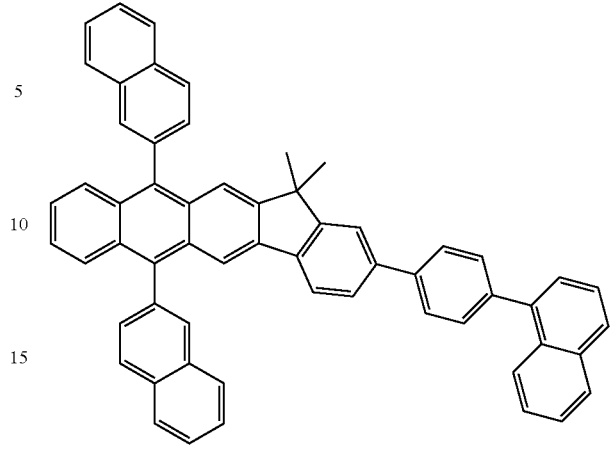
The EML may include a blue dopant, a green dopant, or a red dopant.
Examples of the blue dopant may be, but are not limited to, the following compounds.
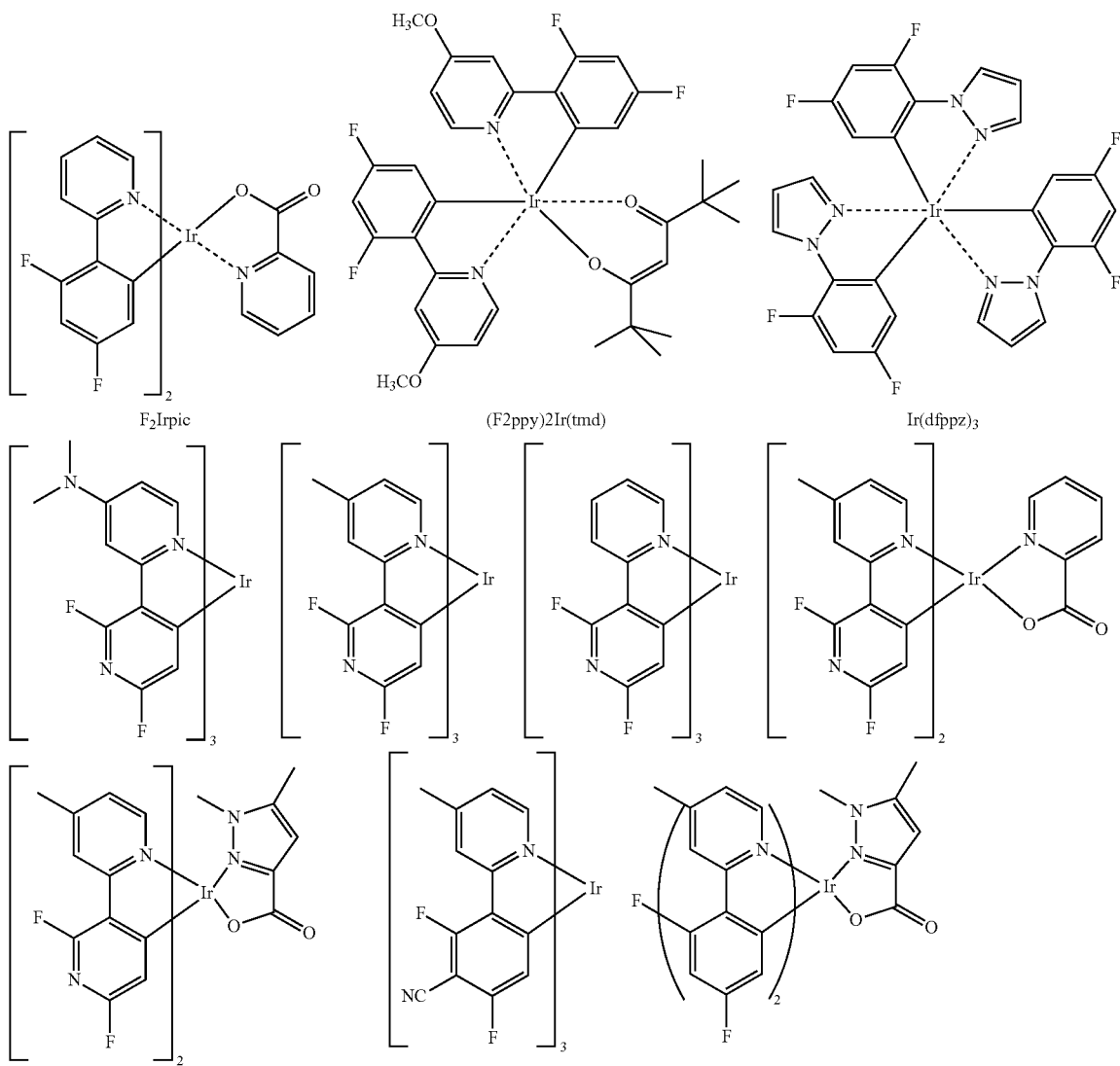

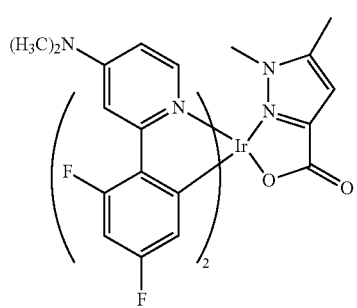
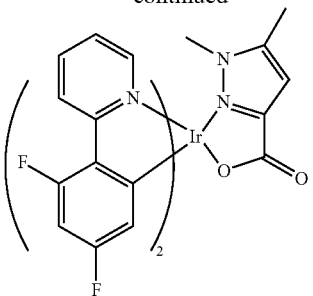
-continued
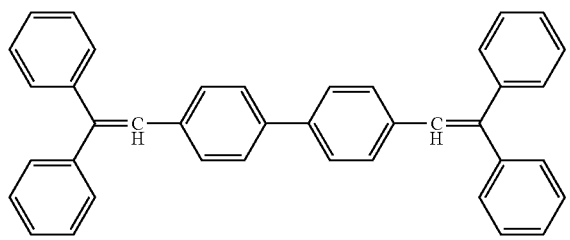
DPVBi
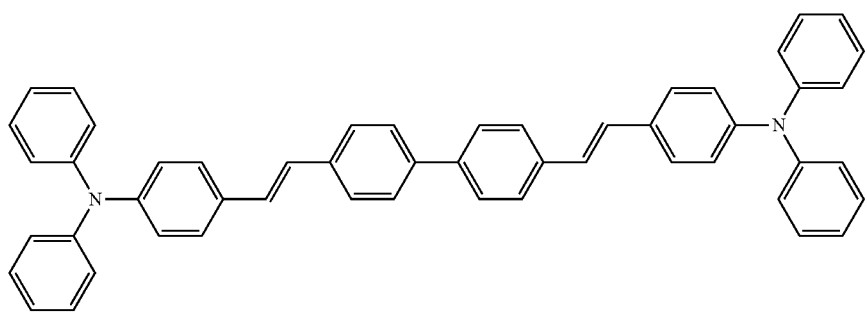
DPAVBi
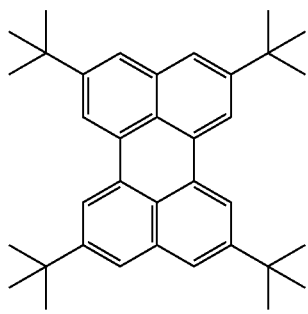
TBPe Examples of the red dopant include, but are not limited to, the following compounds. Also, the red dopant may be DCM or DCJTB, which will be described below.
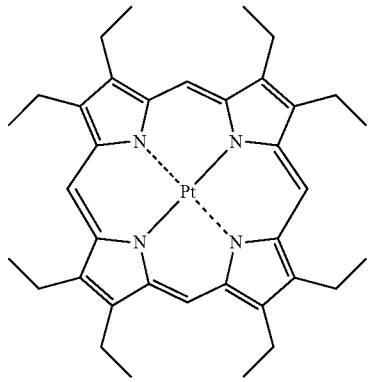
PtOEP
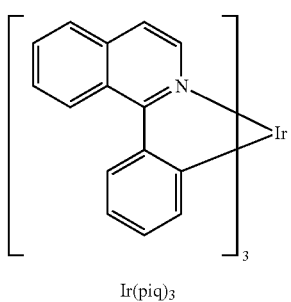
Ir(piq)₃
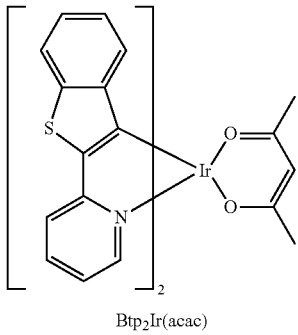
Btp₂Ir(acac)
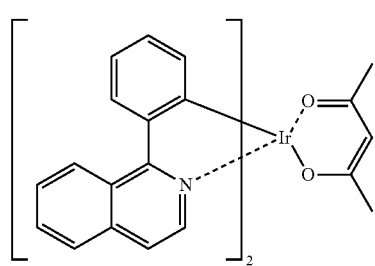
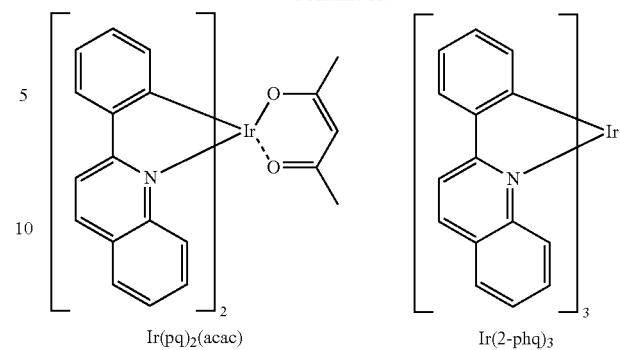
Ir(pq)₂(acac)  Ir(2-phq)₃
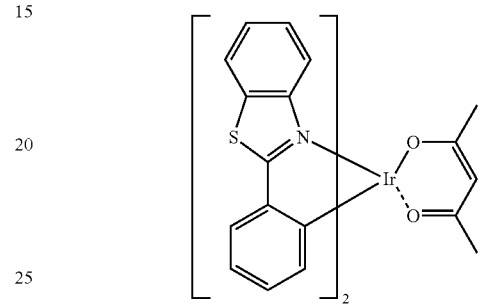
Ir(BT)₂(acac)
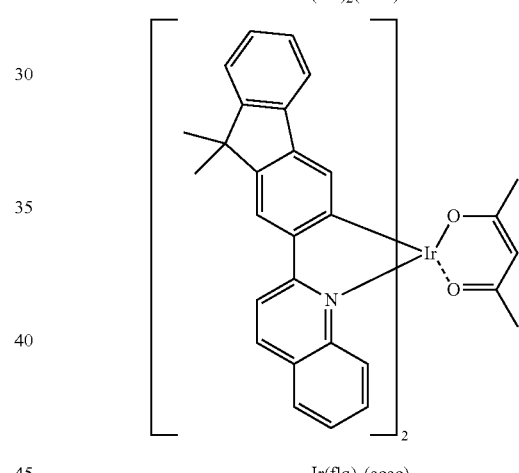
Ir(flq)₂(acac)
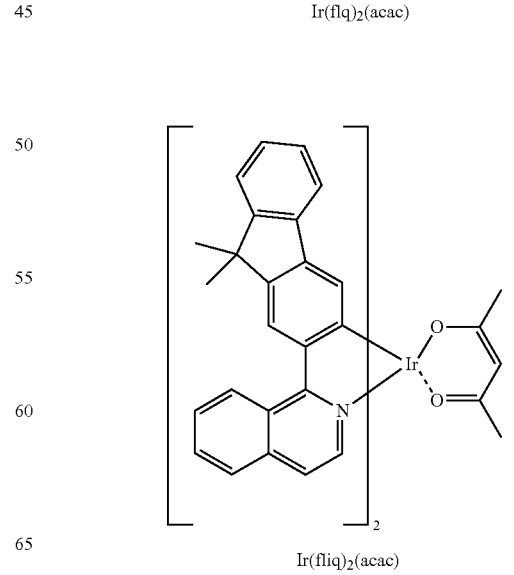
Ir(fliq)₂(acac)

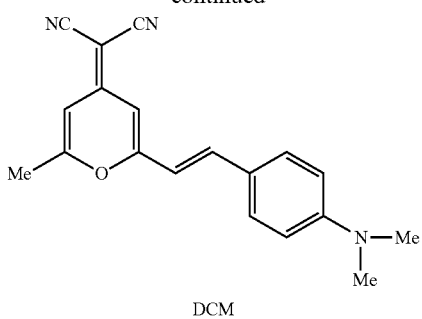
DCM
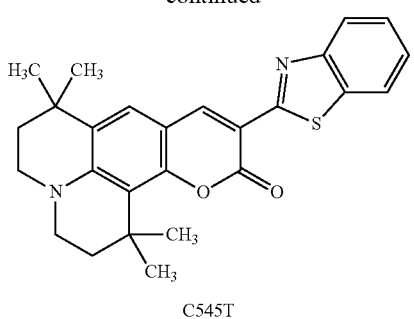
C545T
The dopant included in the EML may be Pt-complexes below, but is not limited thereto:
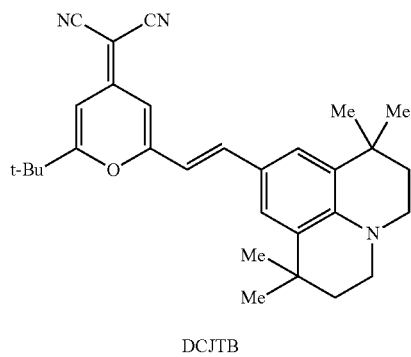
DCJTB
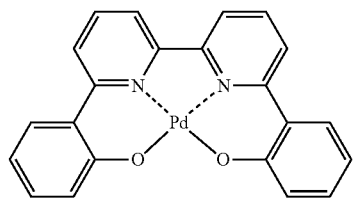
D1
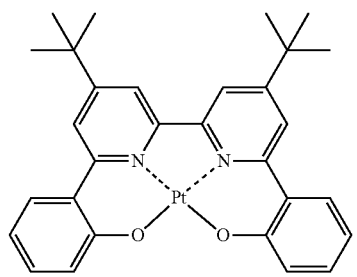
D2
Examples of the green dopant include, but are not limited to, the following compounds. Also, the green dopant may be C545T below.
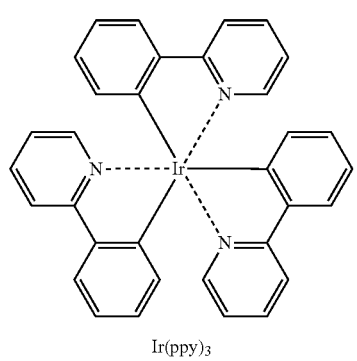
Ir(ppy)₃
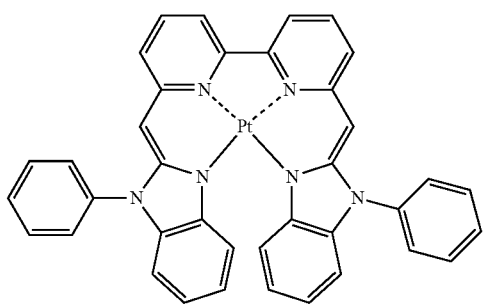
D3
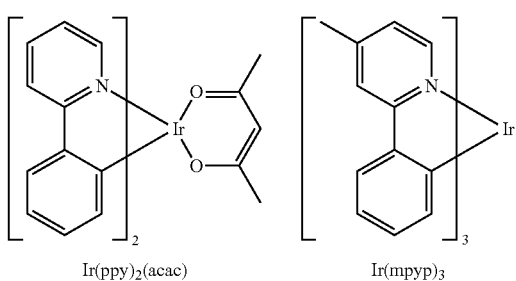
Ir(ppy)₂(acac)    Ir(mpyp)₃
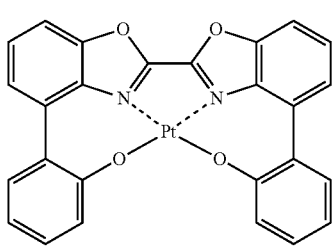
D4

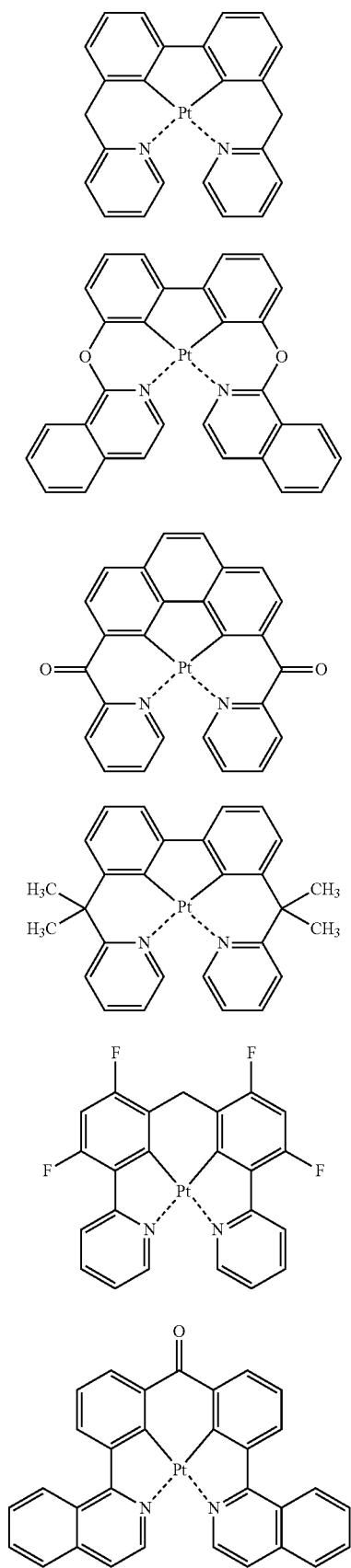
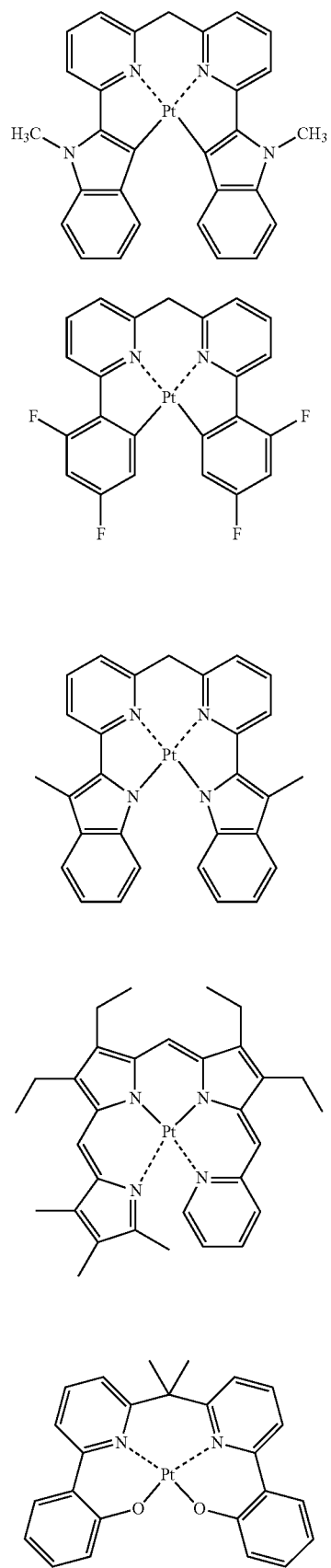

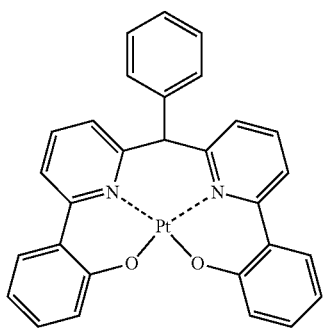
D16
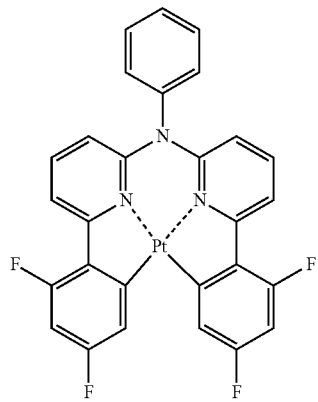
D21
D17
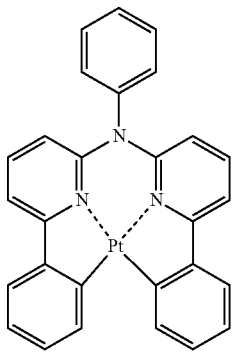
D22
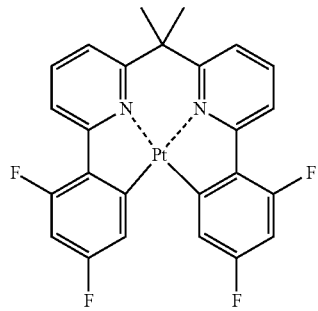
D18
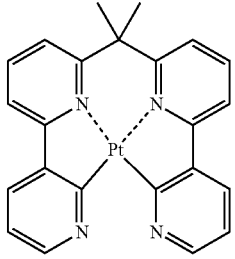
D23
D19
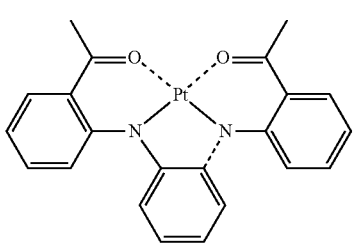
D24
D20
D25

-continued
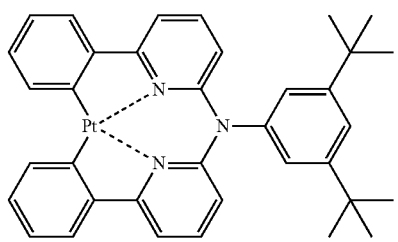
D26
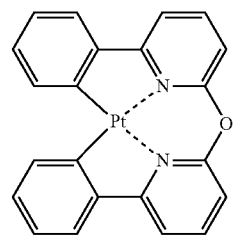
D27
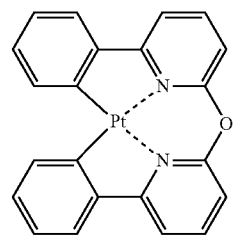
D28
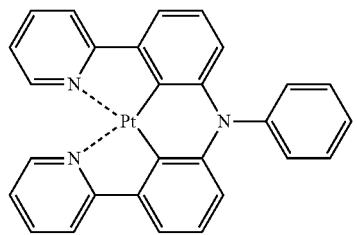
D29
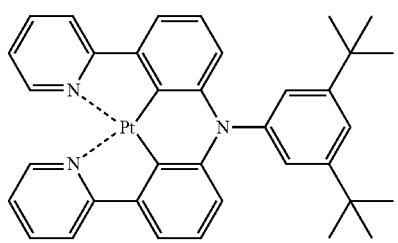
D30
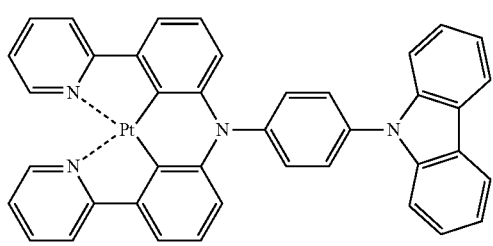
D31
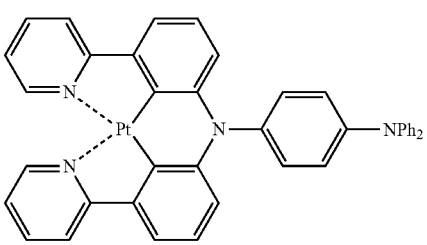
D32
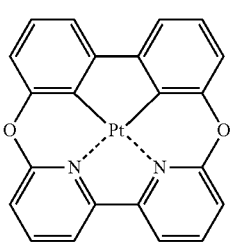
D33
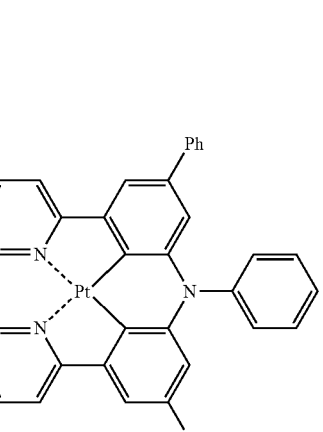
D34
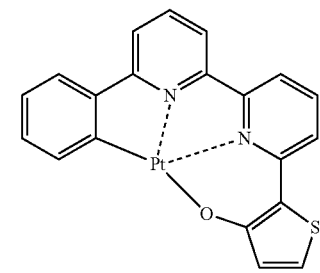
D35
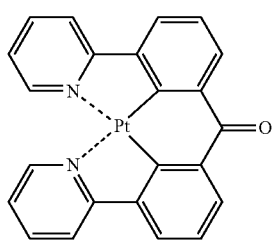
D36

-continued
D37
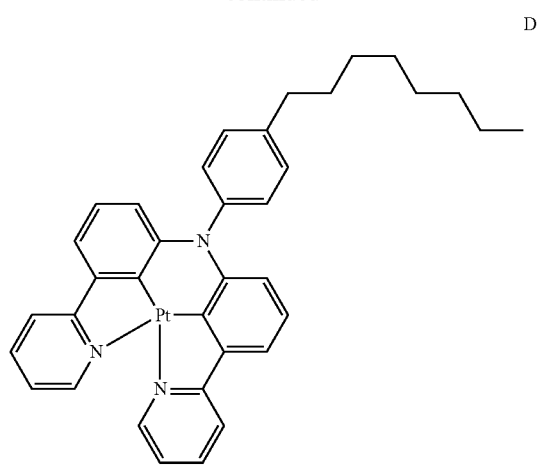
D38
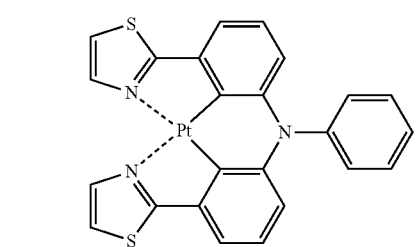
D39
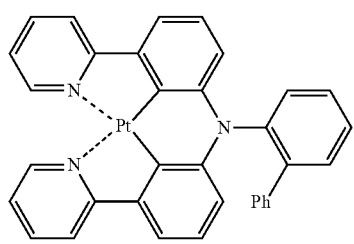
D40
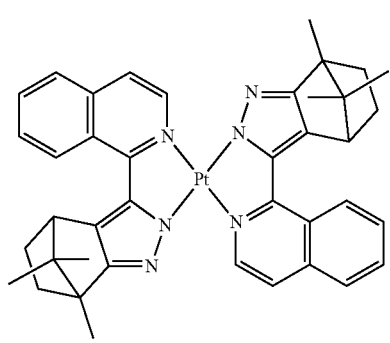
D41
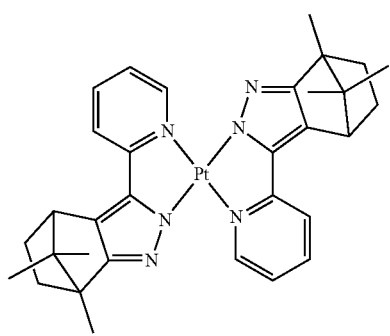
-continued
D42
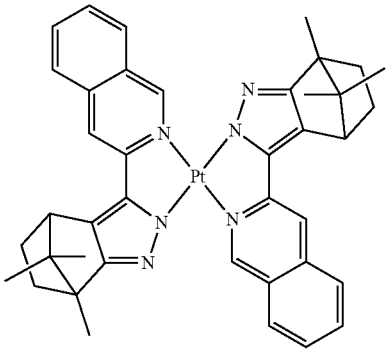
D43
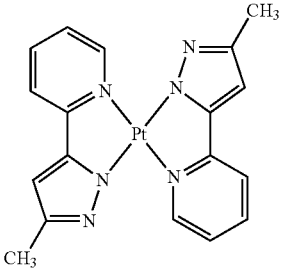
D44
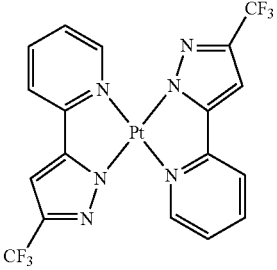
D45
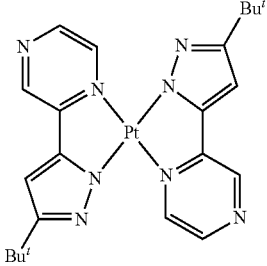
D46
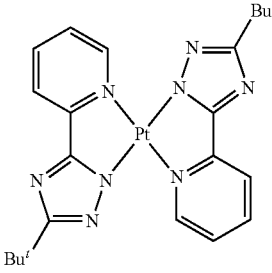

D47
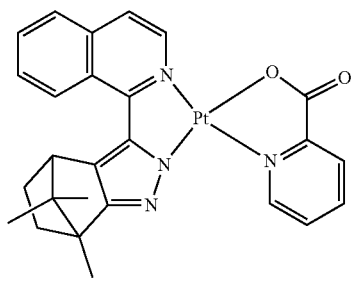

D48
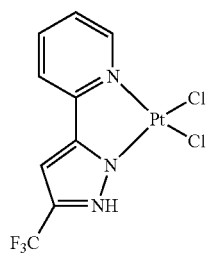

D49
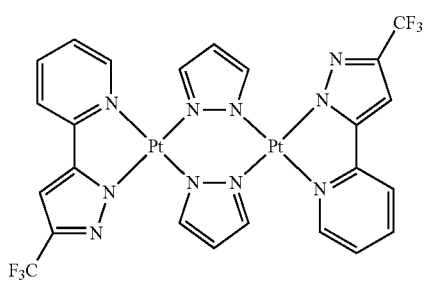

D50
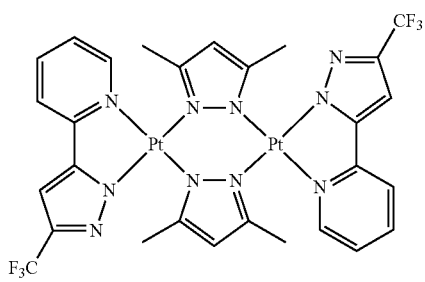

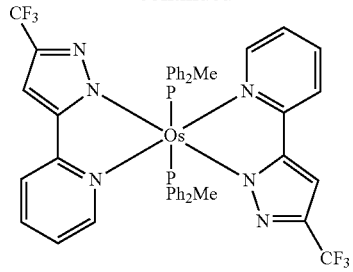
Os(fppz)₂(PPh₂Me)₂

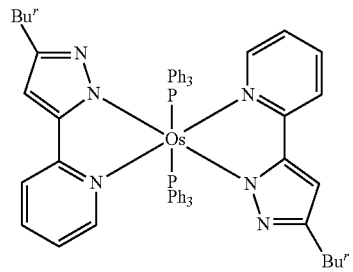
Os(bppz)₂(PPh₃)₂

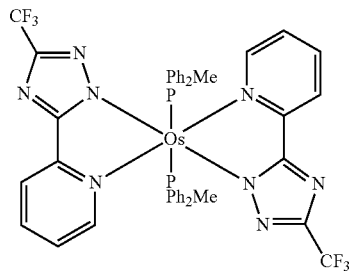
Os(fptz)₂(PPh₂Me)₂

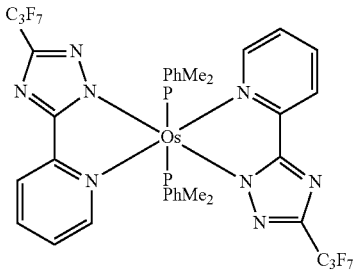
Os(hptz)₂(PPhMe₂)₂

Also, the dopant included in the EML may be Os-complexes below, but is not limited thereto:

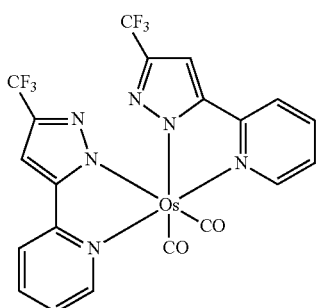
Os(fppz)₂(CO)₂

When the EML 15 includes a host and a dopant, the amount of the dopant in the EML 15 may be generally in the range of about 0.01 to about 15 parts by weight based on about 100 parts by weight of the host, but is not limited thereto.

The thickness of the EML 15 may be in the range of about 100 Å to about 1,000 Å. In some embodiments, the thickness of the EML 15 may be in the range of about 200 Å to about 600 Å. When the thickness of the EML 15 is within these ranges, excellent luminescent properties may be obtained without a substantial increase in driving voltage.

Next, the buffer layer 16 is formed on the EML 15 by using various suitable methods such as vacuum deposition, spin coating, or casting. When the buffer layer 16 is formed by vacuum deposition or spin coating, the deposition and coating conditions may vary according to used compounds. However, in general, the deposition and coating conditions may be almost the same as the conditions for forming the HIL 13.

The buffer layer 16 includes an amine-based compound represented by Formula 1 below:

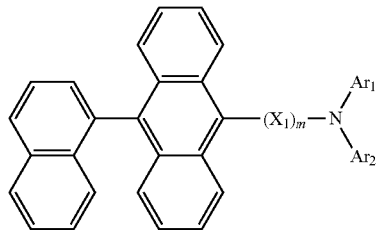

<Formula 1>

In Formula 1, $Ar_1$ and $Ar_2$ are each independently a substituted or unsubstituted $C_6$-$C_{60}$ aryl group or a substituted or unsubstituted $C_2$-$C_{60}$ heteroaryl group; $X_1$ is a substituted or unsubstituted $C_6$-$C_{60}$ arylene group or a substituted or unsubstituted $C_2$-$C_{60}$ heteroarylene group; m is an integer of 1 to 5; at least one substituent of the substituted $C_6$-$C_{60}$ aryl group, the substituted $C_2$-$C_{60}$ heteroaryl group, the substituted $C_6$-$C_{60}$ arylene group, and the substituted $C_2$-$C_{60}$ heteroarylene group is one of deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, $C_6$-$C_{60}$ aryl group, and a $C_2$-$C_{60}$ heteroaryl group.

In Formula 1, $Ar_1$ and $Ar_2$ may be each independently a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted benzoimidazolyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinylene group, a substituted or unsubstituted phenanthridinyl group, a substituted or unsubstituted pyranyl group, a substituted or unsubstituted chromenyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, a substituted or unsubstituted isoxazolyl group, a substituted or unsubstituted dibenzothiophenyl group, a substituted or unsubstituted dibenzofuranyl group, a substituted or unsubstituted triazinyl group, a substituted or unsubstituted oxadiazolyl group, a substituted or unsubstituted pyridazinyl group, a substituted or unsubstituted triazolyl group, a substituted or unsubstituted tetrazolyl group, or a substituted or unsubstituted isoquinolinyl group.

For example, $Ar_1$ and $Ar_2$ may be each independently a substituted or unsubstituted phenyl group, a substituted or unsubstituted naphthyl group, a substituted or unsubstituted fluorenyl group, a substituted or unsubstituted phenanthrenyl group, a substituted or unsubstituted anthryl group, a substituted or unsubstituted pyrenyl group, a substituted or unsubstituted chrysenyl group, a substituted or unsubstituted pyridinyl group, a substituted or unsubstituted pyrimidinyl group, a substituted or unsubstituted pyrazinyl group, a substituted or unsubstituted quinolinyl group, a substituted or unsubstituted quinazolinyl group, a substituted or unsubstituted carbazolyl group, or a substituted or unsubstituted isoquinolinyl group, but are not limited thereto.

At least one of $Ar_1$ and $Ar_2$ in Formula 1 may be a substituted $C_6$-$C_{60}$ aryl group, and at least one substituent of the substituted $C_6$-$C_{60}$ aryl group may be one of —F; —CN; —NO$_2$; a $C_1$-$C_{60}$ alkyl group substituted with at least one —F; and a $C_2$-$C_{60}$ heteroaryl group.

For example, at least one of $Ar_1$ and $Ar_2$ in Formula 1 may be a substituted phenyl group, a substituted naphthyl group, a substituted fluorenyl group, a substituted phenanthrenyl group, a substituted anthryl group, a substituted pyrenyl group, or a substituted chrysenyl group; at least one substituent of the substituted phenyl group, the substituted naphthyl group, the substituted fluorenyl group, the substituted phenanthrenyl group, the substituted anthryl group, the substituted pyrenyl group, and the substituted chrysenyl group may be one of —F; —CN; —NO$_2$; a $C_1$-$C_{10}$ alkyl group substituted with at least one —F; and a $C_5$-$C_9$ heteroaryl group containing at least one N as a ring-constituting atom.

In particular, at least one of $Ar_1$ and $Ar_2$ in Formula 1 may be a substituted phenyl group or a substituted naphthyl group; at least one substituent of the substituted phenyl group and the substituted naphthyl group may be one of —F; —CN; a nitro group; a pyridinyl group; a pyrazinyl group; a pyrimidinyl group; a quinolinyl group; an isoquinolinyl group; a carbazolyl group; and a quinolazinyl group.

In Formula 1, both $Ar_1$ and $Ar_2$ may be the substituted or unsubstituted $C_6$-$C_{60}$ aryl group; $Ar_1$ may be the substituted or unsubstituted $C_2$-$C_{60}$ aryl group and $Ar_2$ may be the substituted or unsubstituted $C_6$-$C_{60}$ heteroaryl group; or both $Ar_1$ and $Ar_2$ may be each independently the $C_2$-$C_{60}$ heteroaryl group.

According to one embodiment, in Formula 1, $Ar_1$ and $Ar_2$ may be each independently one of Formulae 2A through 2Z below:

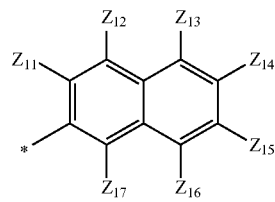
Formula 2A

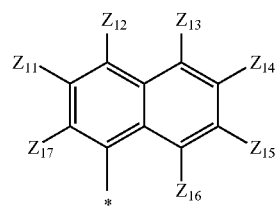
Formula 2B

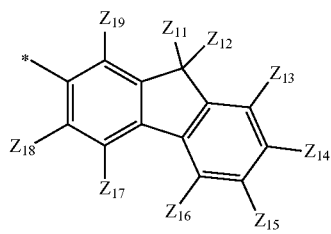
Formula 2C

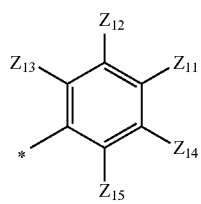
Formula 2D

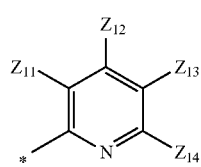
Formula 2E

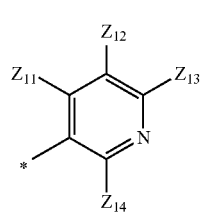
Formula 2F

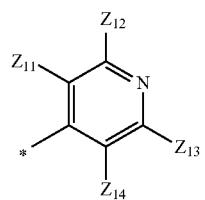
Formula 2G

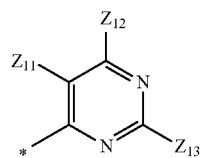
Formula 2H

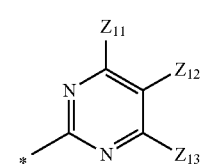
Formula 2I

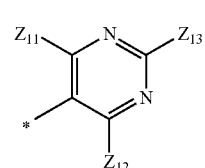
Formula 2J

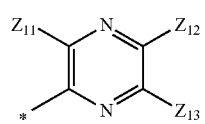
Formula 2K

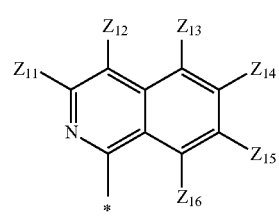
Formula 2L

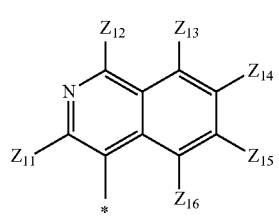
Formula 2M

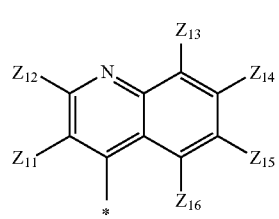
Formula 2N

In Formulae 2A to 2Z, $Z_{11}$ through $Z_{19}$ may be each independently one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

$Z_{11}$ through $Z_{19}$ may be each independently one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{10}$ alkyl group; a $C_1$-$C_{10}$ alkoxy group; a $C_1$-$C_{10}$ alkyl group and a $C_1$-$C_{10}$ alkoxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a phenyl group; a naphthyl group; an anthryl group; a fluorenyl group; a pyrenyl group; a chrysenyl group; a pyridinyl group; a pyrazinyl group; a pyrimidinyl group; a triazinyl group; a quinolinyl group; an isoquinolinyl group; a quinazolinyl group; a carbazolyl group; and a phenyl group, a naphthyl group, an anthryl group, a fluorenyl group, a pyrenyl group, a chrysenyl group, a pyridinyl group, a pyrazinyl group, a pyrimidinyl group, a triazinyl group, a quinolinyl group, an isoquinolinyl group, a quinazolinyl group, and a carbazolyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{10}$ alkyl group, and a $C_1$-$C_{10}$ alkoxy group, but are not limited thereto.

In Formulae 2A through 2Z, * denotes a binding site with N of Formula 1.

In one embodiment, in Formula 1, $Ar_1$ may be represented by one of Formulae 2A through 2D above, and $Ar_2$ may be represented by one of Formulae 2E through 2Z above.

In another embodiment, in Formula 1, $Ar_1$ may be represented by one of Formulae 2A through 2D above wherein at least one of the $Z_{11}$ to $Z_{17}$ groups of Formula 2A, at least one of the $Z_{11}$ to $Z_{17}$ groups of Formula 2B, at least one of the $Z_{11}$ to $Z_{19}$ groups of Formula 2C, and at least one of the $Z_{11}$ to $Z_{15}$ groups of Formula 2D may be one of —F; —CN; —NO$_2$; a $C_1$-$C_{10}$ alkyl group substituted with at least one —F; and a $C_5$-$C_9$ heteroaryl group containing at least one N as a ring-constituting atom (e.g., a pyridinyl group, a pyrazinyl group, a pyrimidinyl group, a quinolinyl group, an isoquinolinyl group, a carbazolyl group, a quinolazinyl group, and the like); and $Ar_2$ may be represented by one of Formulae 2A through 2Z (e.g., Formulae 2E through 2Z) above.

For example, in Formula 1, $Ar_1$ and $Ar_2$ may be each independently one of Formulae 3(1) through 3(30) below, but are not limited thereto:

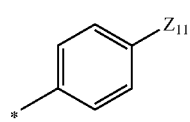

Formula 3(1)

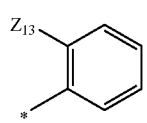

Formula 3(2)

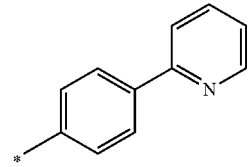

Formula 3(3)

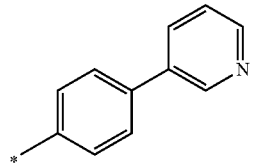

Formula 3(4)

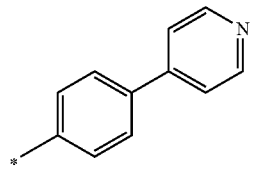

Formula 3(5)

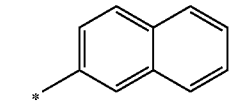

Formula 3(6)

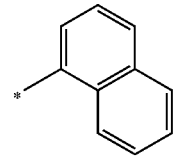

Formula 3(7)

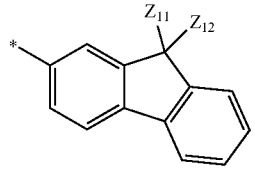

Formula 3(8)

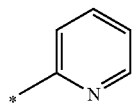

Formula 3(9)

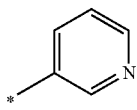

Formula 3(10)

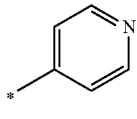

Formula 3(11)

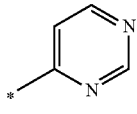

Formula 3(12)

Formula 3(13)
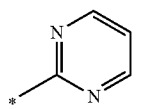

Formula 3(14)
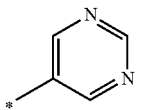

Formula 3(15)
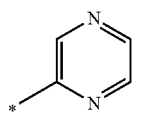

Formula 3(16)
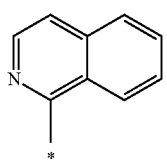

Formula 3(17)
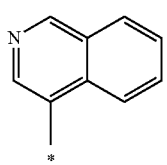

Formula 3(18)
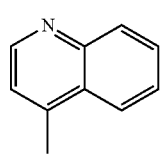

Formula 3(19)
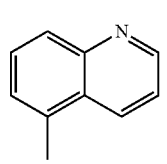

Formula 3(20)
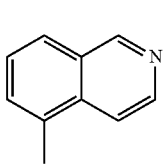

Formula 3(21)
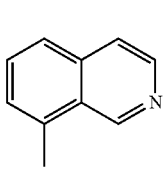

Formula 3(22)
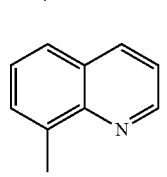

Formula 3(23)
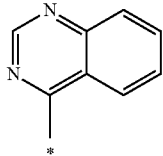

Formula 3(24)
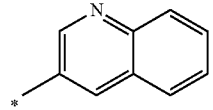

Formula 3(25)
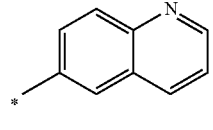

Formula 3(26)
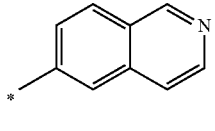

Formula 3(27)
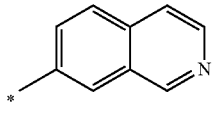

Formula 3(28)
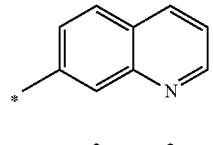

Formula 3(29)
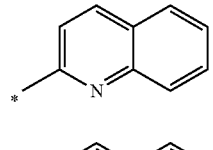

Formula 3(30)

In Formulae 3(1), 3(2), and 3(8), $Z_{11}$ through $Z_{13}$ may be each independently hydrogen, —F, —CN, or —NO$_2$; and * denotes a binding site with N of Formula 1.

According to one embodiment, in Formula 1, Ar$_1$ may be represented by one of Formulae 3(1) through 3(8) above, and Ar$_2$ may be represented by one of Formulae 3(9) through 3(30) above.

In another embodiment, in Formula 1, Ar$_1$ may be represented by one of Formulae 3(1) through 3(8), wherein the $Z_{11}$ through $Z_{13}$ groups of Formulae 3(1), 3(2), and 3(8) may be each independently —F, —CN, or —NO$_2$; and Ar$_2$ may be represented by one of Formulae 3(1) through 3(30).

In Formula 1, X$_1$ may be a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted dibenzothiophenylene group, a substituted or unsubstituted dibenzofuranylene group, a substituted or unsubstituted triazinylene group, a substituted or unsubstituted oxadiazolylene group, a substituted or unsubstituted pyridazinylene group, a substituted or unsubstituted triazolylene group, or a substituted or unsubstituted tetrazolylene group. When the $X_1$ group of Formula 1 has at least one substituent, the substituent is the same as defined above.

According to one embodiment, in Formula 1, $X_1$ may be a substituted or unsubstituted phenylene group, a substituted or unsubstituted naphthylene group, a substituted or unsubstituted fluorenylene group, a substituted or unsubstituted phenanthrenylene group, a substituted or unsubstituted anthrylene group, a substituted or unsubstituted triphenylenylene group, a substituted or unsubstituted pyrenylene group, a substituted or unsubstituted chrysenylene group, a substituted or unsubstituted pyridinylene group, a substituted or unsubstituted pyrazinylene group, a substituted or unsubstituted pyrimidinylene group, a substituted or unsubstituted quinolinylene group, a substituted or unsubstituted quinazolinylene group, a substituted or unsubstituted carbazolylene group, a substituted or unsubstituted dibenzothiophenylene group, a substituted or unsubstituted dibenzofuranylene group, a substituted or unsubstituted triazinylene group, a substituted or unsubstituted pyridazinylene group, a substituted or unsubstituted triazolylene group, or a substituted or unsubstituted tetrazolylene group, but is not limited thereto.

In particular, in Formula 1, $X_1$ may be represented by any one of Formulae 5(1) to 5(14) below:

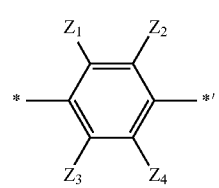

Formula 5(1)

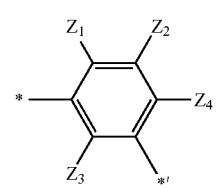

Formula 5(2)

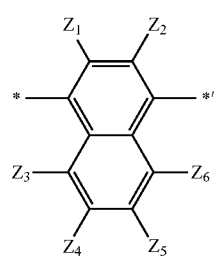

Formula 5(3)

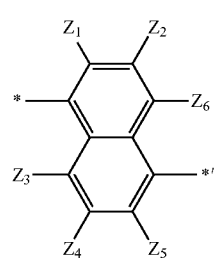

Formula 5(4)

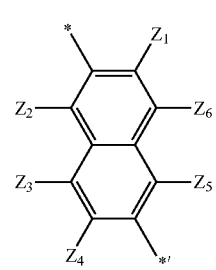

Formula 5(5)

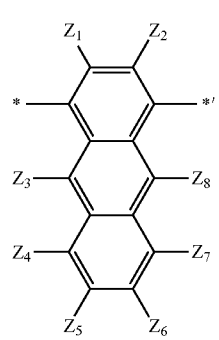

Formula 5(6)

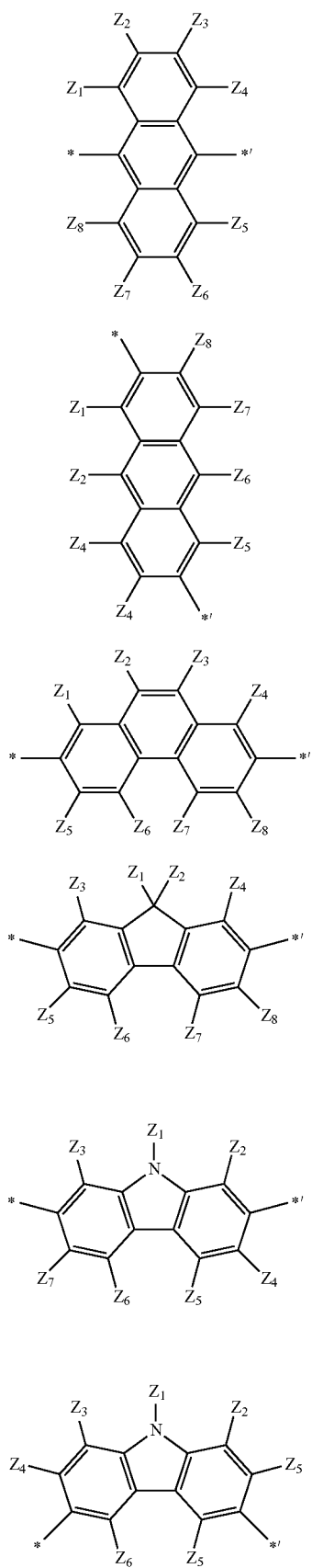

Formula 5(7)

Formula 5(8)

Formula 5(9)

Formula 5(10)

Formula 5(11)

Formula 5(12)

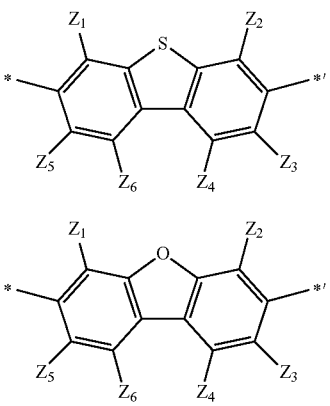

Formula 5(13)

Formula 5(14)

In Formulae 5(1) to 5(14), $Z_1$ through $Z_8$ may be each independently one of hydrogen; deuterium; —F; —Cl; —Br; —I; —CN; a hydroxyl group; a nitro group; an amino group; an amidino group; hydrazine; hydrazone; a carboxyl group or a salt thereof; a sulfonic acid group or a salt thereof; a phosphoric acid or a salt thereof; a $C_1$-$C_{20}$ alkyl group; a $C_1$-$C_{20}$ alkoxy group; a $C_1$-$C_{20}$ alkyl group and a $C_1$-$C_{20}$ alkoxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_6$-$C_{20}$ aryl group; a $C_2$-$C_{20}$ heteroaryl group; and a $C_6$-$C_{20}$ aryl group and a $C_2$-$C_{20}$ heteroaryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group.

For example, in Formulae 5(1) to 5(14), $Z_1$ through $Z_8$ may be each independently one of hydrogen; deuterium; —F; —Cl; —Br; —I; —CN; a hydroxyl group; a nitro group; an amino group; an amidino group; hydrazine; hydrazone; a carboxyl group or a salt thereof; a sulfonic acid group or a salt thereof; a phosphoric acid or a salt thereof; a methyl group; an ethyl group; a propyl group; a butyl group; a pentyl group; a methoxy group; an ethoxy group; a propoxy group; a butoxy group; a pentoxy group; a methyl group, an ethyl group, a propyl group, a butyl group, a pentyl group, a methoxy group, an ethoxy group, a propoxy group, a butoxy group, and a pentoxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a phenyl group; a naphthyl group; an anthryl group; a phenanthrenyl group; a pyrenyl group; a fluorenyl group; a pyridinyl group; a pyrimidinyl group; a triazinyl group; a quinolinyl group; a carbazolyl group; and a phenyl group, a naphthyl group, an anthryl group, a phenanthrenyl group, a pyrenyl group, a fluorenyl group, a pyridinyl group, a pyrimidinyl group, a triazinyl group, a quinolinyl group, and a carbazolyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group, but is not limited thereto.
In Formula 1, m may be an integer of 1 to 5, for example, 1 or 2, but is not limited thereto.
The amine-based compound of Formula 1 may be one of Compounds 1 through 98 below, but is not limited thereto:
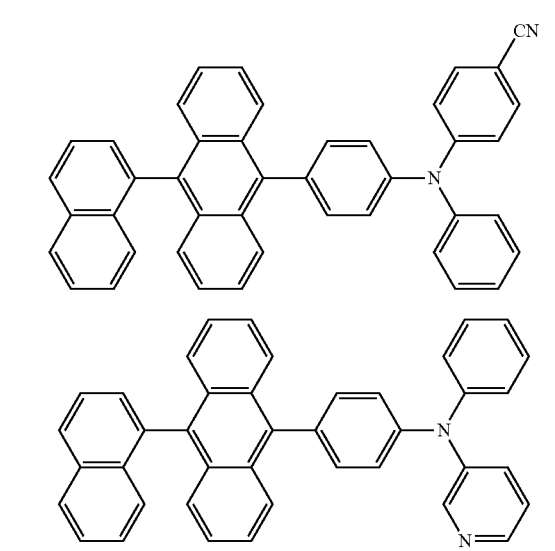
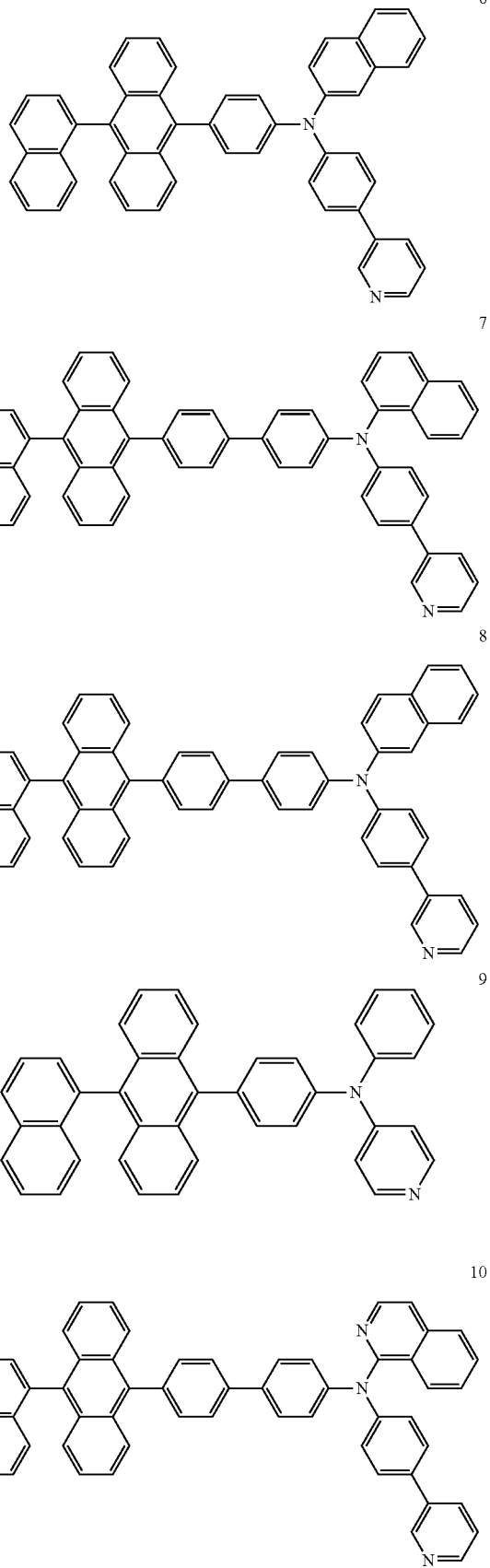

11
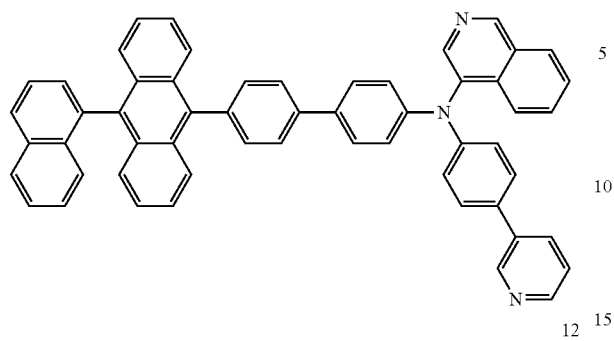
12
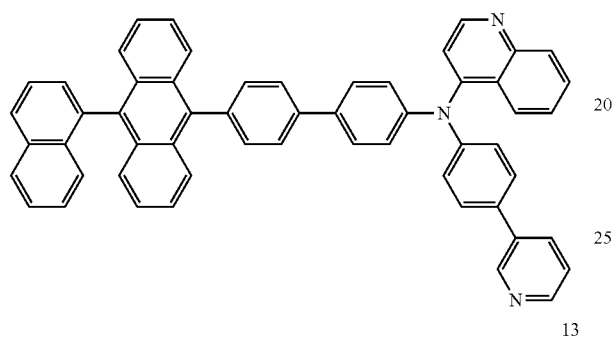
13
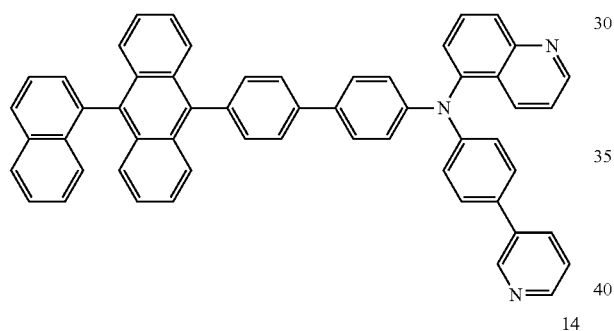
14
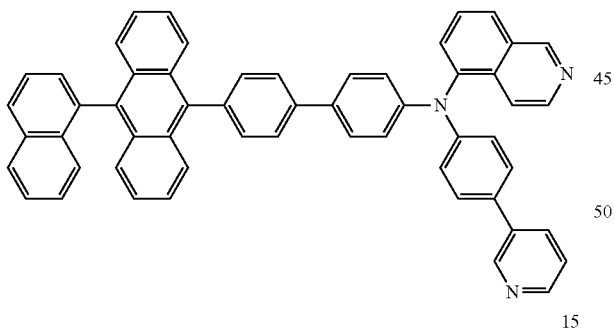
15
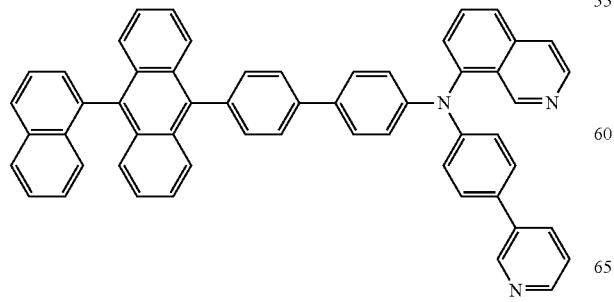
16
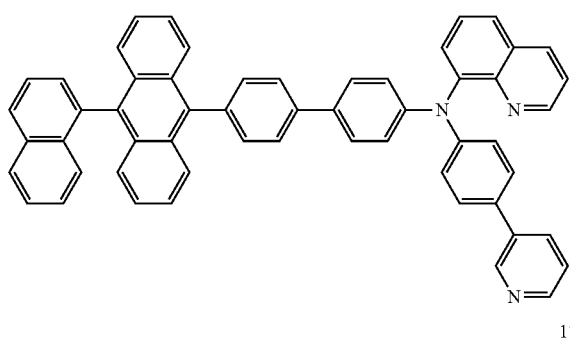
17
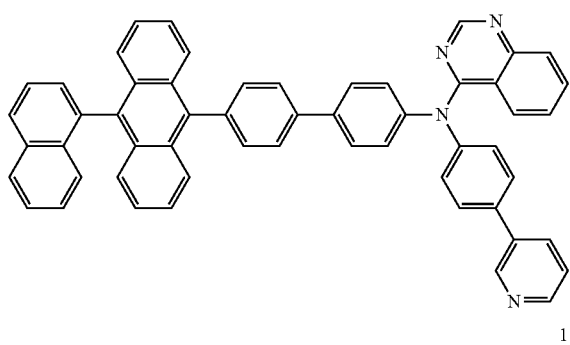
18
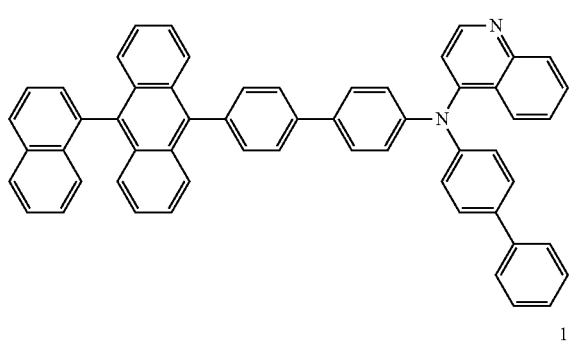
19
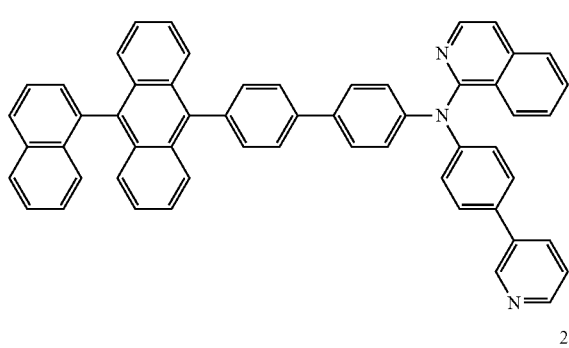
20
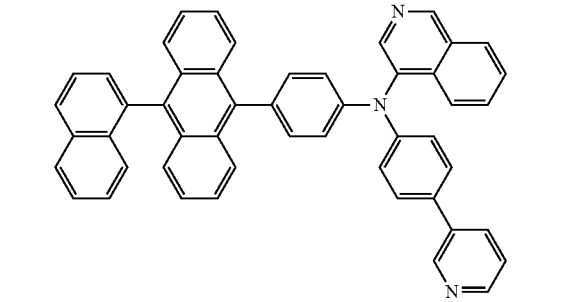

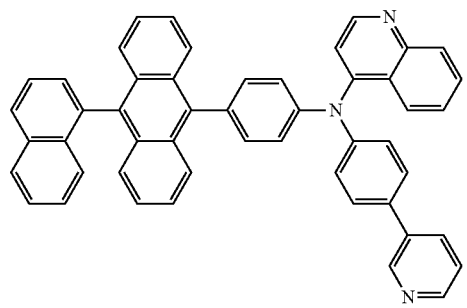
21
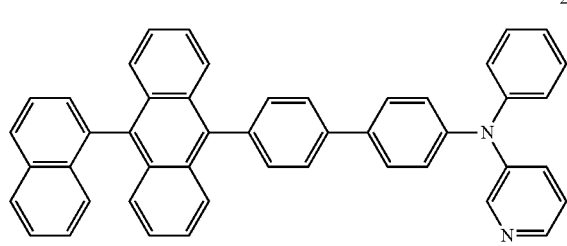
22
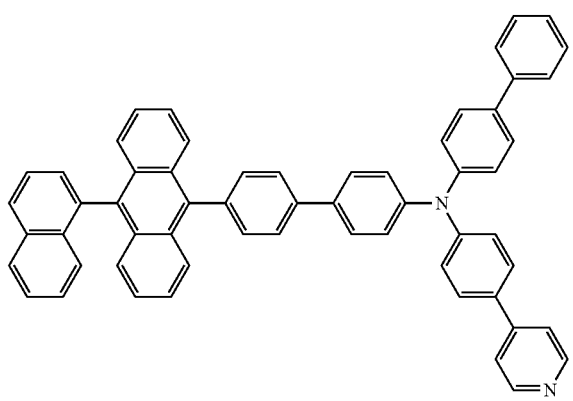
23
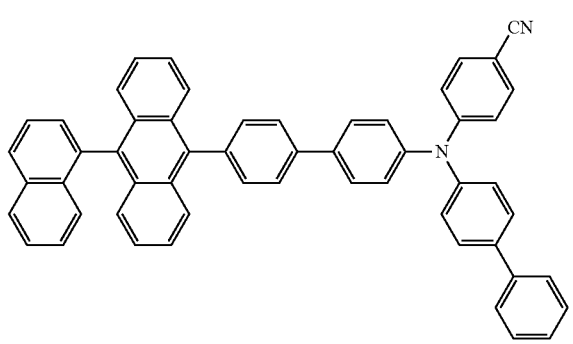
24
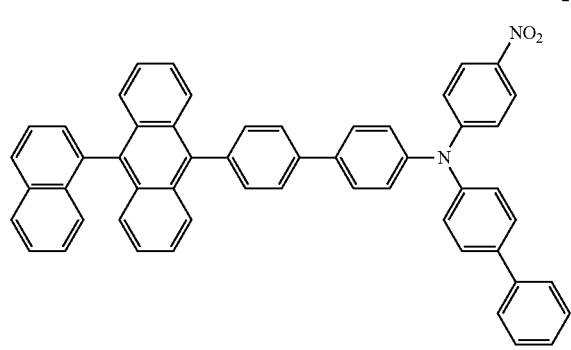
25
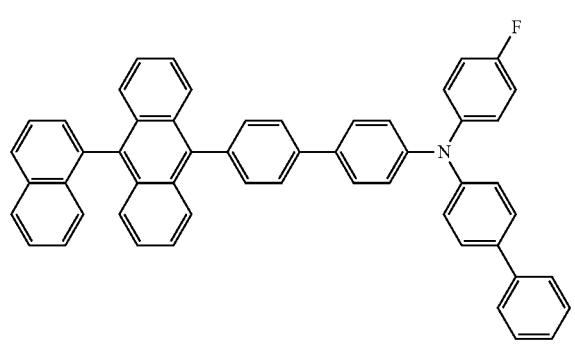
26
27
28

29
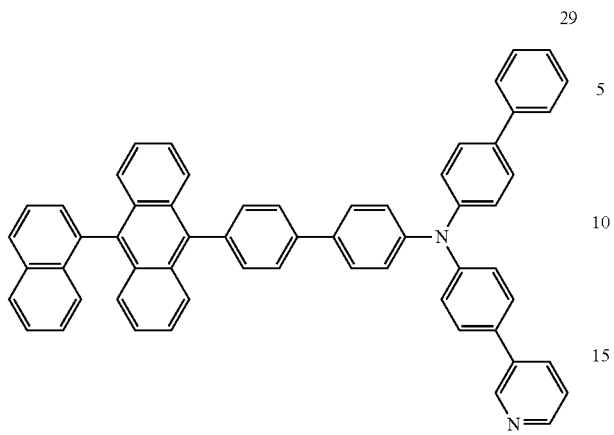
30
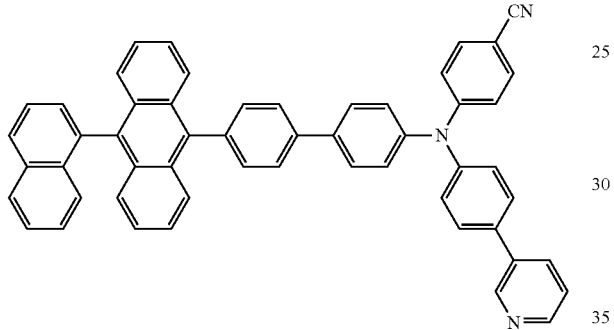
31
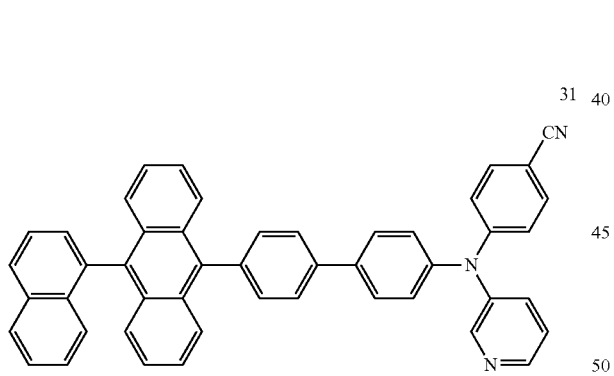
32
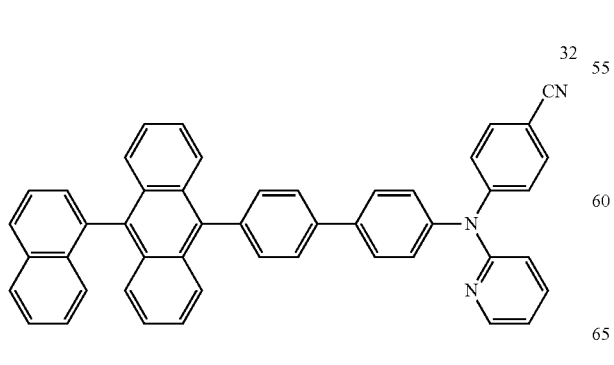
33
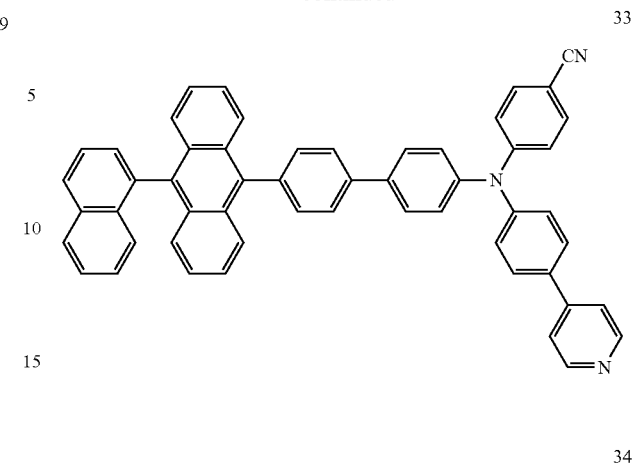
34
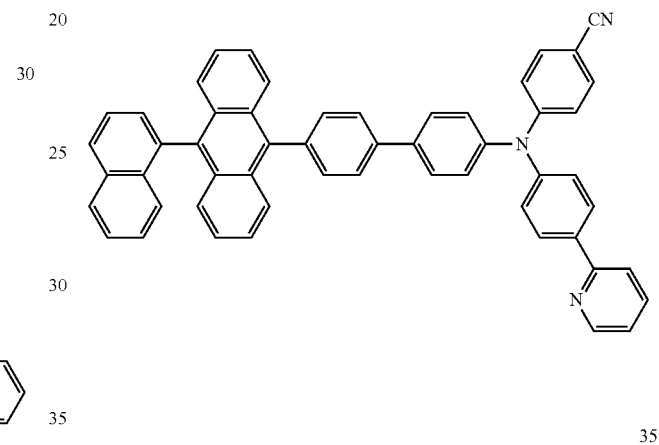
35
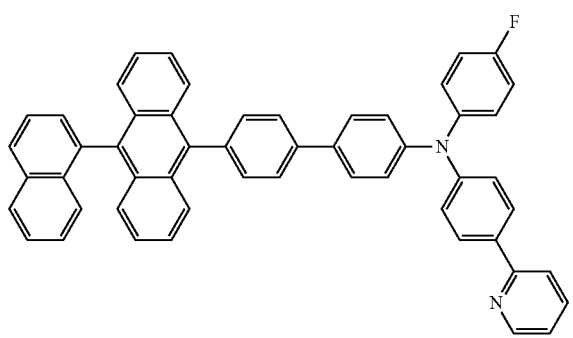
36
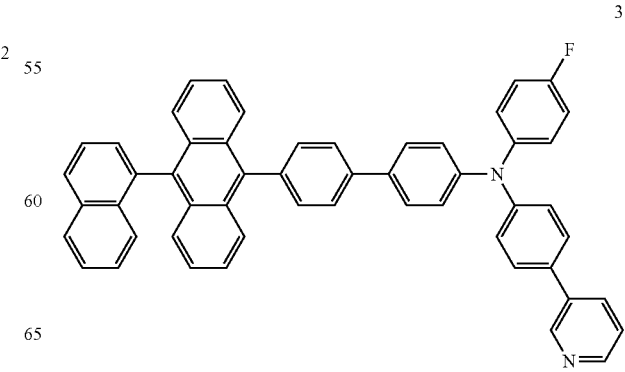

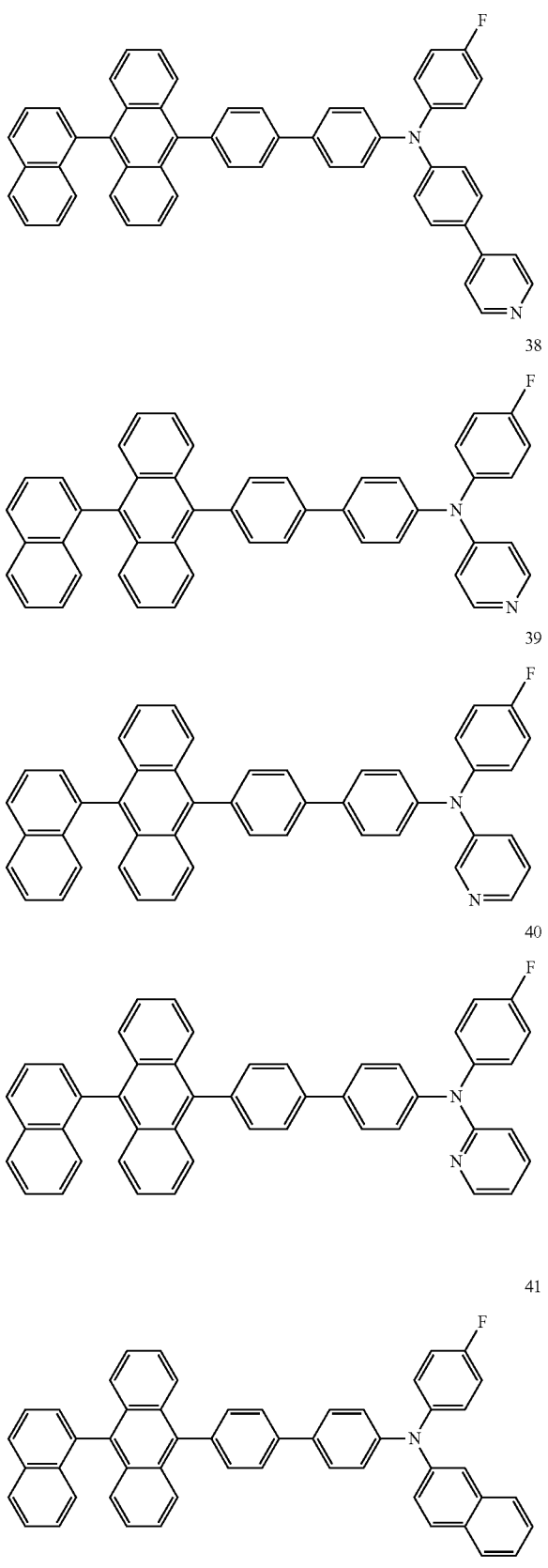
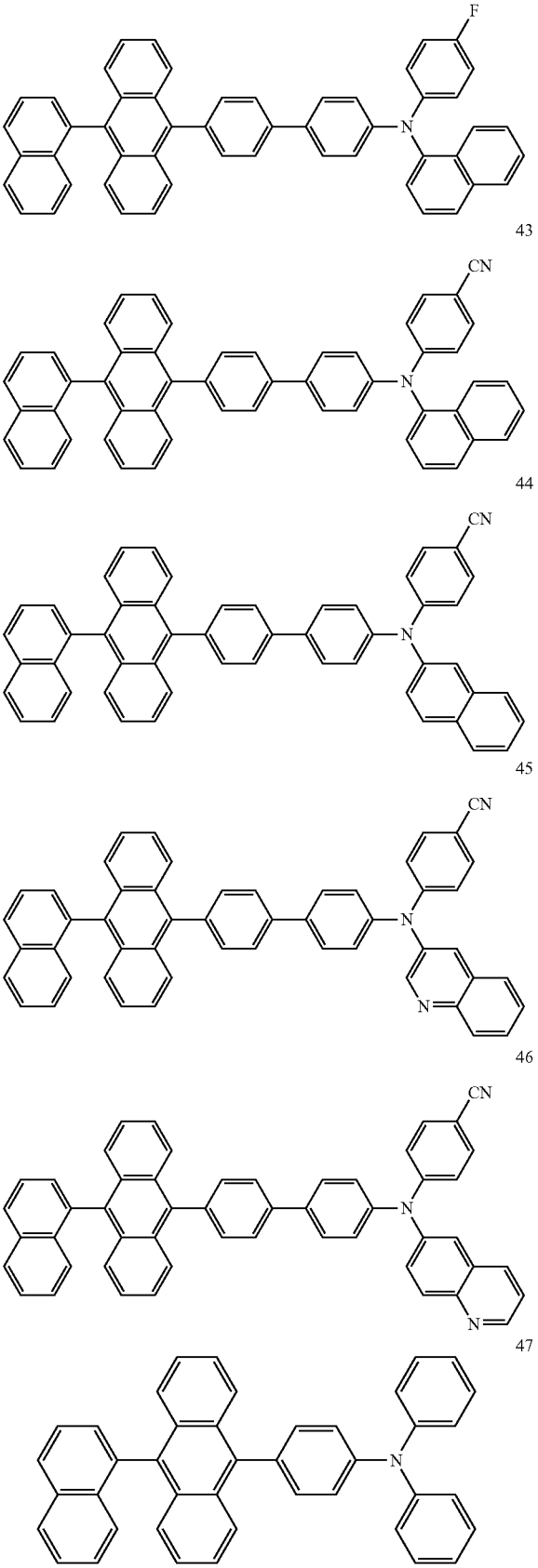

48
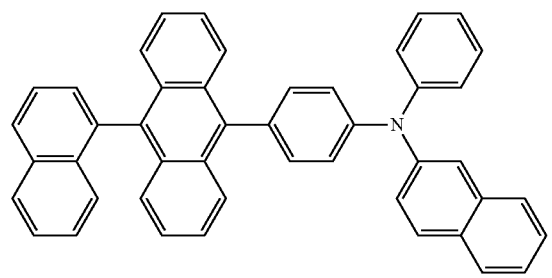
49
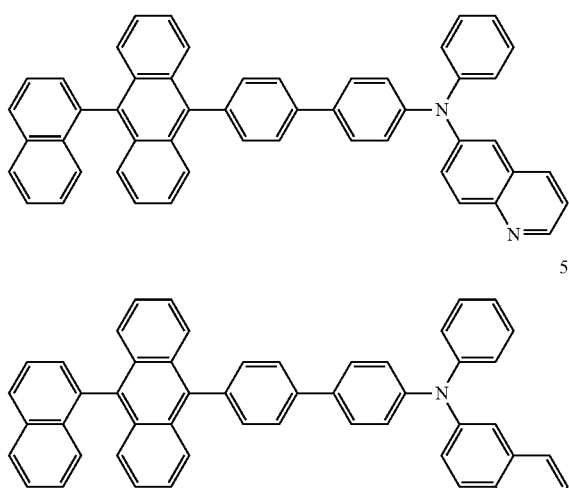
50
51
52
53
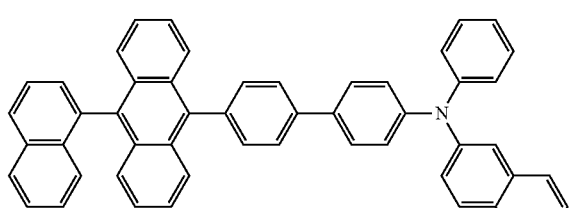
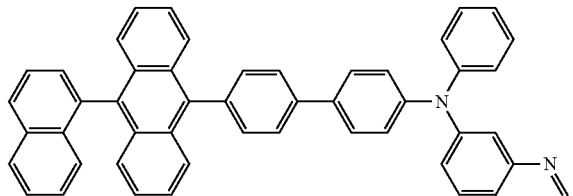
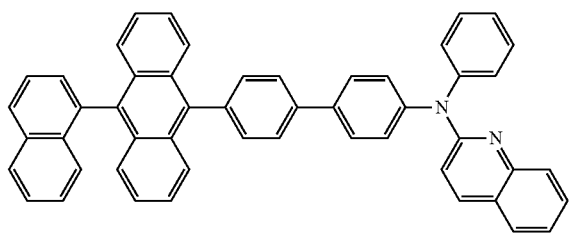
54
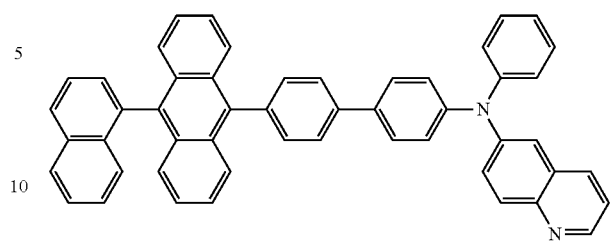
55
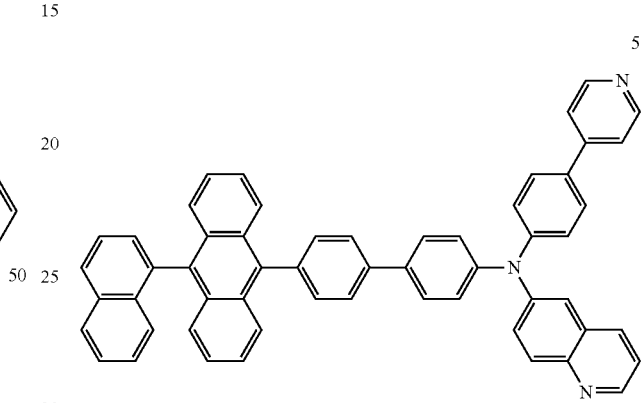
56
57
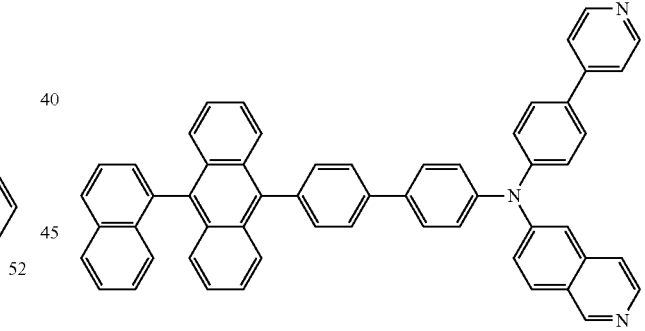
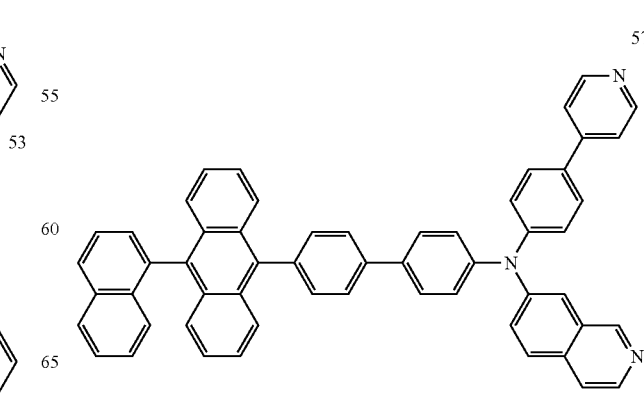

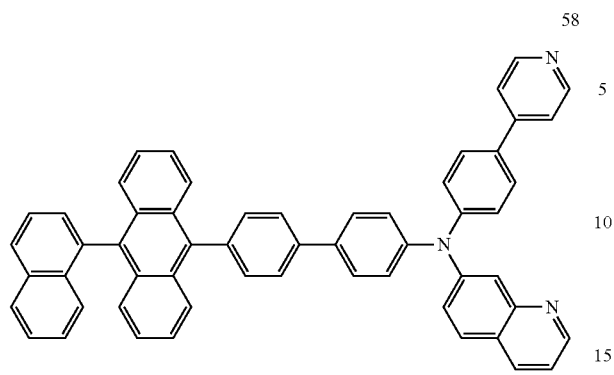
58
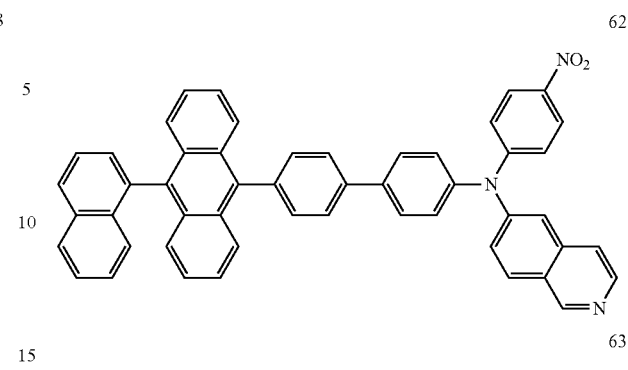
62
57
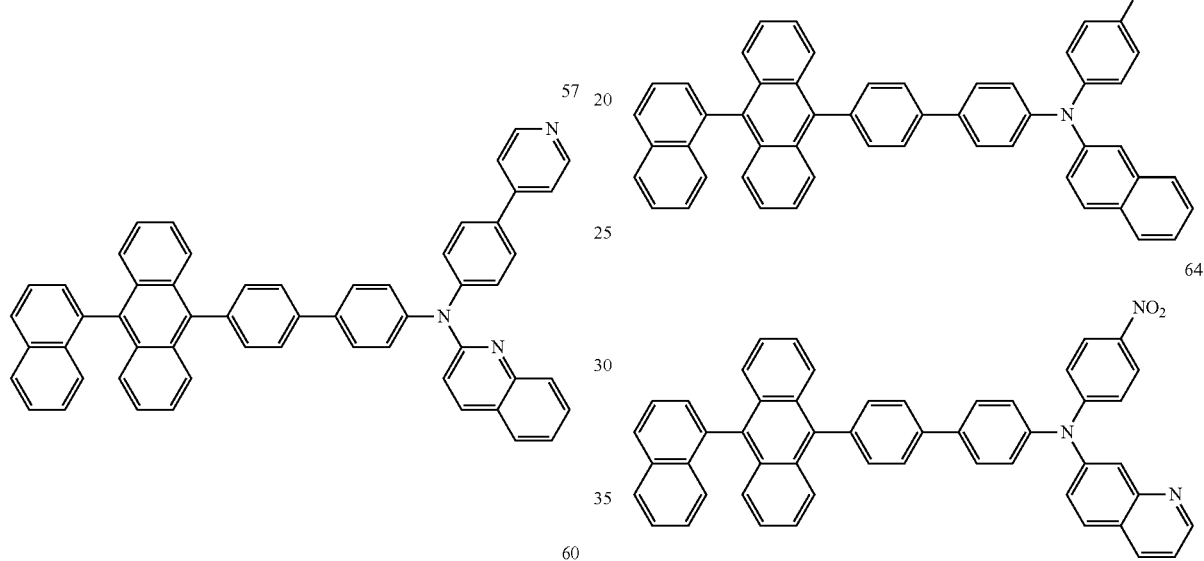
63
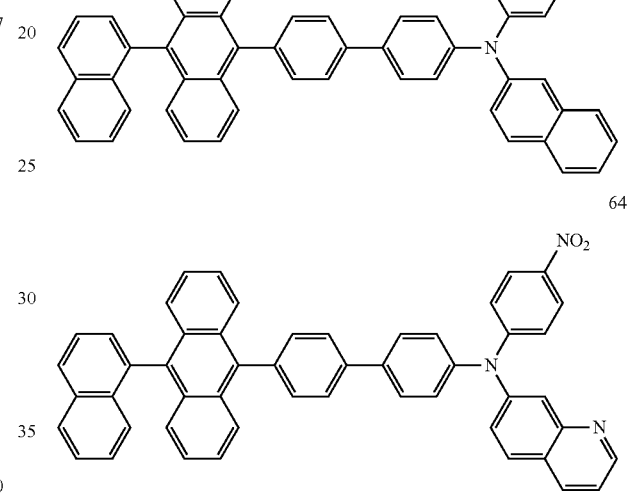
64
60
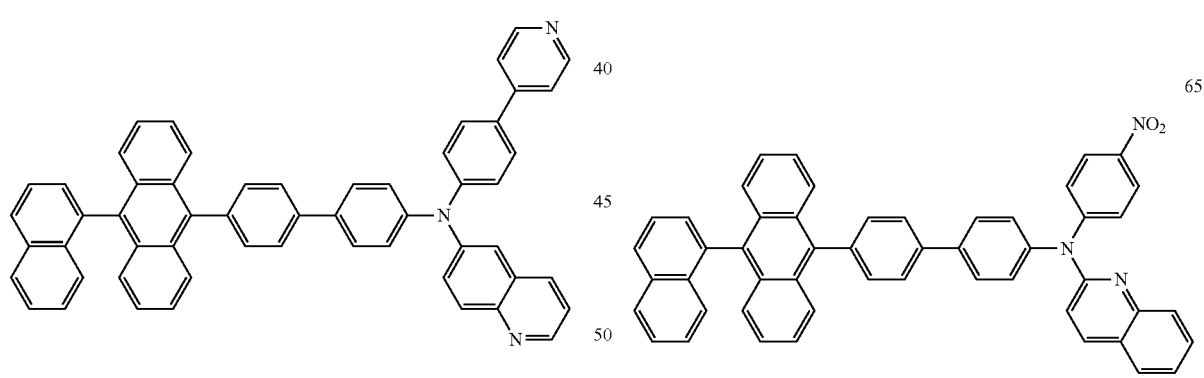
65
61
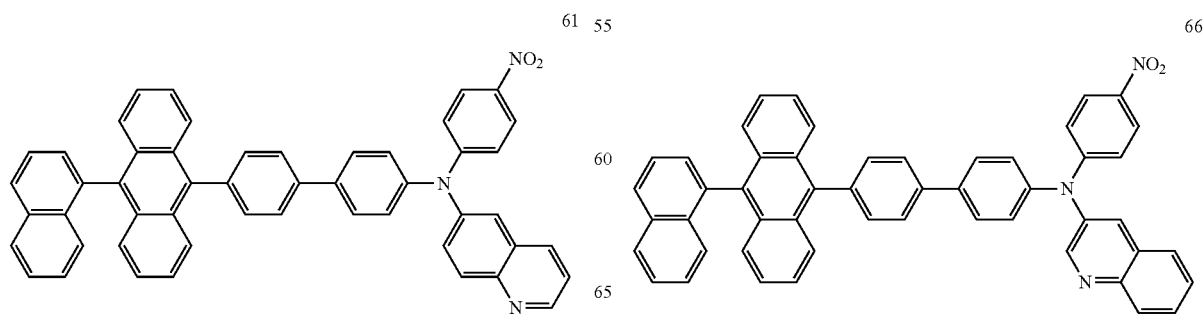
66

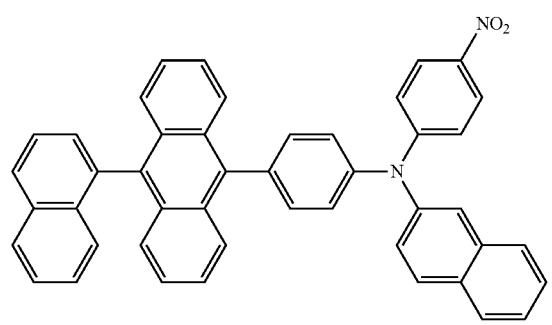
67
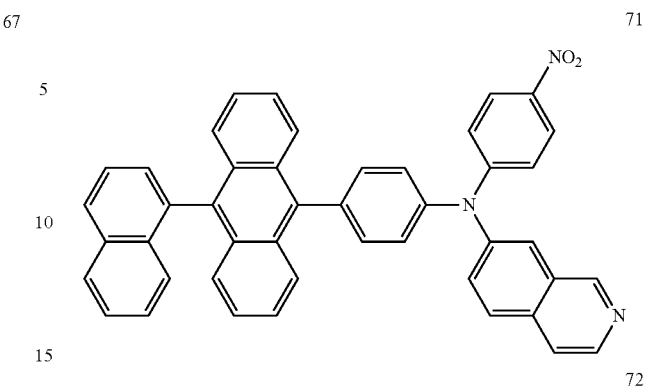
71
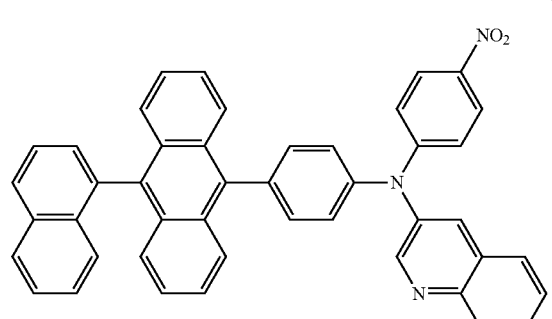
68
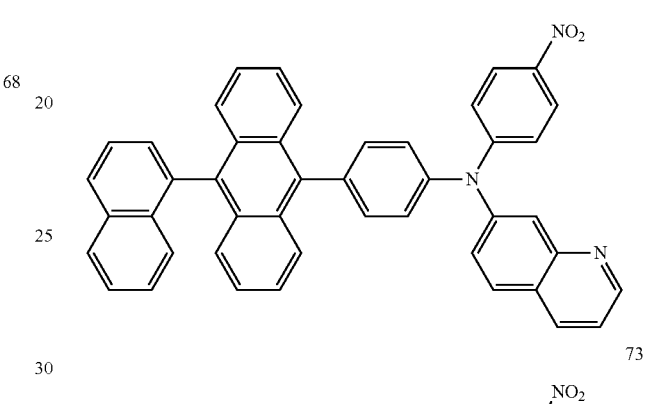
72
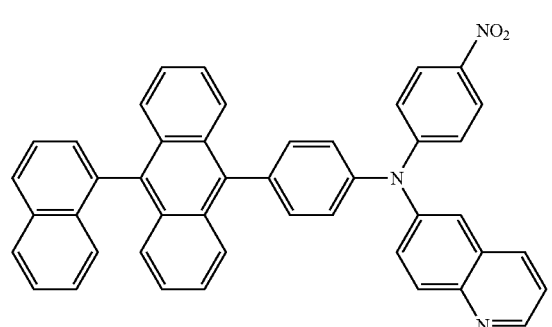
69
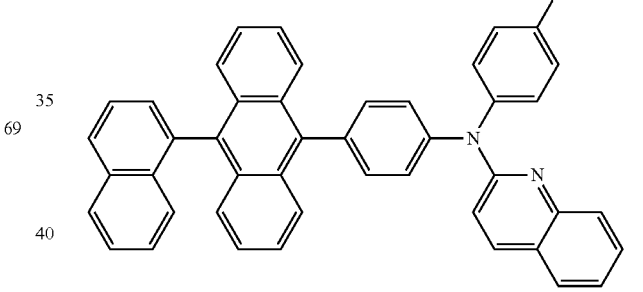
73
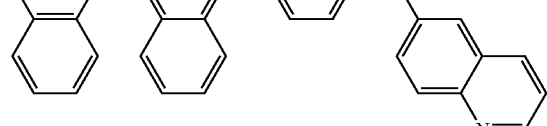
70
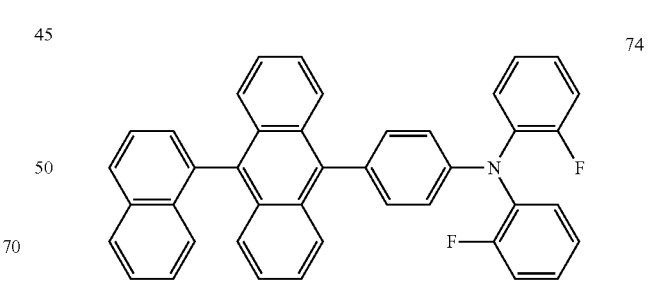
74
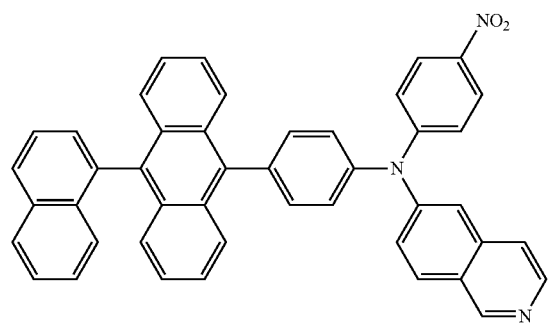
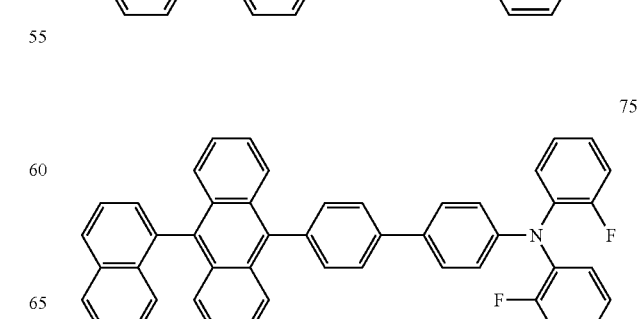
75

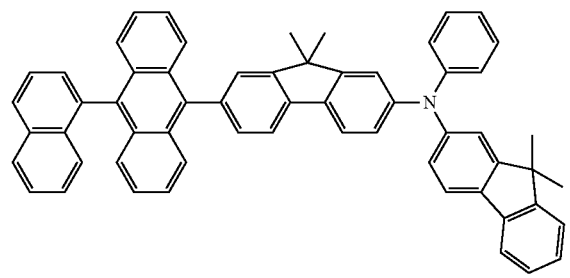
76
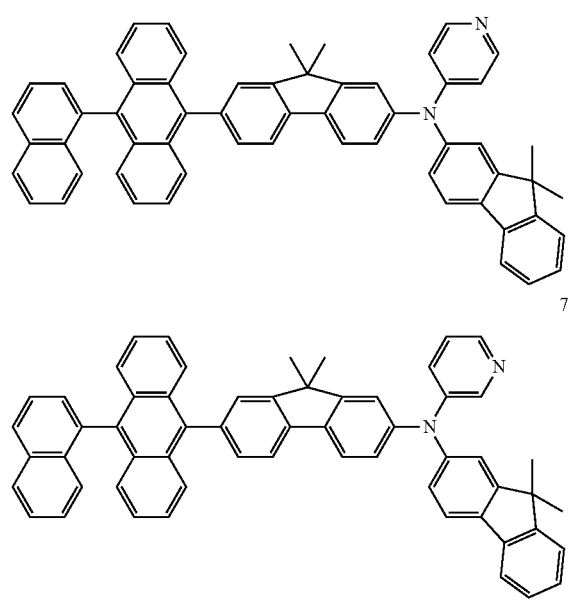
77
78
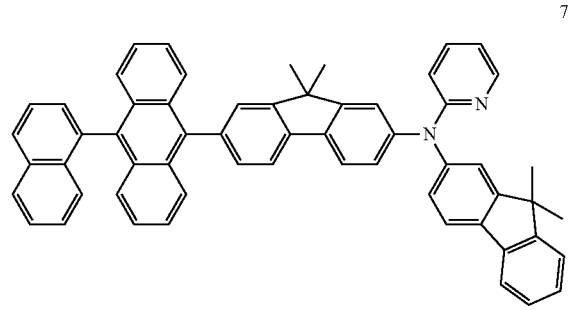
79
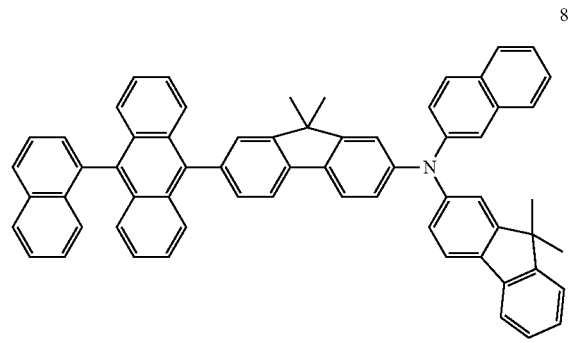
80
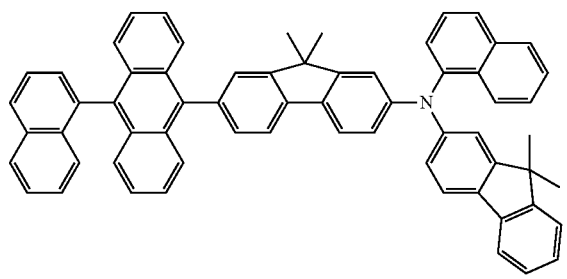
81
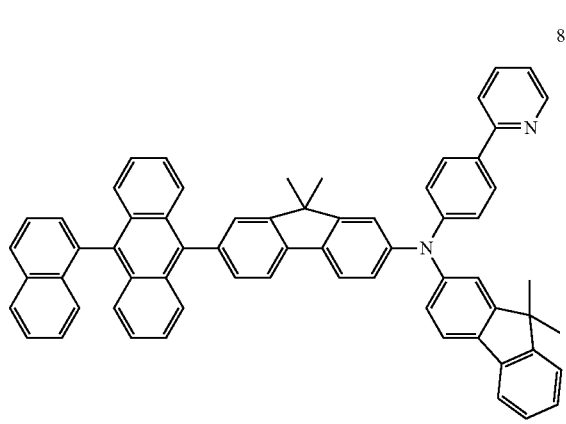
82
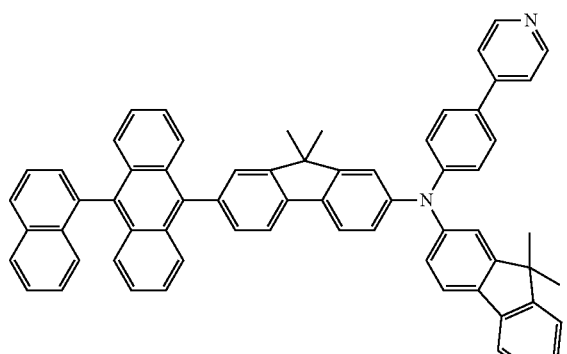
83
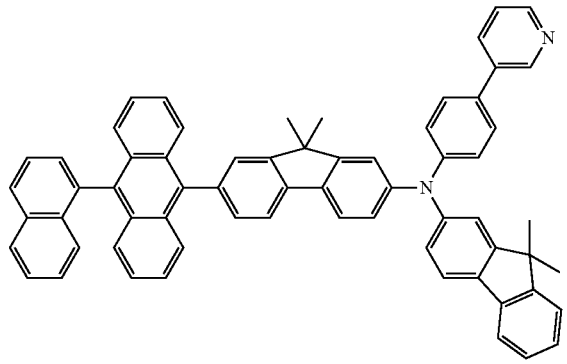
84

85
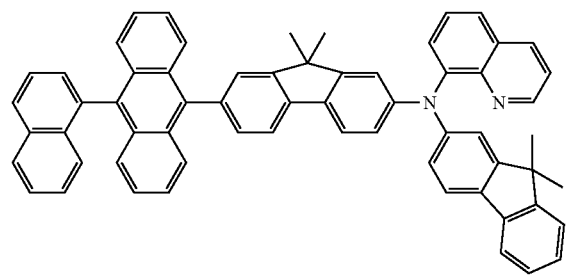
86
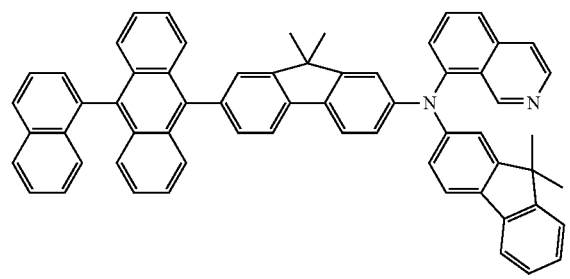
87
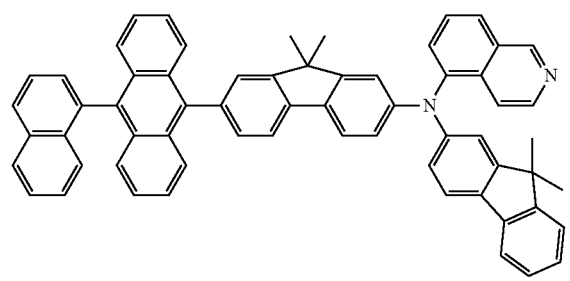
88
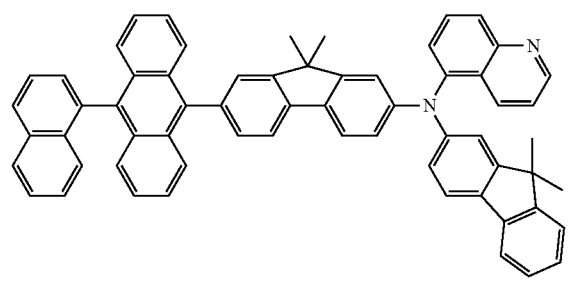
89
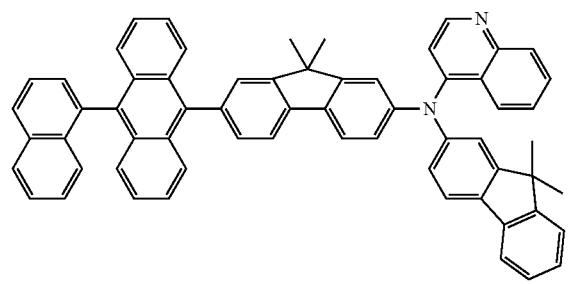
90
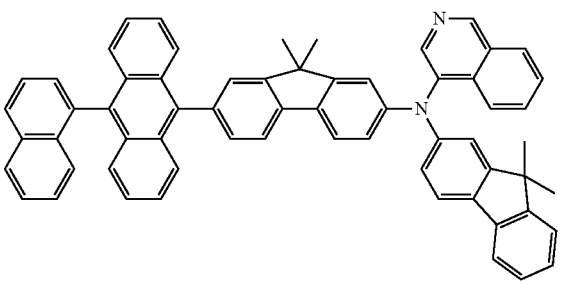
91
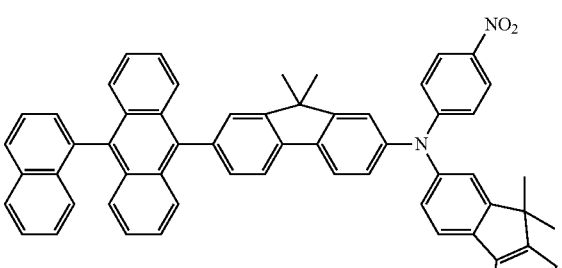
92
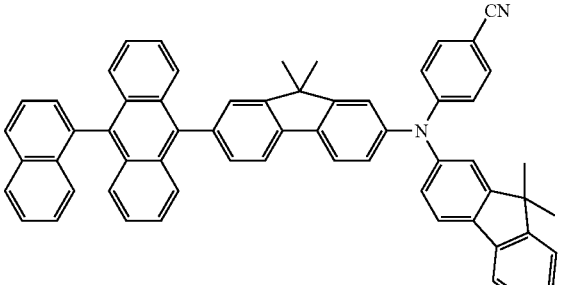
93
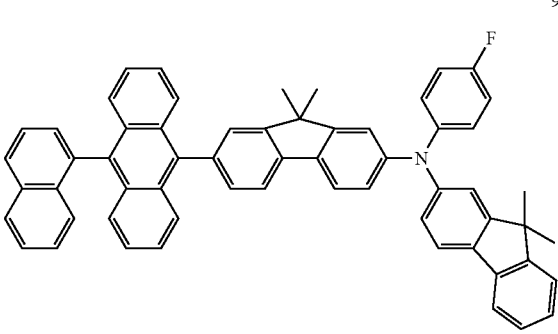
94
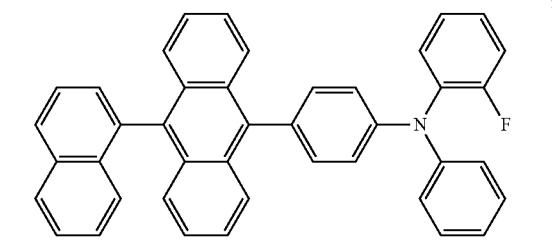

-continued

95

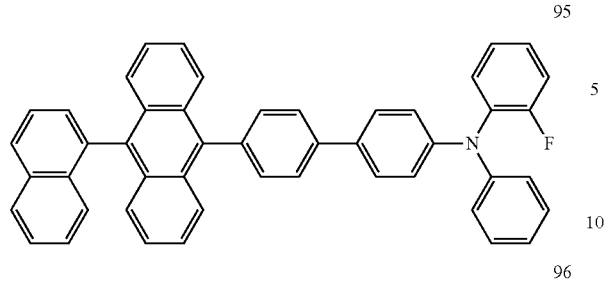

96

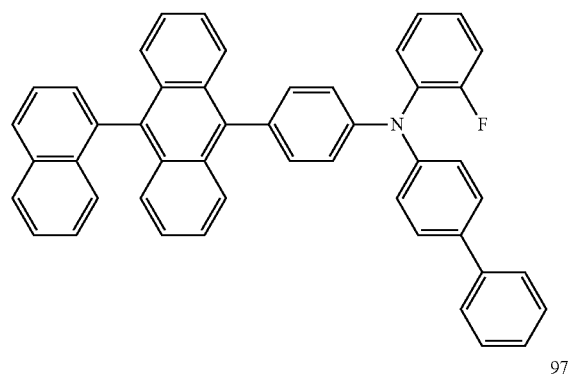

97

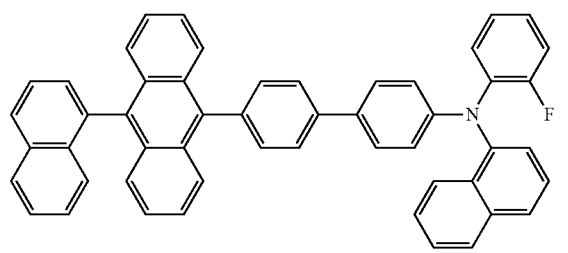

98

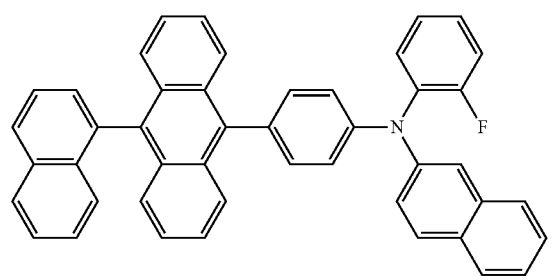

The thickness of the buffer layer 16 may be in the range of about 10 Å to about 100 Å, for example, about 20 Å to about 80 Å. In one embodiment, when the thickness of the buffer layer 16 is within these ranges, excellent efficiency characteristics are obtained without a substantial increase in driving voltage.

The buffer layer 16 includes the amine-based compound of Formula 1, and thus, electrons may be easily injected into the EML 15.

In addition, moiety A of Formula 1 (refer to Formula 1' below) can remove at least some of excess electrons that are not injected into the EML 15 and thus do not contribute to the formation of excitons. Thus, by forming the buffer layer 16, exciton-polaron quenching, which could occur between the EML 15 and the ETL 17 to thus reduce the efficiency and lifetime of an OLED may be reduced.

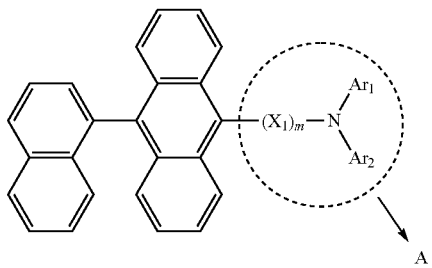

<Formula 1'>

Moreover, excitons may be further formed in the ETL 17 on the buffer layer 16 by non-covalent electron pairs present in nitrogen of the moiety A of Formula 1, and the excitons migrate to the EML 15, thereby contributing to light emission.

Therefore, an OLED including the buffer layer 16 that includes the amine-based compound of Formula 1 and is interposed between the EML 15 and the ETL 17 may have high efficiency and long lifetime.

Next, the ETL 17 is formed on the buffer layer 16 by using various suitable methods such as vacuum deposition, spin coating, or casting. When the ETL 17 is formed by vacuum deposition or spin coating, the deposition and coating conditions may vary according to used compounds. However, in general, the deposition and coating conditions may be almost the same as the conditions for forming the HIL 13. A material for forming the ETL 17 may be a known electron transporting material to stably transport electrons injected from the second electrode 19. Examples of the known electron transporting materials may include, but are not limited to, a quinoline derivative such as tris(8-quinolinolate)aluminum (Alq$_3$), TAZ, BAlq, and beryllium bis(benzoquinolin-10-olate (Bebq$_2$).

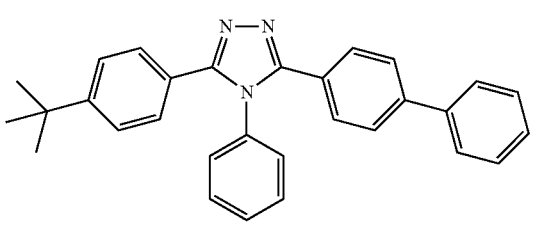

TAZ

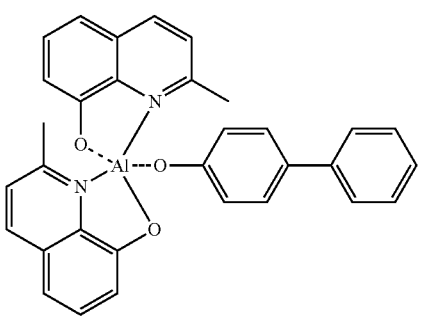

BAlq

The ETL 17 may include an anthracene-based compound represented by one of Formulae 10A through 10C below.

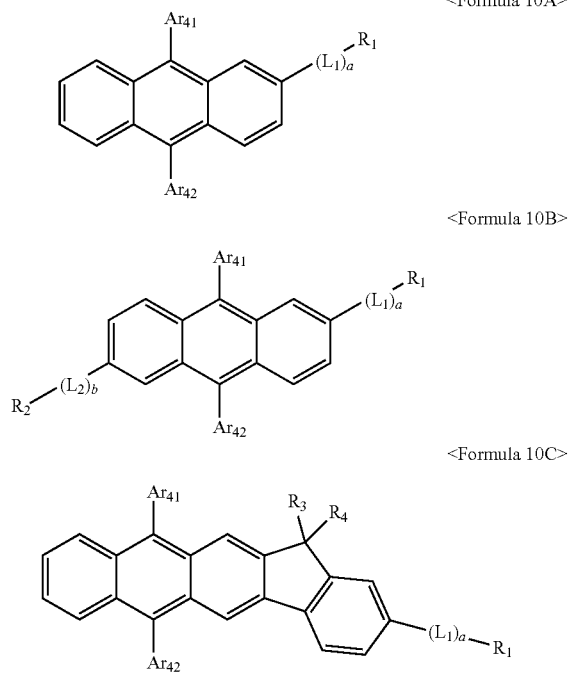

<Formula 10A>

<Formula 10B>

<Formula 10C>

In Formulae 10A through 10C, $Ar_{41}$ and $Ar_{42}$ may be each independently a substituted or unsubstituted $C_6$-$C_{60}$ aryl group or a substituted or unsubstituted $C_2$-$C_{60}$ heteroaryl group; $L_1$ and $L_2$ may be each independently a substituted or unsubstituted $C_6$-$C_{60}$ arylene group or a substituted or unsubstituted $C_2$-$C_{60}$ heteroarylene group; a and b may be each independently 0, 1, or 2; $R_1$ and $R_2$ may be each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group; and $R_3$ and $R_4$ may be each independently one of a $C_1$-$C_{20}$ alkyl group; a $C_6$-$C_{20}$ aryl group; and a $C_1$-$C_{20}$ alkyl group and a $C_6$-$C_{20}$ aryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof.

In Formulae 10A through 10C, $Ar_{41}$ and $Ar_{42}$ may be each independently a substituted or unsubstituted $C_6$-$C_{60}$ aryl group or a substituted or unsubstituted $C_2$-$C_{60}$ heteroaryl group.

For example, $Ar_{41}$ and $Ar_{42}$ may be each independently a $C_6$-$C_{60}$ aryl group; a $C_2$-$C_{60}$ heteroaryl group; and a $C_6$-$C_{60}$ aryl group and a $C_2$-$C_{60}$ heteroaryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

For example, $Ar_{41}$ and $Ar_{42}$ may be each independently one of a phenyl group; a naphthyl group; an anthryl group; a pyrenyl group; a fluorenyl group; a pyridinyl group; a pyrazinyl group; a pyrimidinyl group; and a phenyl group, a naphthyl group, an anthryl group, a pyrenyl group, a fluorenyl group, a pyridinyl group, a pyrazinyl group, and a pyrimidinyl group that are substituted with at least one of a phenyl group, a naphthyl group, an anthryl group, a pyrenyl group, a fluorenyl group, a pyridinyl group, a pyrazinyl group, and a pyrimidinyl group.

The $Ar_{41}$ and $Ar_{42}$ groups may be identical to each other, but are not limited thereto.

In Formulae 10A through 10C, $L_1$ and $L_2$ may be each independently a substituted or unsubstituted $C_6$-$C_{60}$ arylene group or a substituted or unsubstituted $C_2$-$C_{60}$ heteroarylene group.

For example, $L_1$ and $L_2$ may be each independently one of a $C_6$-$C_{60}$ arylene group; a $C_2$-$C_{60}$ heteroarylene group; and a $C_6$-$C_{60}$ arylene group and a $C_2$-$C_{60}$ heteroarylene group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

For example, $L_1$ and $L_2$ may be each independently one of a phenylene group; a naphthylene group; an anthrylene group; a pyrenylene group; a fluorenylene group; a pyridinylene group; a pyrazinylene group; a pyrimidinylene group; and a phenylene group, a naphthylene group, an anthrylene group, a pyrenylene group, a fluorenylene group, a pyridinylene group, a pyrazinylene group, and a pyrimidinylene group that are substituted with at least one of a phenyl group, a naphthyl group, an anthryl group, a pyrenyl group, a fluorenyl group, a pyridinyl group, a pyrazinyl group, and a pyrimidinyl group, but are not limited thereto.

In Formulae 10A through 10C, a and b may be each independently 0, 1, or 2. For example, a and b may be each independently 0 or 1.

In Formulae 10A through 10C, $R_1$ and $R_2$ may be each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group.

For example, in Formulae 10A through 10C, $R_1$ and $R_2$ may be each independently one of a benzoimidazolyl group; a benzoxazolyl group; a benzothiazolyl group; a benzopyrimidinyl group; an imidazopyridinyl group; a quinolinyl group; an isoquinolinyl group; a quinazolinyl group; a pyridinyl group; a pyrimidinyl group; a pyrazinyl group; a phenyl group; a naphthyl group; a pyrenyl group; a chrysenyl group; a fluorenyl group; a phenanthrenyl group; and a benzoimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

In Formula 10C, $R_3$ and $R_4$ may be each independently one of a $C_1$-$C_{20}$ alkyl group; a $C_6$-$C_{20}$ aryl group; and a $C_1$-$C_{20}$ alkyl group and a $C_6$-$C_{20}$ aryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof. For example, $R_3$ and $R_4$ may be each independently a methyl group, an ethyl group, a propyl group, a butyl group, a pentyl group, a hexyl group, a phenyl group or a naphthyl group, but are not limited thereto.

For example, $R_1$ and $R_2$ may be each independently one of Formulae 11(1) through 11(24) below, but are not limited thereto:

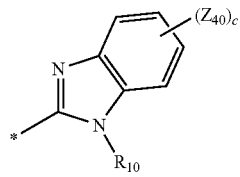

Formula 11(1)

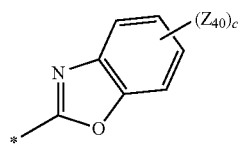

Formula 11(2)

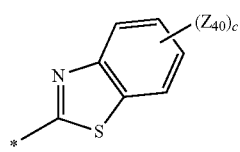

Formula 11(3)

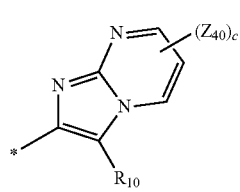

Formula 11(4)

-continued

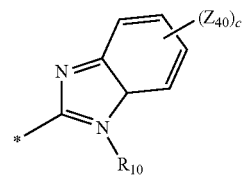

Formula 11(5)

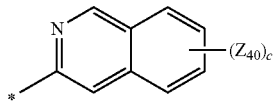

Formula 11(6)

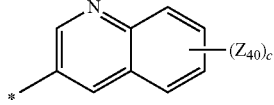

Formula 11(7)

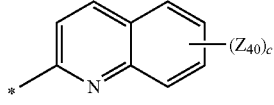

Formula 11(8)

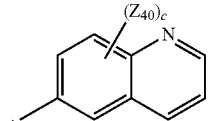

Formula 11(9)

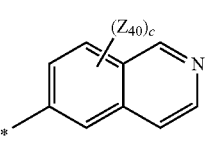

Formula 11(10)

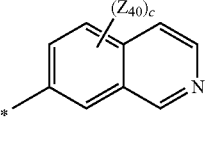

Formula 11(11)

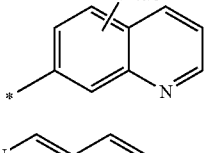

Formula 11(12)

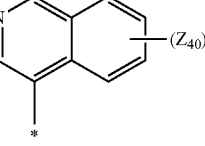

Formula 11(13)

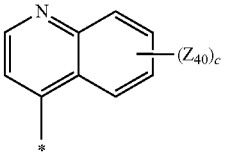

Formula 11(14)

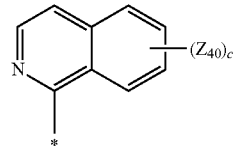

Formula 11(15)

-continued

Formula 11(16)
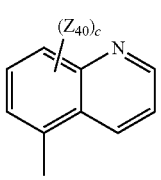

Formula 11(17)

Formula 11(18)
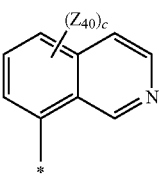

Formula 11(19)
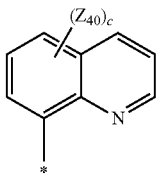

Formula 11(20)
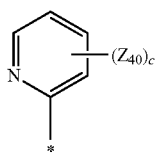

Formula 11(21)
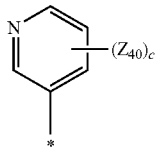

Formula 11(22)
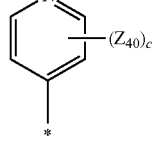

Formula 11(23)
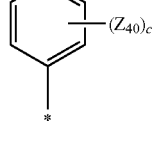

Formula 11(24)
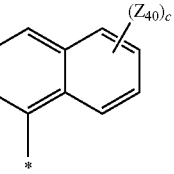

In Formulae 11(1) through 11(24), $R_{10}$ may be a substituted or unsubstituted $C_1$-$C_{60}$ alkyl group or a substituted or unsubstituted $C_6$-$C_{60}$ aryl group; $Z_{40}$ may be one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_6$-$C_{60}$ aryl group; a $C_2$-$C_{60}$ heteroaryl group; and a $C_1$-$C_{60}$ alkyl group, a $C_1$-$C_{60}$ alkoxy group, a $C_6$-$C_{60}$ aryl group, and a $C_2$-$C_{60}$ heteroaryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; and c may be an integer of 1 to 5.

For example, $R_{10}$ may be one of a methyl group; an ethyl group; a propyl group; a butyl group; a pentyl group; a hexyl group; a heptyl group; an octyl group; a phenyl group; a naphthyl group; an anthryl group; a fluorenyl group; a phenanthrenyl group; and a methyl group, an ethyl group, a propyl group, a butyl group, a pentyl group, a hexyl group, a heptyl group, an octyl group, a phenyl group, a naphthyl group, an anthryl group, a fluorenyl group, and a phenanthrenyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof.

The anthracene-based compound may be represented by any one of Formulae 10A(1) through 10A(12) below, 10B(1) through 10B(12) below, and 10C(1) through 10C(6) below, but is not limited thereto:

Formula 10A(1)
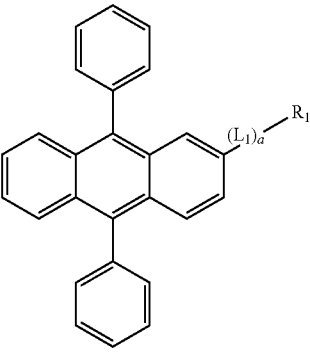

Formula 10A(2)
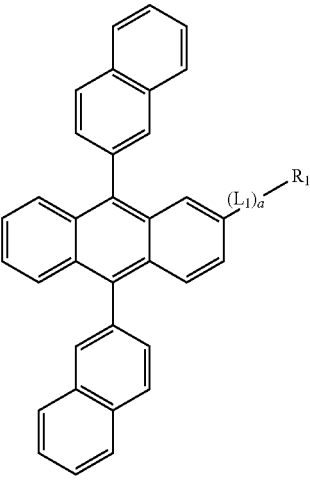

Formula 10A(3)
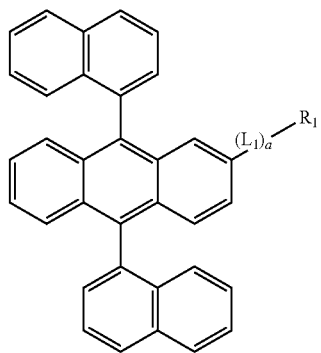
Formula 10A(6)
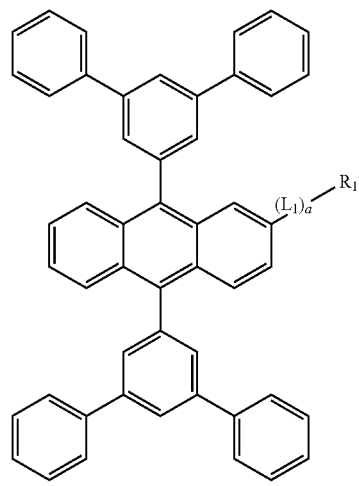
Formula 10A(4)
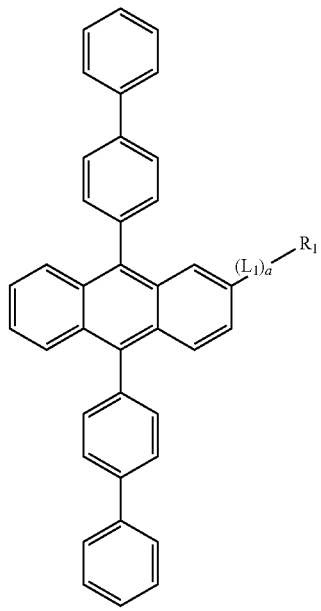
Formula 10A(7)
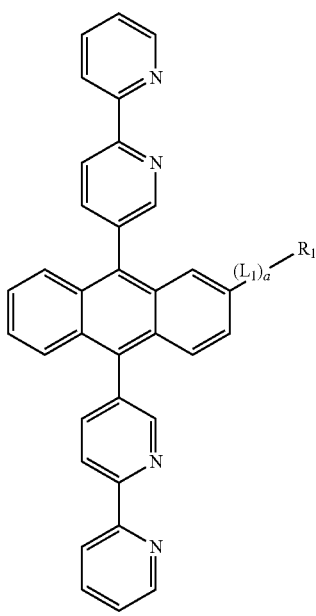
Formula 10A(5)
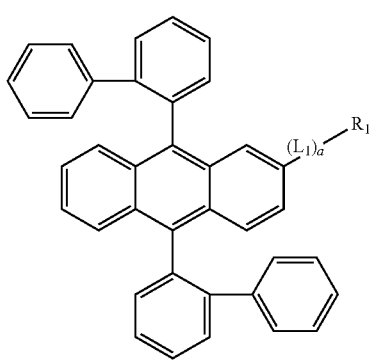
Formula 10A(8)
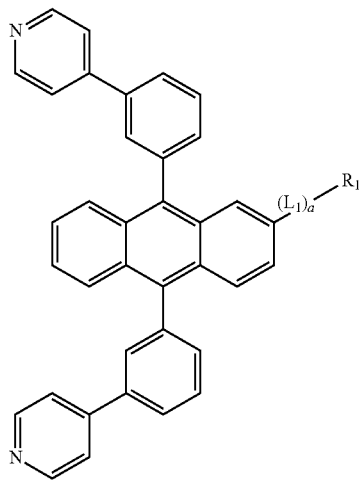

Formula 10A(9)
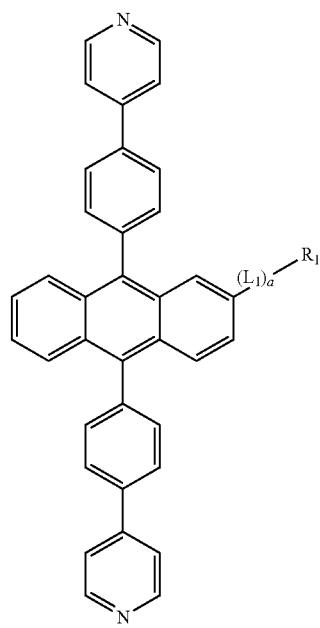
Formula 10A(10)
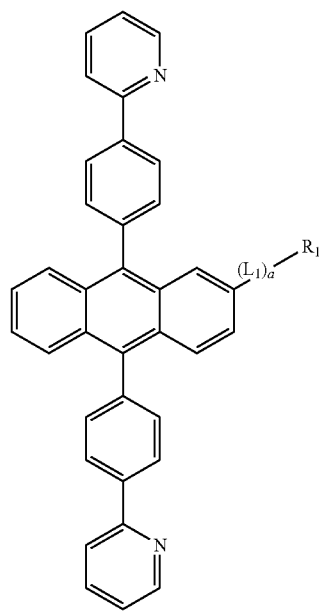
Formula 10A(11)
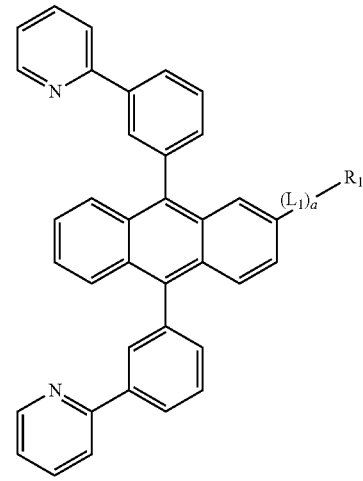
Formula 10A(12)
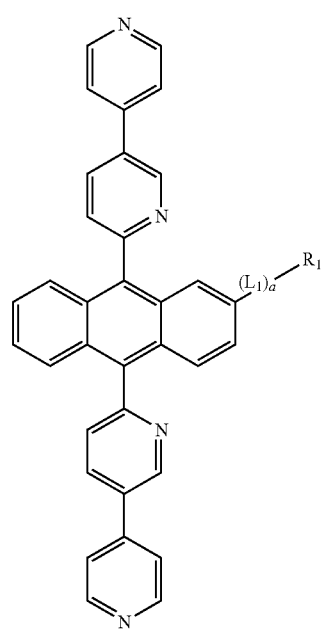
Formula 10B(1)
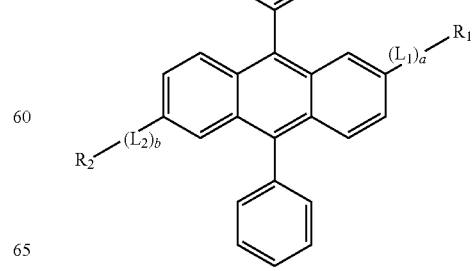

-continued
Formula 10B(2)
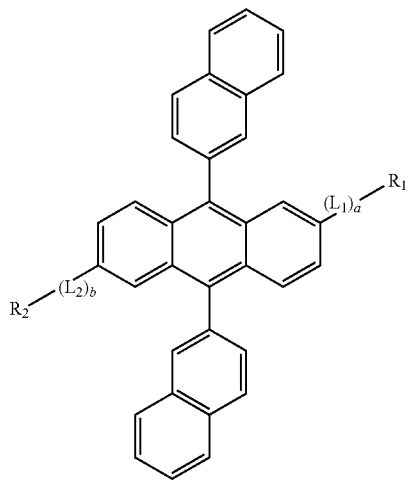
Formula 10B(3)
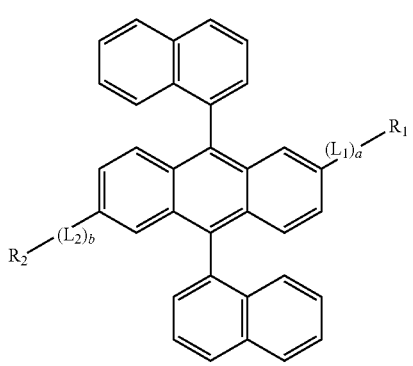
Formula 10B(4)
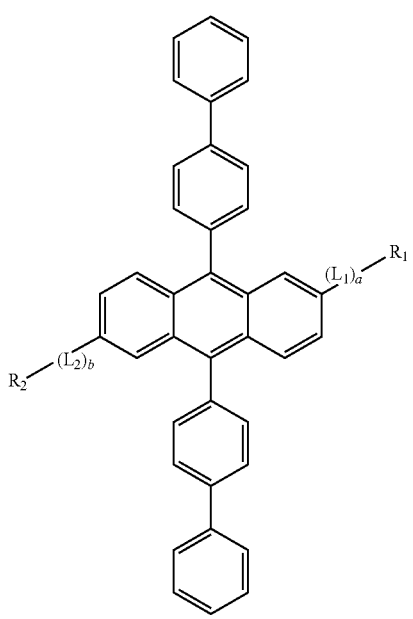
Formula 10B(5)
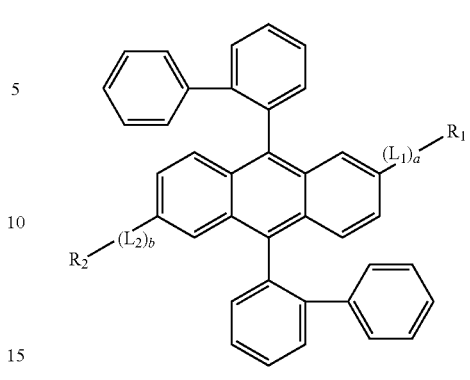
Formula 10B(6)
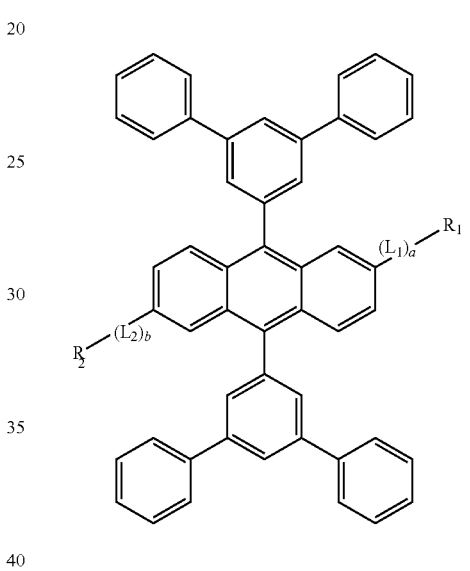
Formula 10B(7)
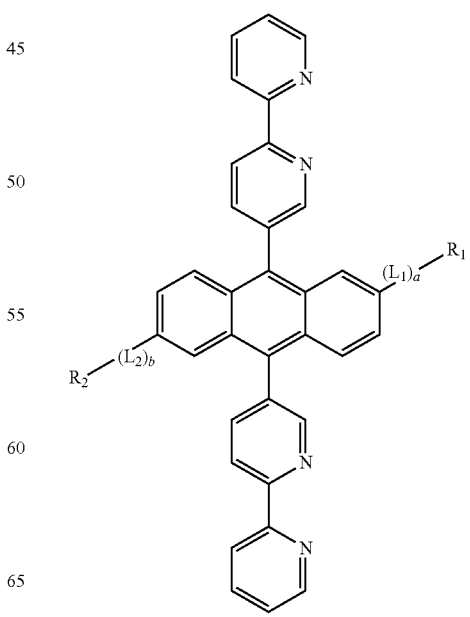

Formula 10B(8)
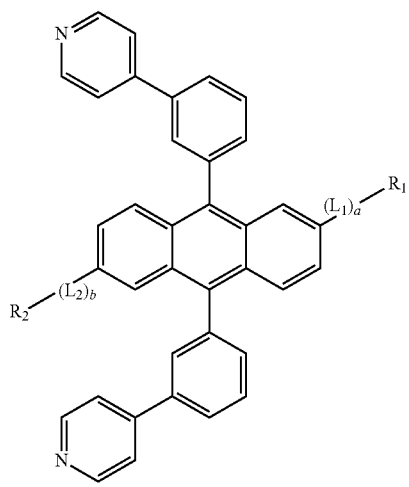
Formula 10B(9)
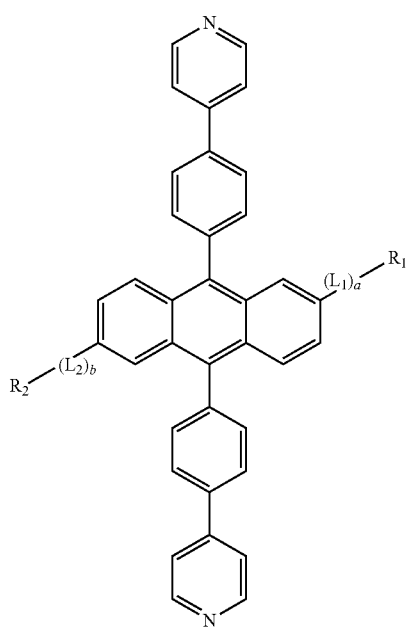
Formula 10B(10)
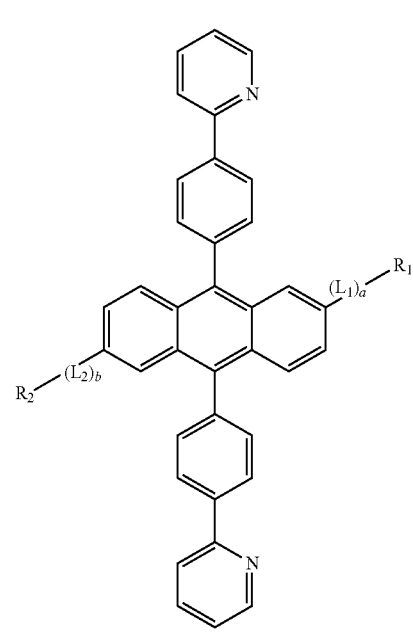
Formula 10B(11)
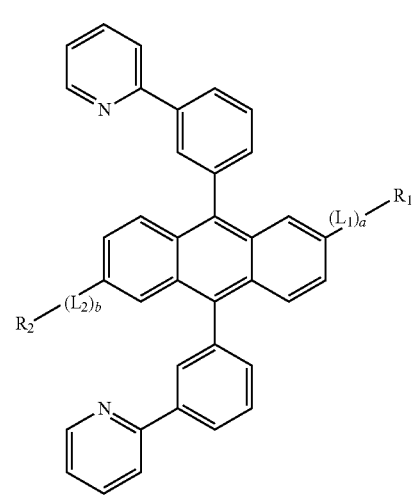

Formula 10B(12)
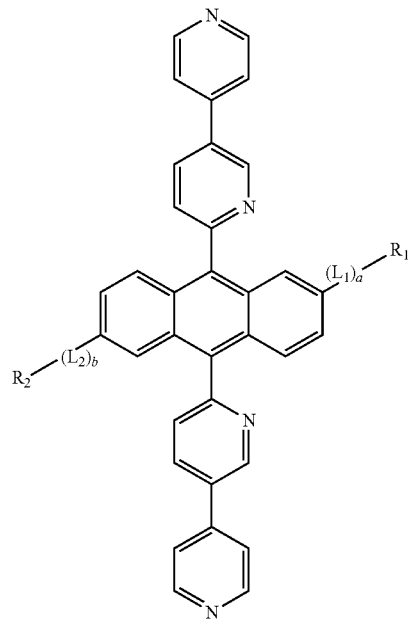
Formula 10C(1)
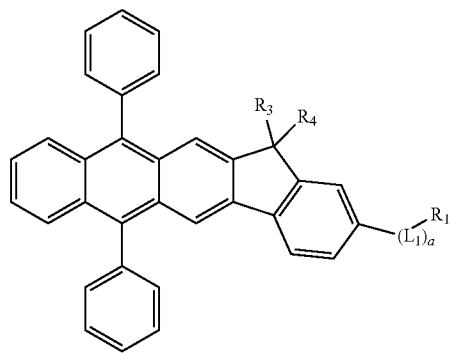
Formula 10C(2)
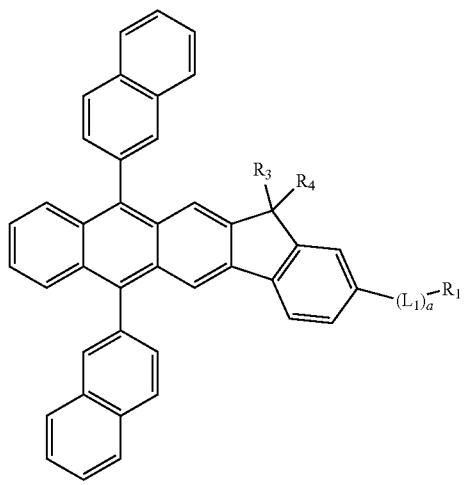
Formula 10C(3)
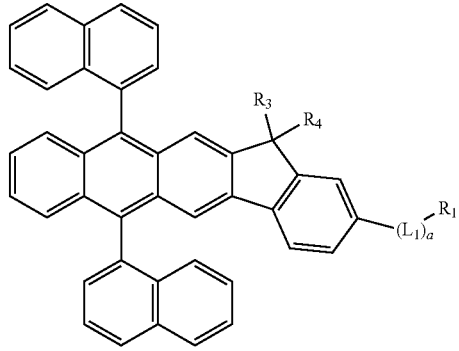
Formula 10C(4)
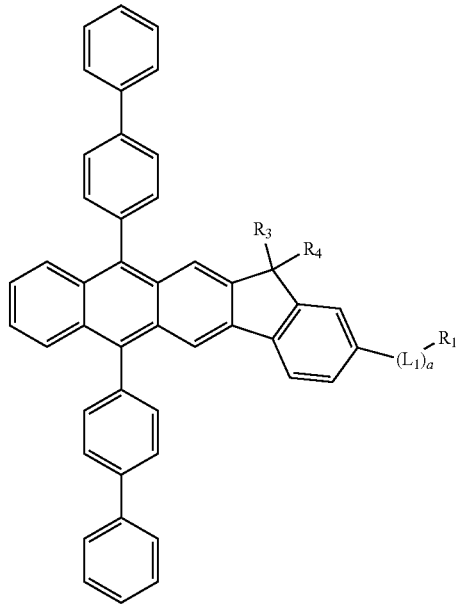
Formula 10C(5)
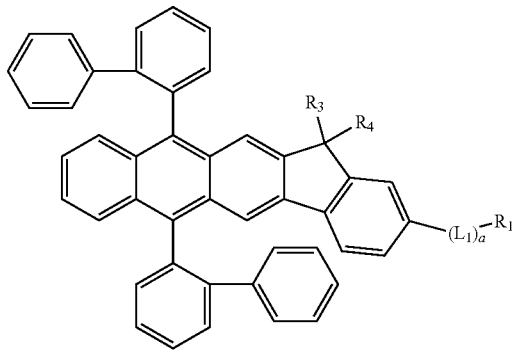

Formula 10C(6)

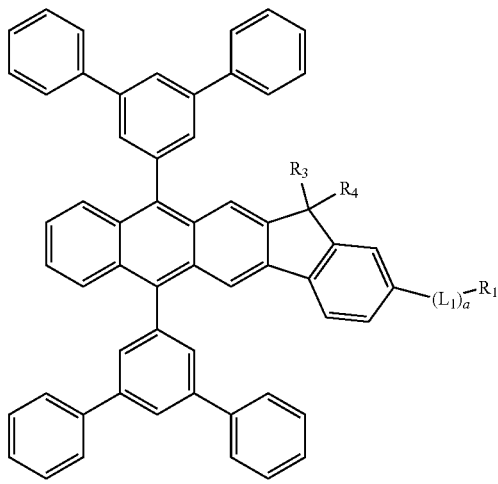

In Formulae 10A(1) through 10A(12), 10B(1) through 10B(12), and 10C(1) through 10C(6), $L_1$, $L_2$, a, b, and $R_1$ through $R_4$ are the same as defined above.

According to one embodiment, the anthracene-based compound is represented by one of Formulae 10A(1) through 10A(6), 10B(1) through 10B(6), and 10C(1) through 10C(6), wherein $R_1$ and $R_2$ may be each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, or a substituted or unsubstituted pyrazinyl group (e.g., one of Formulae 11(1) through 11(22)).

In another embodiment, the anthracene-based compound is represented by one of Formulae 10A(1) through 10A(6), 10B(1) through 10B(6), and 10C(1) through 10C(6), wherein $R_1$ and $R_2$ may be each independently a substituted or unsubstituted benzoimidazolyl group, a substituted or unsubstituted benzoxazolyl group, or a substituted or unsubstituted benzothiazolyl group (e.g., one of Formulae 11(1) through 11(3)).

In another embodiment, the anthracene-based compound is represented by one of Formulae 10A(7) through 10A(12) and 10B(7) through 10B(12), wherein $R_1$ and $R_2$ may be each independently a substituted or unsubstituted phenyl group or a substituted or unsubstituted naphthyl group (e.g., Formula 11(23) or 11(24)), but are not limited thereto.

The anthracene-based compound may be one of Compounds 200 through 210, but is not limited thereto:

<Compound 200>

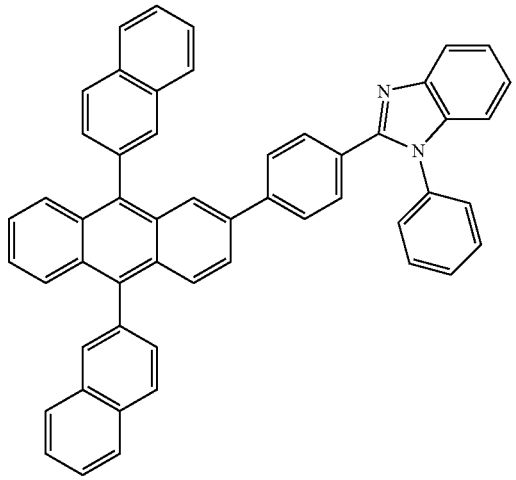

<Compound 201>

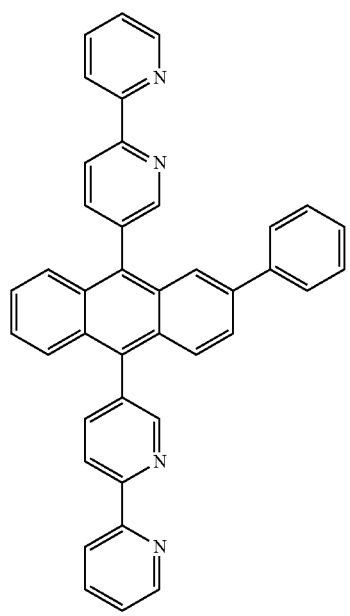

<Compound 202>

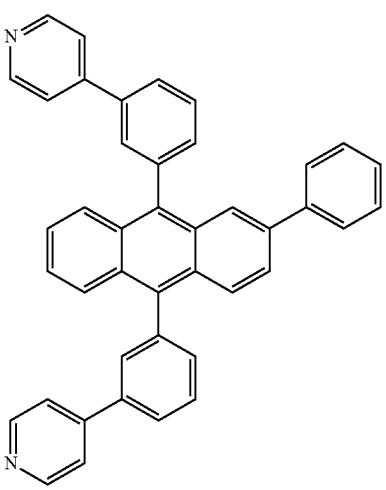

<Compound 203>
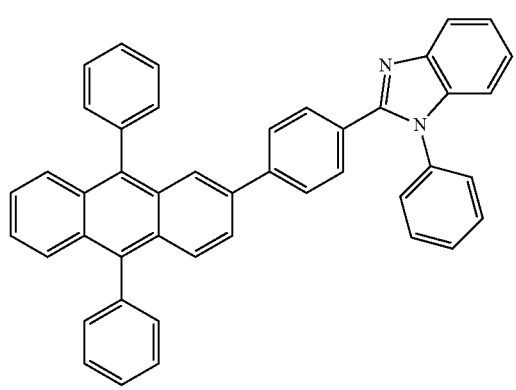
<Compound 204>
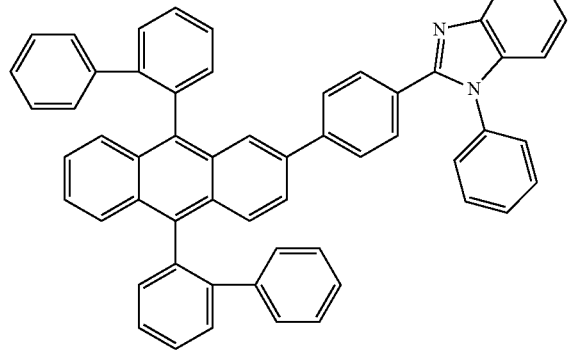
<Compound 205>
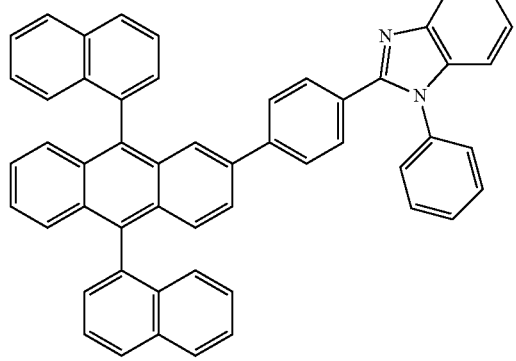
<Compound 206>
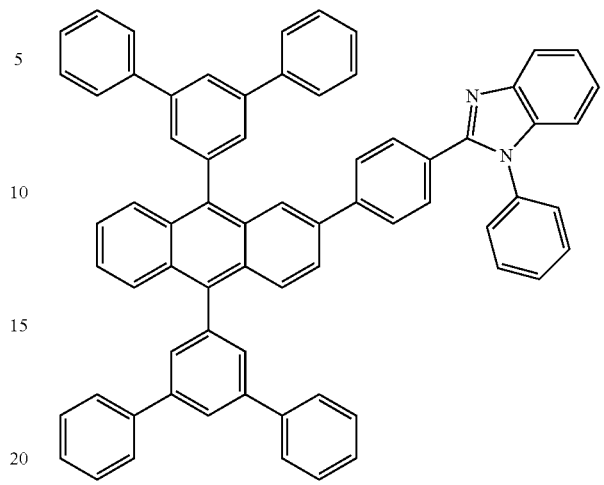
<Compound 207>
<Compound 208>
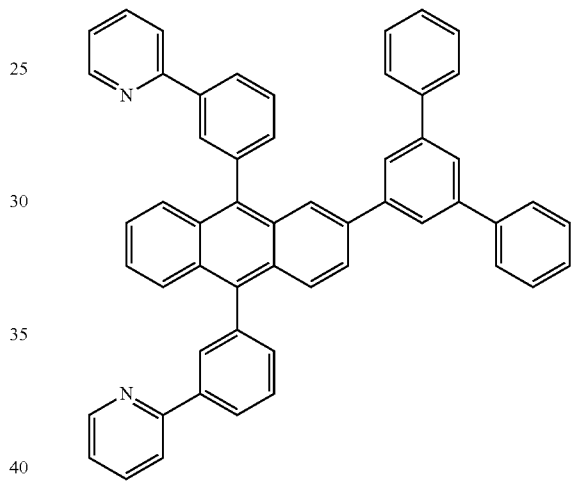
<Compound 209>
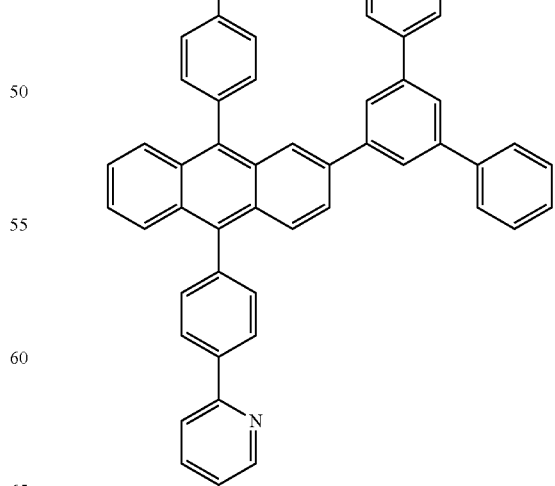

<Compound 210>

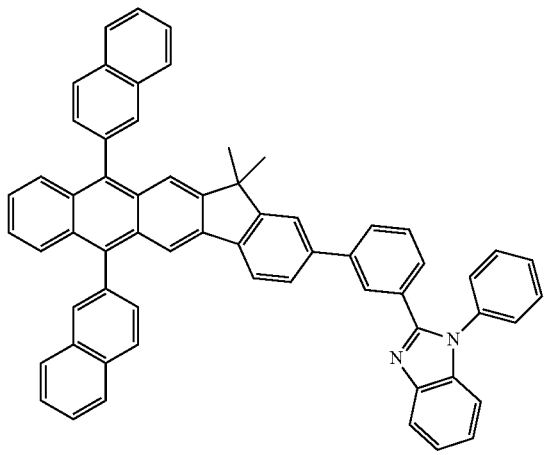

The ETL may further include an n-dopant, in addition to the anthracene-based compound described above. Examples of the n-dopant include a Li complex, LiF, CsF, $Al_2O_3$, $SiO_2$, $Si_3N_4$, and $Cs_2CO_3$. In one embodiment, the n-dopant may be Compound 250 or 251 below, but is not limited thereto.

<Compound 250>

<Compound 251>

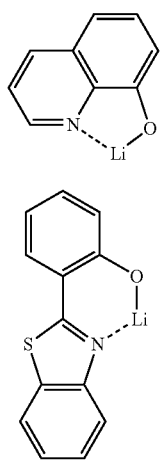

The thickness of the ETL 17 may be in the range of about 100 Å to about 1,000 Å, for example, about 150 Å to about 500 Å. When the thickness of the ETL 17 is within these ranges, satisfactory electron transport properties may be obtained without a substantial increase in driving voltage.

Also, the EIL 18, which facilitates electron injection from a cathode, may be formed on the ETL 17, and a material for forming the EIL 18 is not particularly limited.

The material for forming the EIL 18 may include a well-known material for forming an EIL, such as LiF, NaCl, CsF, $Li_2O$, or BaO. The deposition conditions of the EIL 18 may vary according to the compound used. However, in general, the conditions may be almost the same as the conditions for forming the HIL 13.

The thickness of the EIL 18 may be in the range of about 1 Å to about 100 Å, for example, about 3 Å to about 90 Å. When the thickness of the EIL 18 is within these ranges, satisfactory electron injection properties may be obtained without a substantial increase in driving voltage.

The second electrode 19 is formed on the EIL 18. The second electrode 19 may be a cathode, which is an electron injection electrode. Here, a metal for forming the second electrode 19 may include a metal having low work function, such as metal, an alloy, an electric conducting compound, or a mixture thereof. In particular, the second electrode 19 may be formed as a thin film by using lithium (Li), magnesium (Mg), aluminum (Al), aluminum-lithium (Al—Li), calcium (Ca), magnesium-indium (Mg—In), or magnesium-silver (Mg—Ag), thus being transparent. In order to obtain a top-emission type OLED, the second electrode 19 may be formed as a transparent electrode by using ITO or IZO.

The OLED has been described with reference to FIG. 1, but is not limited thereto.

For example, when the EML 15 includes a phosphorescent dopant, a hole blocking layer (HBL) may be formed between the ETL 17 and the EML 15 by using various suitable methods such as vacuum deposition, spin coating, casting, or LB deposition in order to prevent triplet excitons or holes from diffusing into the ETL 17. When the HBL is formed by vacuum deposition or spin coating, the deposition and coating conditions vary according to a used compound. However, in general, the deposition and coating conditions may be almost the same as the conditions for forming the HIL 13. A material for forming the HBL may be a known hole blocking material, such as an oxadiazole derivative, a triazole derivative, or a phenanthroline derivative. For example, the material for forming the HBL may be BCP below.

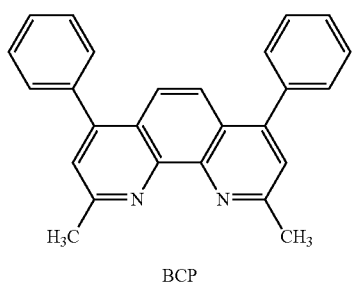 [SMILES: Cc1cc(-c2ccccc2)c2ccc3c(-c4ccccc4)cc(C)nc3c2n1 ; "BCP"]

BCP

The thickness of the HBL may be in the range of about 20 Å to about 1,000 Å, for example, about 30 Å to about 300 Å. When the thickness of the HBL is within these ranges, satisfactory hole blocking properties may be obtained without a substantial increase in driving voltage.

Alternatively, any one of the EIL 18 may not be formed.

The unsubstituted $C_1$-$C_{60}$ alkyl group denotes a linear or branched alkyl group with 1 to 60 carbon atoms. Examples of the unsubstituted $C_1$-$C_{60}$ alkyl group include a methyl group, an ethyl group, a propyl group, an isobutyl group, a sec-butyl group, a pentyl group, an iso-amyl group, and a hexyl group. In the substituted $C_1$-$C_{60}$ alkyl group, at least one hydrogen atom is substituted with one of deuterium; —F; —Cl; —Br; —I; —CN; a hydroxyl group; a nitro group; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, and a $C_6$-$C_{60}$ aryloxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

The unsubstituted $C_1$-$C_{60}$ alkoxy group has Formula of —OA (A is the unsubstituted $C_1$-$C_{60}$ alkyl group) and may be, for example, methoxy, ethoxy, isopropyloxy, and the like. At least one hydrogen atom of the alkoxy group may be substituted with the same substituent as in the substituted $C_1$-$C_{60}$ alkyl group described above.

The unsubstituted $C_2$-$C_{60}$ alkenyl group denotes a terminal group containing at least one carbon double bond at the middle or the end of the unsubstituted $C_2$-$C_{60}$ alkyl group. Examples of the unsubstituted $C_2$-$C_{60}$ alkenyl group may include ethenyl, propenyl, butenyl, and the like. At least one hydrogen atom of the $C_2$-$C_{60}$ alkenyl group may be substituted with the same substituent as in the substituted $C_1$-$C_{60}$ alkyl group described above.

The unsubstituted $C_2$-$C_{60}$ alkynyl group denotes a terminal group containing at least one carbon triple bond at the middle or the end of the unsubstituted $C_2$-$C_{60}$ alkyl group. Examples of the unsubstituted $C_2$-$C_{60}$ alkynyl group may be ethynyl, propynyl, and the like. At least one hydrogen atom of the $C_2$-$C_{60}$ alkynyl group may be substituted with the same substituent as in the substituted $C_1$-$C_{60}$ alkyl group described above.

The unsubstituted $C_6$-$C_{60}$ aryl group denotes a monovalent group having a $C_6$-$C_{60}$ carbocyclic system including at least one aromatic ring. The unsubstituted $C_6$-$C_{60}$ arylene group denotes a divalent group having a $C_6$-$C_{60}$ carbocyclic system including at least one aromatic ring. When the aryl group and the arylene group include at least two rings, the at least two rings may be fused with each other. At least one hydrogen atom of each of the $C_6$-$C_{60}$ aryl group and the $C_6$-$C_{60}$ arylene group may be substituted with the same substituent as in the substituted. $C_1$-$C_{60}$ alkyl group described above.

Examples of the substituted or unsubstituted $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (for example, o-, m- and p-fluorophenyl group, a dichlorophenyl group), a dicyanophenyl group, a trifluoromethoxyphenyl group, o-, m- and p-tolyl group, o-, m- and p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azulenyl group, a heptalenyl group, an acenaphthylenyl group, a phenalenyl group, a fluolenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexasenyl group, a rubisenyl group, a coroneryl group, a trinaphthylenyl group, a heptaphenyl group, a heptasenyl group, a pyrantrenyl group, and an obalenyl group. Examples of the substituted $C_6$-$C_{60}$ aryl group will be easily understood by one of ordinary skill in the art with reference to those of the unsubstituted $C_6$-$C_{60}$ aryl group and the substituted $C_1$-$C_{60}$ alkyl group described above. Examples of the substituted or unsubstituted $C_6$-$C_{60}$ arylene group will be easily understood by one of ordinary skill in the art with reference to those of the substituted or unsubstituted $C_6$-$C_{60}$ aryl group described above.

The unsubstituted $C_2$-$C_{60}$ heteroaryl group denotes a monovalent group including at least one ring containing at least one heteroatom selected from the group consisting of N, O, P, and S. The unsubstituted $C_2$-$C_{60}$ heteroarylene group denotes a divalent group including at least one ring containing at least one heteroatom selected from the group consisting of N, O, P, and S. In this regard, when the heteroaryl group and the heteroarylene group include at least two rings, the at least two rings may be fused with each other. At least one hydrogen atom of each of the heteroaryl group and the heteroarylene group may be substituted with the same substituent as in the substituted $C_1$-$C_{60}$ alkyl group described above.

Examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, and the like. Examples of the unsubstituted $C_2$-$C_{60}$ heteroarylene group will be easily understood by one of ordinary skill in the art with reference to those of the substituted or unsubstituted $C_2$-$C_{60}$ arylene group described above.

The substituted or unsubstituted $C_6$-$C_{60}$ aryloxy group indicates Formula of —OA$_2$ (A$_2$ is the substituted or unsubstituted $C_6$-$C_{60}$ aryl group), and the substituted or unsubstituted $C_6$-$C_{60}$ arylthio group indicates Formula of —SA$_3$ (A$_3$ is the substituted or unsubstituted $C_6$-$C_{60}$ aryl group).

An OLED according to an embodiment of the present invention will now be described in more detail with reference to the following Examples. These Examples are for illustrative purposes only and are not intended to limit the scope of the invention.

EXAMPLES

Synthesis Example 1

Synthesis of Compound 2

Compound 2 was synthesized according to Reaction Scheme 1 below:

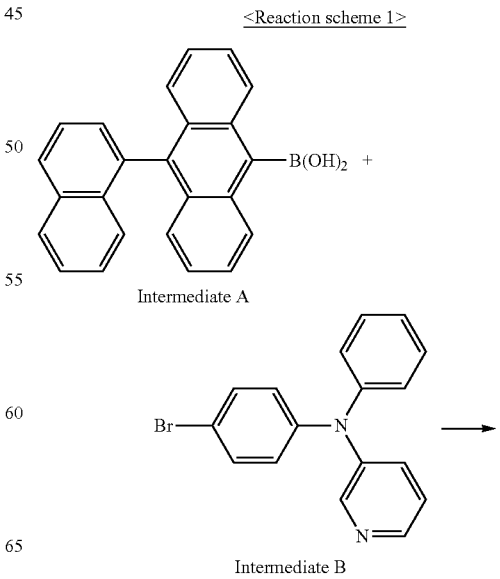

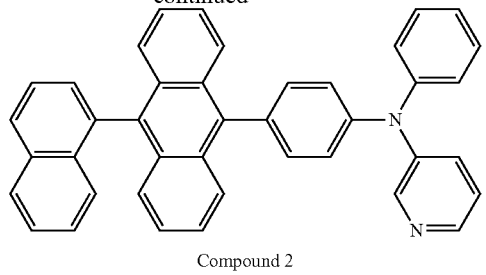

Compound 2

6.96 g (20.0 mmol) of boronic acid (Intermediate A), 6.48 g (20.0 mmol) of 4-bromotriphenylamine (Intermediate B), 1.15 g (1.0 mmol) of tetrakis(triphenylphosphin)palladium (Pd(PPh$_3$)$_4$), and 8.29 g (60.0 mmol) of K$_2$CO$_3$ were dissolved in 60 ml of a mixed solution of THF/H$_2$O (at a volume ratio of 2:1), and the resultant solution was then stirred at 70° C. for 5 hours. The obtained reaction solution was cooled down to room temperature, 40 ml of water was added thereto, and the resultant reaction solution was then extracted three times with 50 ml of ethylether. The obtained organic layer was dried with magnesium sulfate, and a solvent was evaporated therefrom to obtain a crude product. The crude product was purified with silicagel column chromatography to obtain 9.55 g of Compound 2 (yield 87%). The obtained Compound 2 was confirmed by mass spectrometry/fast atom bombardment (MS/FAB).

$C_{41}H_{23}N_2$: calc. 548.23. found 548.61.

Example 1

As an anode, a 15 Ω/cm$^2$ (1200 Å) Corning ITO glass substrate was cut to a size of 50 mm×50 mm×0.7 mm, washed with ultrasonic waves in isopropyl alcohol and pure water for 5 minutes each, and then cleaned with UV and ozone for 30 minutes. The ITO glass substrate was mounted on a vacuum depositor.

2-TNATA was deposited on the ITO glass substrate to form a HIL having a thickness of 600 Å and 4,4'-bis[N-(1-naphthyl)-N-phenylamino]biphenyl (NPB) was deposited on the HIL to form a HTL having a thickness of 300 Å.

Next, 9,10-di(naphthalene-2-yl)anthracene (ADN) and 4,4'-bis[2-(4-(N,N-diphenylamino)phenyl)vinyl)biphenyl (DPAVBi) were co-deposited on the HTL at a weight ratio of 98:2 to form an EML having a thickness of 300 Å.

Thereafter, Compound 2, an amine-based compound, was deposited on the EML to form a buffer having a thickness of 50 Å.

Afterwards, an anthracene-based compound (Compound 200 below) and a Li-complex (Compound 250 below) were co-deposited on the buffer layer to form an ETL having a thickness of 260 Å, LiF was deposited on the ETL to form an EIL having a thickness of 10 Å, and Al was deposited on the EIL to form a second electrode (cathode) having a thickness of 3,000 Å, thereby completing the manufacture of an OLED.

<DPAVBi>

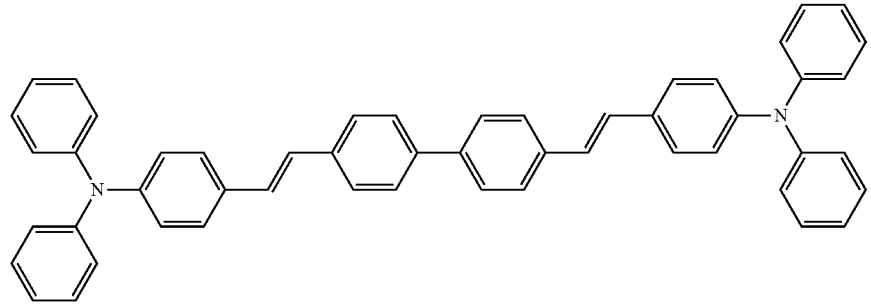

<Compound 2>

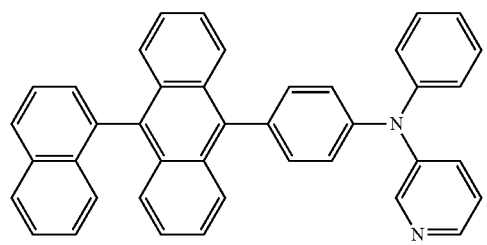

<Compound 200>

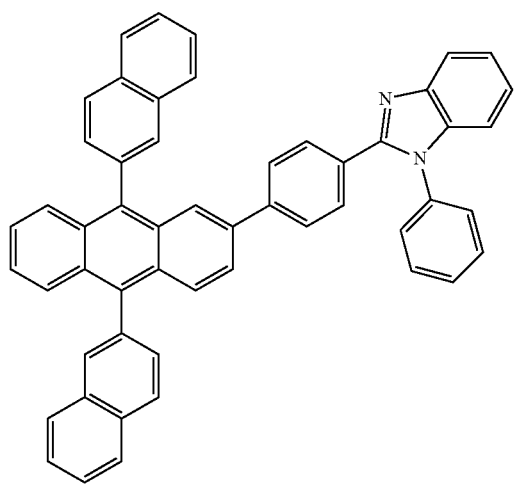

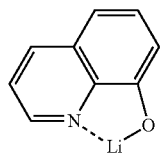

<Compound 250>

Comparative Example 1

An OLED was manufactured in the same manner as in Example 1, except that the buffer layer was not formed, and Compound 2 (amine-based compound) was deposited on the EML to form an ETL having a thickness of 310 Å.

Comparative Example 2

An OLED was manufactured in the same manner as in Example 1, except that BCP (see below) was used instead of Compound 2 in the formation of the buffer layer.

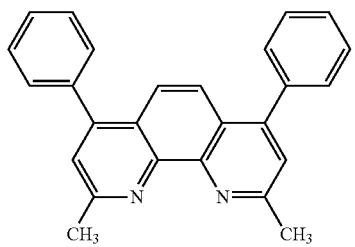

<BCP>

Comparative Example 3

An OLED was manufactured in the same manner as in Example 1, except that the buffer layer was not formed, and the thickness of the ETL was adjusted to 310 Å.

Evaluation Example 1

Driving voltage, current density, efficiency, power efficiency, brightness, color coordinate, quantum efficiency, and lifetime of each of the OLEDs manufactured according to Example 1 and Comparative Examples 3 were evaluated, and the results are shown in Table 1 below and FIGS. 2 to 4. The lifetime evaluation was performed at a luminance of 720 nit.

Figure 2:
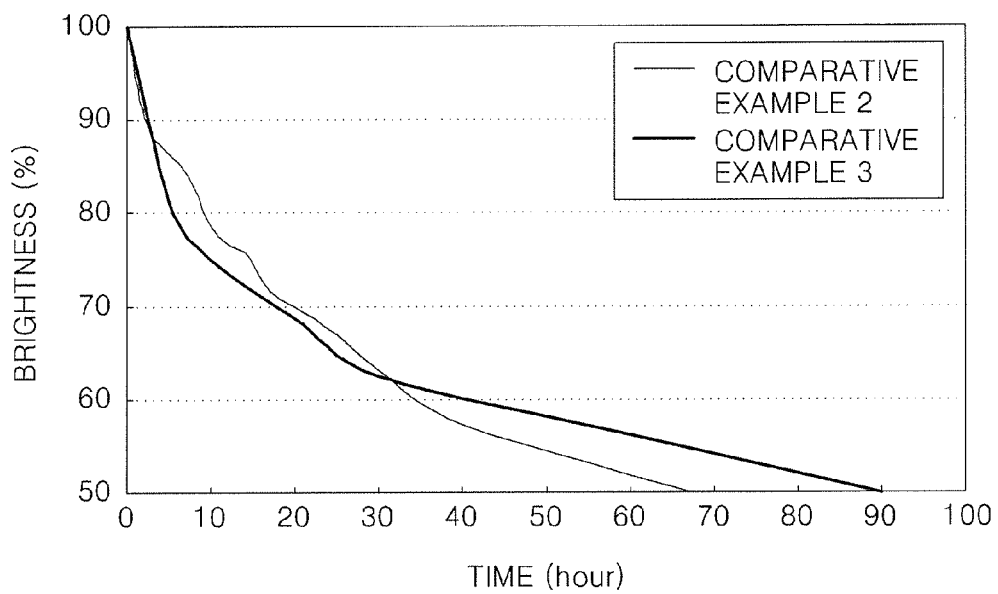
FIG. 2 is a graph showing lifetime (lifespan) data of OLEDs manufactured according to Comparative Examples 2 and 3.
Figure 3:
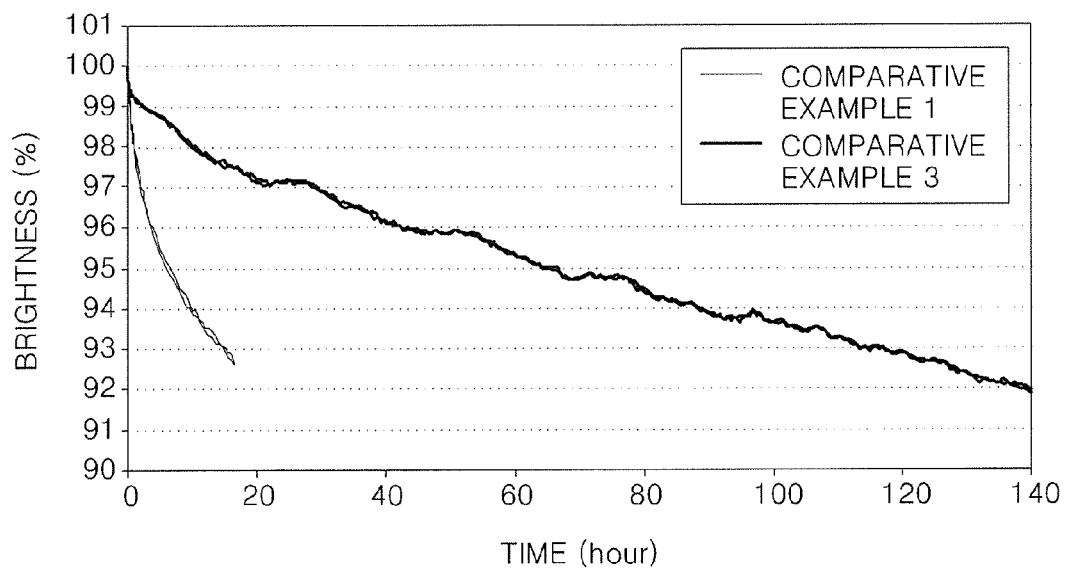
FIG. 3 is a graph showing lifetime data of OLEDs manufactured according to Comparative Examples 1 and 3.
Figure 4:
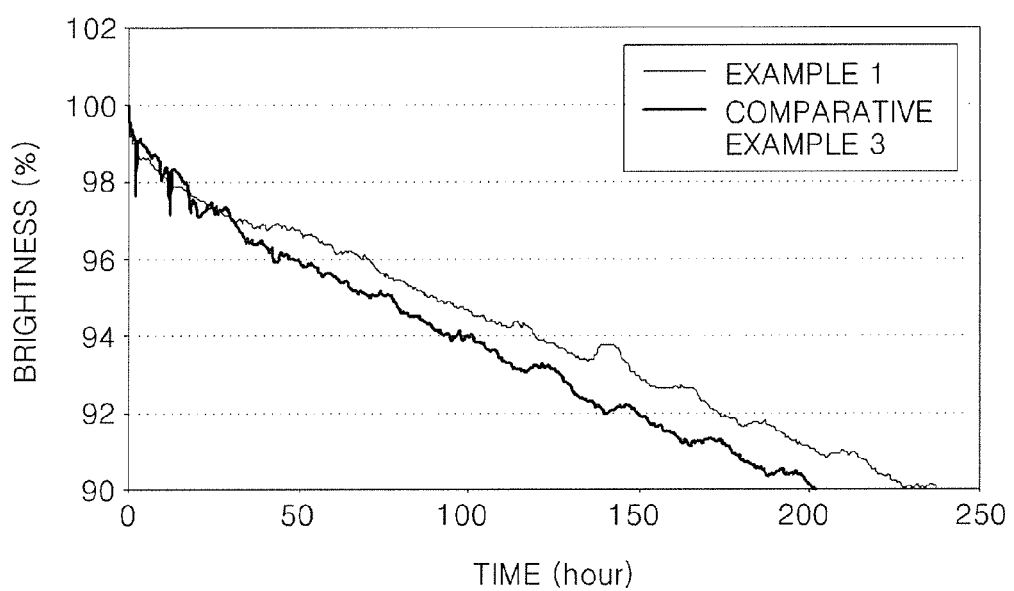
FIG. 4 is a graph showing lifetime data of OLEDs manufactured according to Example 1 and Comparative Example 3.

As shown in Table 1 and FIGS. 2 to 4, it was confirmed that the OLED of Example 1 has excellent electrical characteristics, in particular, efficiency and lifetime characteristics, as compared to the OLEDs of Comparative Examples 1 to 3.

As described above, according to the one or more embodiments of the present invention, an OLED including the amine-based compound may have low driving voltage, high brightness, high efficiency, and long lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting diode comprising a substrate; a first electrode; a second electrode facing the first electrode; an emission layer between the first electrode and the second electrode; an electron transport layer between the emission layer and the second electrode; and a buffer layer between the emission layer and the electron transport layer, wherein the buffer layer comprises an amine-based compound represented by Formula 1 below:

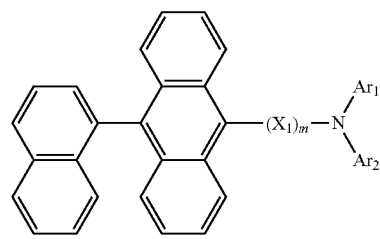

<Formula 1>

TABLE 1

|  | Buffer layer | ETL | Driving voltage (V) | Current density (mA/cm$^2$) | Efficiency (cd/A) | Power efficiency (lm/W) | brightness (cd/m$^2$) | CIEx | CIEy | Quantum efficiency |
|---|---|---|---|---|---|---|---|---|---|---|
| Example 1 | compound 2 (50 Å) | compound 200: compound 250 (260 Å) | 3.8 | 8.15 | 6.20 | 5.13 | 505.3 | 0.14 | 0.0471 | 12.57 |
| Comparative Example 1 | — | compound 2 (310 Å) | 3.6 | 9.20 | 5.67 | 4.94 | 521.2 | 0.1397 | 0.0479 | 11.33 |
| Comparative Example 2 | BCP (50 Å) | compound 200: compound 250 (260 Å) | 7 | 8.7 | 6.24 | 2.84 | 550 | 0.15 | 0.06 | 11.4 |
| Comparative Example 3 | — | compound 200: compound 250 (310 Å) | 3.8 | 8.60 | 5.58 | 4.62 | 480.4 | 0.1351 | 0.0564 | 10.04 | wherein in Formula 1, $Ar_1$ and $Ar_2$ are each independently a substituted or unsubstituted $C_6$-$C_{60}$ aryl group; or a substituted or unsubstituted $C_2$-$C_{60}$ heteroaryl group excluding a substituted or unsubstituted pyridinyl group represented by Formula 2E;

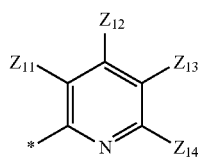

Formula 2E $X_1$ is a substituted or unsubstituted $C_6$-$C_{60}$ arylene group or a substituted or unsubstituted $C_2$-$C_{60}$ heteroarylene group;

m is an integer of 1 to 5; and at least one substituent of the substituted $C_6$-$C_{60}$ aryl group, the substituted $C_2$-$C_{60}$ heteroaryl group, the substituted $C_6$-$C_{60}$ arylene group, and the substituted $C_2$-$C_{60}$ heteroarylene group is one of deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, $C_6$-$C_{60}$ aryl group, and a $C_2$-$C_{60}$ heteroaryl group;

wherein at least one of $Ar_1$ and $Ar_2$ is one of Formulae 2F to 2K and 2M to 2X:

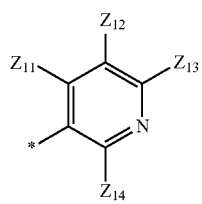

Formula 2F

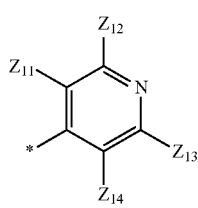

Formula 2G

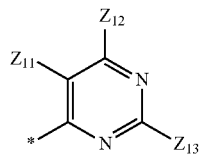

Formula 2H

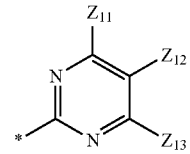

Formula 2I

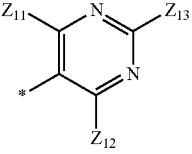

Formula 2J

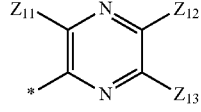

Formula 2K

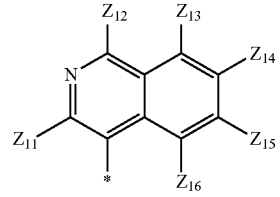

Formula 2M

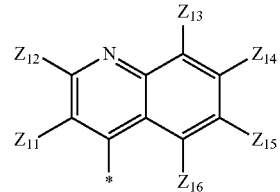

Formula 2N

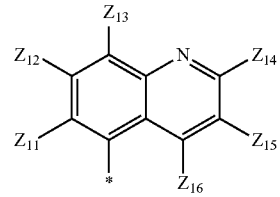

Formula 2O

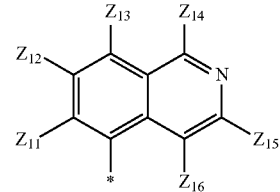

Formula 2P

-continued

Formula 2Q
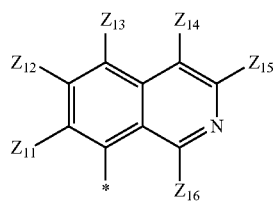

Formula 2R
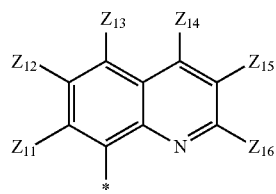

Formula 2S
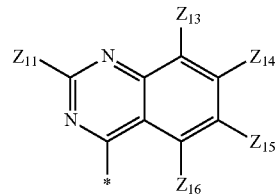

Formula 2T
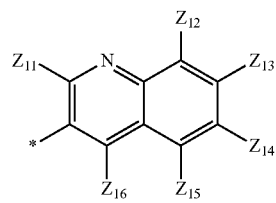

Formula 2U
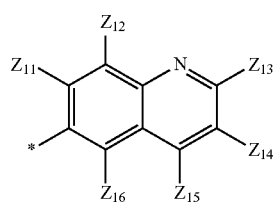

Formula 2V
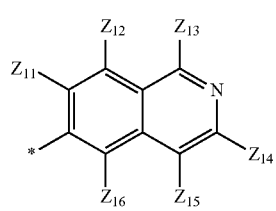

Formula 2W
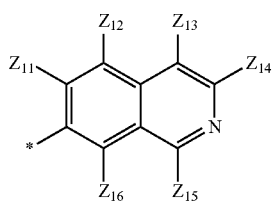

Formula 2X
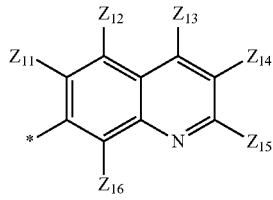

wherein in Formulae 2E, 2F to 2K and 2M to 2X, $Z_{11}$ through $Z_{19}$ are each independently one of hydrogen; deuterium; —F; —Cl; —Br; —I; —CN; a hydroxyl group; —$NO_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group; and

* denotes a binding site with N of Formula 1.

2. The organic light-emitting diode of claim 1, wherein $Ar_1$ and $Ar_2$ are each independently a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyrazinyl group, a substituted or unsubstituted pyrimidinyl group, a substituted or unsubstituted benzoimidazolyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinylene group, a substituted or unsubstituted phenanthridinyl group, a substituted or unsubstituted pyranyl group, a substituted or unsubstituted chromenyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, a substituted or unsubstituted isoxazolyl group, a substituted or unsubstituted dibenzothiophenyl group, a substituted or unsubstituted dibenzofuranyl group, a substituted or unsubstituted triazinyl group, a substituted or unsubstituted oxadiazolyl group, a substituted or unsubstituted pyridazinyl group, a substituted or unsubstituted triazolyl group, a substituted or unsubstituted tetrazolyl group, or a substituted or unsubstituted isoquinolinyl group.

3. The organic light-emitting diode of claim 1, wherein $Ar_1$ and $Ar_2$ are each independently a substituted or unsubstituted phenyl group, a substituted or unsubstituted naphthyl group, a substituted or unsubstituted fluorenyl group, a substituted or unsubstituted phenanthrenyl group, a substituted or unsubstituted anthryl group, a substituted or unsubstituted pyrenyl group, a substituted or unsubstituted chrysenyl group, a substituted or unsubstituted pyrimidinyl group, a substituted or unsubstituted pyrazinyl group, a substituted or unsubstituted quinolinyl group, a substituted or unsubstituted quinazolinyl group, a substituted or unsubstituted carbazolyl group, or a substituted or unsubstituted isoquinolinyl group.

4. An organic light-emitting diode comprising a substrate; a first electrode; a second electrode facing the first electrode; an emission layer between the first electrode and the second electrode; an electron transport layer between the emission layer and the second electrode; and a buffer layer between the emission layer and the electron transport layer, wherein the buffer layer comprises an amine-based compound represented by Formula 1 below:

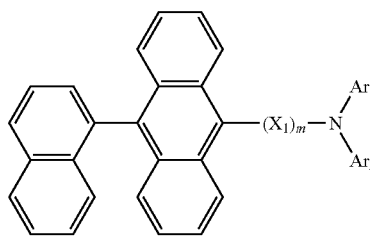

wherein in Formula 1, $Ar_1$ and $Ar_2$ are each independently a substituted or unsubstituted $C_6$-$C_{60}$ aryl group or a substituted or unsubstituted $C_2$-$C_{60}$ heteroaryl group;

$X_1$ is a substituted or unsubstituted $C_6$-$C_{60}$ arylene group or a substituted or unsubstituted $C_2$-$C_{60}$ heteroarylene group;

m is an integer of 1 to 5; and at least one substituent of the substituted $C_6$-$C_{60}$ aryl group, the substituted $C_2$-$C_{60}$ heteroaryl group, the substituted $C_6$-$C_{60}$ arylene group, and the substituted $C_2$-$C_{60}$ heteroarylene group is one of deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, $C_6$-$C_{60}$ aryl group, and a $C_2$-$C_{60}$ heteroaryl group;

wherein at least one of $Ar_1$ and $Ar_2$ is one of Formulae 2F to 2K and 2M to 2X:

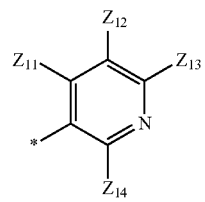

Formula 2F

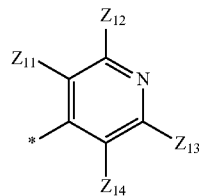

Formula 2G

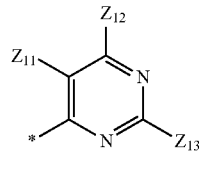

Formula 2H

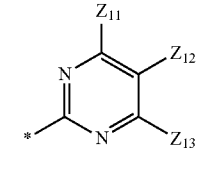

Formula 2I

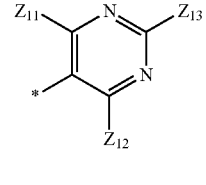

Formula 2J

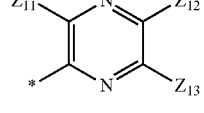

Formula 2K

Formula 2M
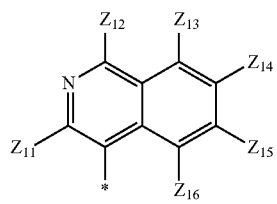

Formula 2N
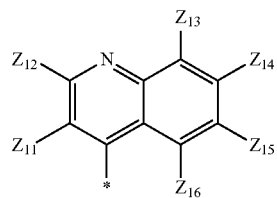

Formula 2O
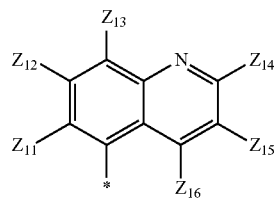

Formula 2P
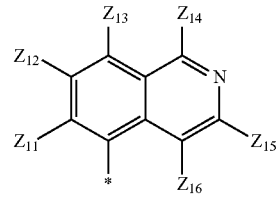

Formula 2Q
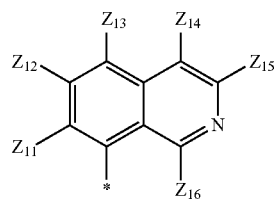

Formula 2R
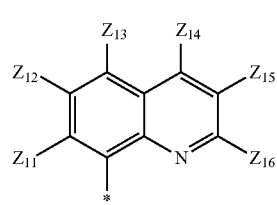

Formula 2S
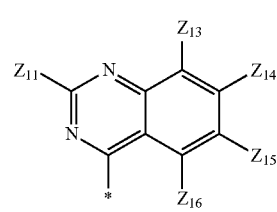

Formula 2T
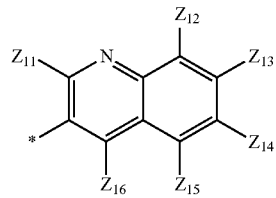

Formula 2U
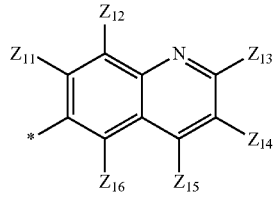

Formula 2V
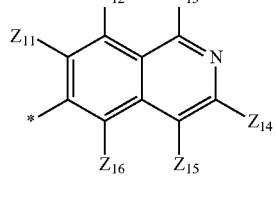

Formula 2W
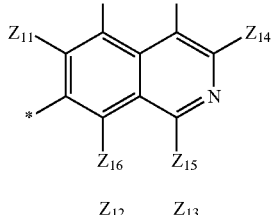

Formula 2X
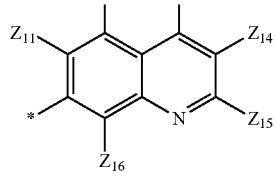

wherein in Formulae 2F to 2K and 2M to 2X, $Z_{11}$ through $Z_{19}$ are each independently one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group; and

* denotes a binding site with N of Formula 1, wherein at least one of $Ar_1$ and $Ar_2$ is a substituted $C_6$-$C_{60}$ aryl group; and at least one substituent of the substituted $C_6$-$C_{60}$ aryl group is one of —F; —CN; —$NO_2$; a $C_1$-$C_{60}$ alkyl group substituted with at least one —F; and a $C_2$-$C_{60}$ heteroaryl group.

5. The organic light-emitting diode of claim 4, wherein at least one of $Ar_1$ and $Ar_2$ is a substituted phenyl group, a substituted naphthyl group, a substituted fluorenyl group, a substituted phenanthrenyl group, a substituted anthryl group, a substituted pyrenyl group, or a substituted chrysenyl group; and at least one substituent of the substituted phenyl group, the substituted naphthyl group, the substituted fluorenyl group, the substituted phenanthrenyl group, the substituted anthryl group, the substituted pyrenyl group, and the substituted chrysenyl group is one of —F; —CN; —$NO_2$; a $C_1$-$C_{10}$ alkyl group substituted with at least one —F; and a $C_5$-$C_9$ heteroaryl group containing at least one N as a ring-constituting atom.

6. The organic light-emitting diode of claim 4, wherein at least one of $Ar_1$ and $Ar_2$ is a substituted phenyl group or a substituted naphthyl group; and at least one substituent of the substituted phenyl group and the substituted naphthyl group is one of —F; —CN; a nitro group; a pyridinyl group; a pyrazinyl group; a pyrimidinyl group; a quinolinyl group; an isoquinolinyl group; a carbazolyl group; and a quinolazinyl group.

7. The organic light-emitting diode of claim 1, wherein $Ar_1$ and $Ar_2$ are each independently one of Formulae 2A to 2D, 2F to 2K, and 2M to 2X below:

Formula 2A

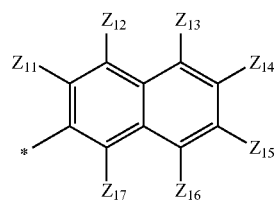

Formula 2B

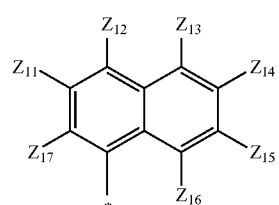

Formula 2C

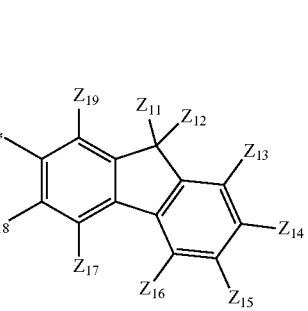

Formula 2D

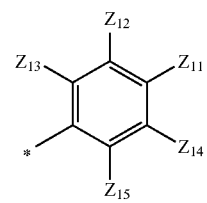

Formula 2E

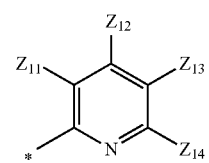

Formula 2F

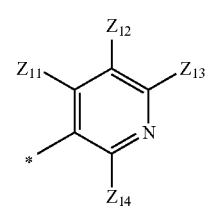

Formula 2G

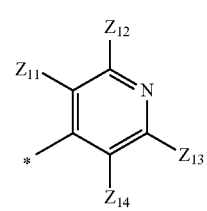

Formula 2H

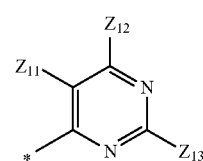

Formula 2I

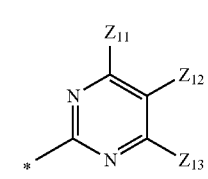

Formula 2J

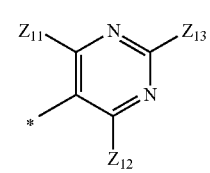

Formula 2K

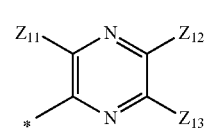

-continued

Formula 2M
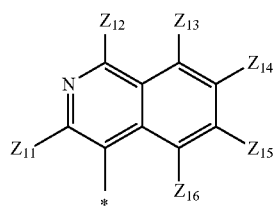

Formula 2N
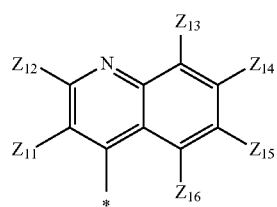

Formula 2O
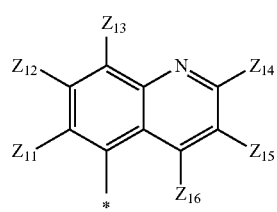

Formula 2P
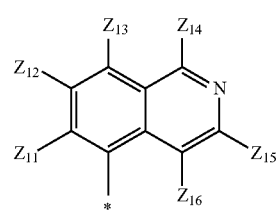

Formula 2Q
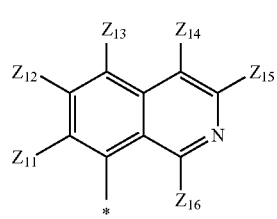

Formula 2R
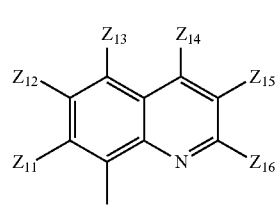

Formula 2S
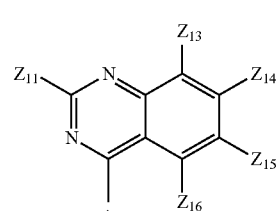

-continued

Formula 2T
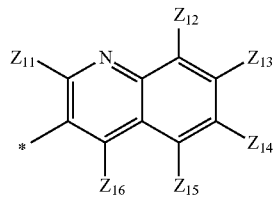

Formula 2U
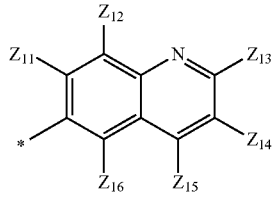

Formula 2V
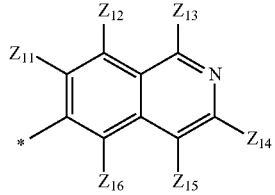

Formula 2W
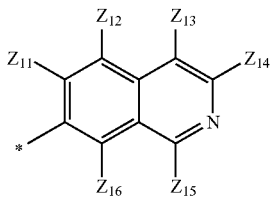

Formula 2X
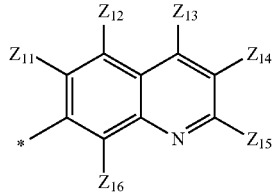

wherein in Formulae 2A to 2Z, $Z_{11}$ through $Z_{19}$ are each independently one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_2$-$C_{60}$ alkenyl group; a $C_2$-$C_{60}$ alkynyl group; a $C_1$-$C_{60}$ alkyl group, a $C_1$-$C_{60}$ alkoxy group, a $C_2$-$C_{60}$ alkenyl group, and a $C_2$-$C_{60}$ alkynyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a $C_3$-$C_{60}$ cycloalkyl group; a $C_6$-$C_{60}$ aryl group; a $C_2$-$C_{60}$ heteroaryl group; a $C_6$-$C_{60}$ aralkyl group; a $C_6$-$C_{60}$ aryloxy group; a $C_6$-$C_{60}$ arylthio group; and a $C_3$-$C_{60}$ cycloalkyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group; and

* denotes a binding site with N of Formula 1.

8. The organic light-emitting diode of claim 7, wherein $Z_{11}$ through $Z_{19}$ are each independently one of hydrogen; deuterium; —F; —Cl; —Br; —I; —CN; a hydroxyl group; —$NO_2$; an amino group; an amidino group; hydrazine; hydrazone; a carboxyl group or a salt thereof; a sulfonic acid group or a salt thereof; a phosphoric acid or a salt thereof; a $C_1$-$C_{10}$ alkyl group; a $C_1$-$C_{10}$ alkoxy group; a $C_1$-$C_{10}$ alkyl group and a $C_1$-$C_{10}$ alkoxy group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; a phenyl group; a naphthyl group; an anthryl group; a fluorenyl group; a pyrenyl group; a chrysenyl group; a pyridinyl group; a pyrazinyl group; a pyrimidinyl group; a triazinyl group; a quinolinyl group; an isoquinolinyl group; a quinazolinyl group; a carbazolyl group; and a phenyl group, a naphthyl group, an anthryl group, a fluorenyl group, a pyrenyl group, a chrysenyl group, a pyridinyl group, a pyrazinyl group, a pyrimidinyl group, a triazinyl group, a quinolinyl group, an isoquinolinyl group, a quinazolinyl group, and a carbazolyl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{10}$ alkyl group, and a $C_1$-$C_{10}$ alkoxy group.

9. The organic light-emitting diode of claim 1, wherein $Ar_1$ and $Ar_2$ are each independently one of Formulae 3(1) through 3(8), 3(10) through 3(15) and 3(17) through 3(28) below:

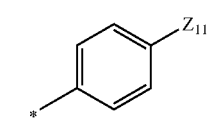

Formula 3(1)

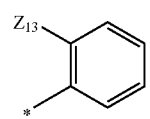

Formula 3(2)

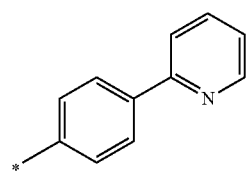

Formula 3(3)

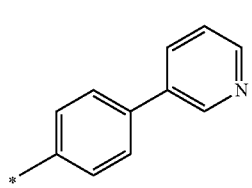

Formula 3(4)

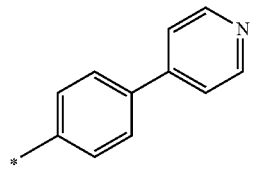

Formula 3(5)

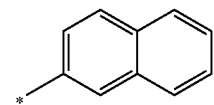

Formula 3(6)

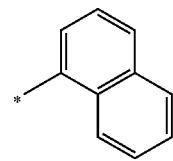

Formula 3(7)

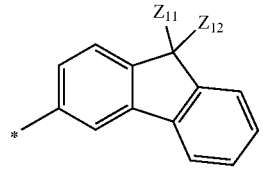

Formula 3(8)

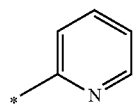

Formula 3(9)

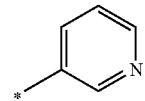

Formula 3(10)

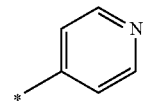

Formula 3(11)

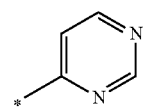

Formula 3(12)

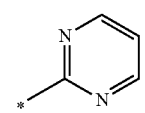

Formula 3(13)

Formula 3(14)

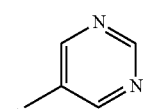

Formula 3(15)

-continued

Formula 3(17)
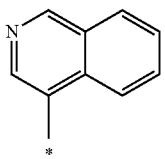

Formula 3(18)
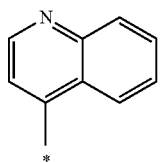

Formula 3(19)
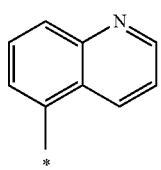

Formula 3(20)
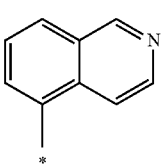

Formula 3(21)
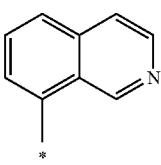

Formula 3(22)
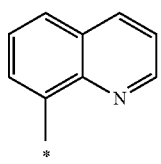

Formula 3(23)
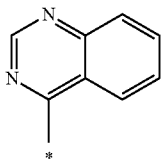

Formula 3(24)
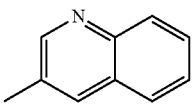

Formula 3(25)
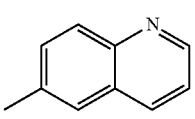

Formula 3(26)
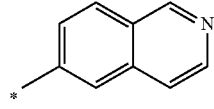

Formula 3(27)
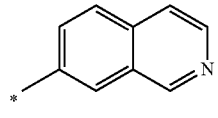

Formula 3(28)
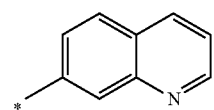

wherein in Formulae 3(1), 3(2), and 3(8), $Z_{11}$ through $Z_{13}$ are each independently hydrogen, —F, —CN, or —NO$_2$; and in Formulae 3(1) through 3(30), * denotes a binding site with N of Formula 1.

10. The organic light-emitting diode of claim 1, wherein $X_1$ is a substituted or unsubstituted phenylene group, a substituted or unsubstituted naphthylene group, a substituted or unsubstituted fluorenylene group, a substituted or unsubstituted phenanthrenylene group, a substituted or unsubstituted anthrylene group, a substituted or unsubstituted triphenylenylene group, a substituted or unsubstituted pyrenylene group, a substituted or unsubstituted chrysenylene group, a substituted or unsubstituted pyridinylene group, a substituted or unsubstituted pyrazinylene group, a substituted or unsubstituted pyrimidinylene group, a substituted or unsubstituted quinolinylene group, a substituted or unsubstituted quinazolinylene group, a substituted or unsubstituted carbazolylene group, a substituted or unsubstituted dibenzothiophenylene group, a substituted or unsubstituted dibenzofuranylene group, a substituted or unsubstituted triazinylene group, a substituted or unsubstituted pyridazinylene group, a substituted or unsubstituted triazolylene group, or a substituted or unsubstituted tetrazolylene group.

11. The organic light-emitting diode of claim 1, wherein a thickness of the buffer layer is in a range of 10 Å to 100 Å.

12. The organic light-emitting diode of claim 1, wherein the electron transport layer comprises an anthracene-based compound.

13. The organic light-emitting diode of claim 1, wherein the electron transport layer includes an anthracene-based compound represented by one of Formulae 10A, 10B, and 10C below:

<Formula 10A>
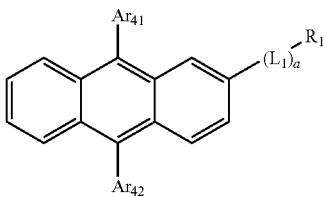

-continued

<Formula 10B>

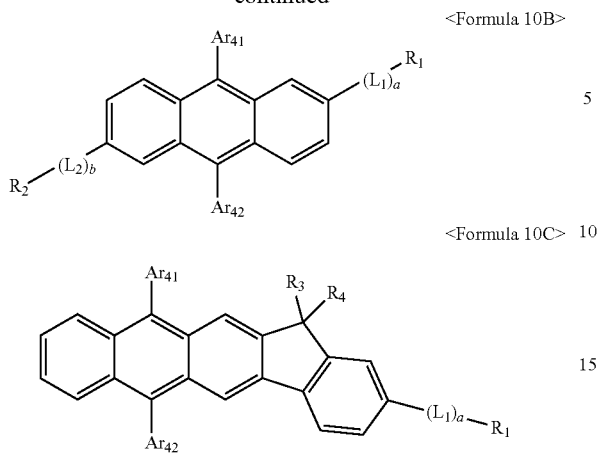

<Formula 10C> wherein in Formulae 10A through 10C, $Ar_c$ and $Ar_{42}$ are each independently a substituted or unsubstituted $C_6$-$C_{60}$ aryl group or a substituted or unsubstituted $C_2$-$C_{60}$ heteroaryl group;

$L_1$ and $L_2$ are each independently a substituted or unsubstituted $C_6$-$C_{60}$ arylene group or a substituted or unsubstituted $C_2$-$C_{60}$ heteroarylene group;

a and b are each independently 0, 1, or 2;

$R_1$ and $R_2$ are each independently a substituted or unsubstituted benzoimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolinyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group; and $R_3$ and $R_4$ are each independently one of a $C_1$-$C_{20}$ alkyl group; a $C_6$-$C_{20}$ aryl group; and a $C_1$-$C_{20}$ alkyl group and a $C_6$-$C_{20}$ aryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof.

14. The organic light-emitting diode of claim 13, wherein in Formulae 10A through 10C, $Ar_{41}$ and $Ar_{42}$ are each independently one of a phenyl group; a naphthyl group; an anthryl group; a pyrenyl group; a fluorenyl group; a pyridinyl group; a pyrazinyl group; a pyrimidinyl group; and a phenyl group, a naphthyl group, an anthryl group, a pyrenyl group, a fluorenyl group, a pyridinyl group, a pyrazinyl group, and a pyrimidinyl group that are substituted with at least one of a phenyl group, a naphthyl group, an anthryl group, a pyrenyl group, a fluorenyl group, a pyridinyl group, a pyrazinyl group, and a pyrimidinyl group; and $L_1$ and $L_2$ are each independently one of a phenylene group; a naphthylene group; an anthrylene group; a pyrenylene group; a fluorenylene group; a pyridinylene group; a pyrazinylene group; a pyrimidinylene group; and a phenylene group, a naphthylene group, an anthrylene group, a pyrenylene group, a fluorenylene group, a pyridinylene group, a pyrazinylene group, and a pyrimidinylene group that are substituted with at least one of a phenyl group, a naphthyl group, an anthryl group, a pyrenyl group, a fluorenyl group, a pyridinyl group, a pyrazinyl group, and a pyrimidinyl group.

15. The organic light-emitting diode of claim 13, wherein $R_1$ and $R_2$ are each independently one of Formulae 11(1) through 11(24) below:

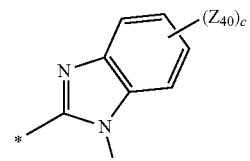

Formula 11(1)

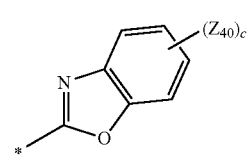

Formula 11(2)

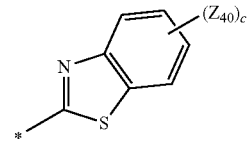

Formula 11(3)

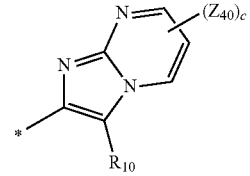

Formula 11(4)

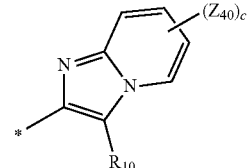

Formula 11(5)

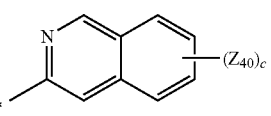

Formula 11(6)

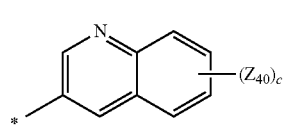

Formula 11(7)

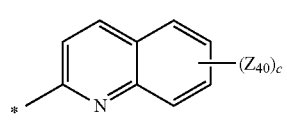

Formula 11(8)

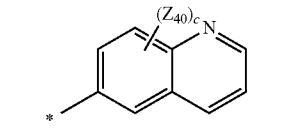

Formula 11(9)

-continued

Formula 11(10)

Formula 11(11)

Formula 11(12)
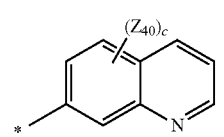

Formula 11(13)
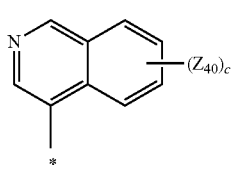

Formula 11(14)
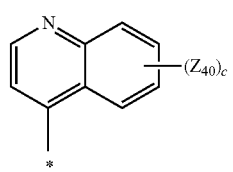

Formula 11(15)
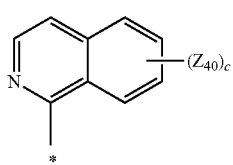

Formula 11(16)

Formula 11(17)
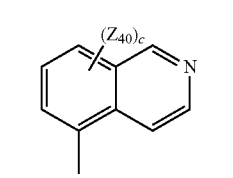

Formula 11(18)
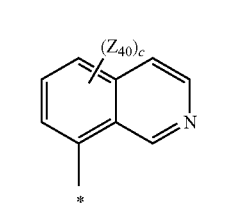

-continued

Formula 11(19)
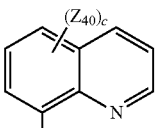

Formula 11(20)
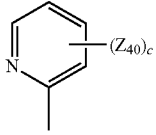

Formula 11(21)
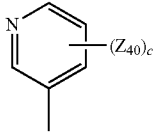

Formula 11(22)
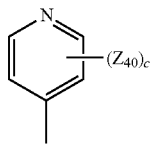

Formula 11(23)
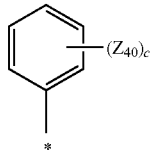

Formula 11(24)
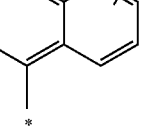

wherein in Formulae 11(1) through 11(24), $R_{10}$ is a substituted or unsubstituted $C_1$-$C_{60}$ alkyl group or a substituted or unsubstituted $C_6$-$C_{60}$ aryl group;

$Z_{40}$ is one of hydrogen; deuterium; —F; —Cl; —Br; —I; —CN; a hydroxyl group; —NO$_2$; an amino group; an amidino group; hydrazine; hydrazone; a carboxyl group or a salt thereof; a sulfonic acid group or a salt thereof; a phosphoric acid or a salt thereof; a $C_1$-$C_{60}$ alkyl group; a $C_1$-$C_{60}$ alkoxy group; a $C_6$-$C_{60}$ aryl group; a $C_2$-$C_{60}$ heteroaryl group; and a $C_1$-$C_{60}$ alkyl group, a $C_1$-$C_{60}$ alkoxy group, a $C_6$-$C_{60}$ aryl group, and a $C_2$-$C_{60}$ heteroaryl group that are substituted with at least one of deuterium, —F, —Cl, —Br, —I, —CN, a hydroxyl group, a nitro group, an amino group, an amidino group, hydrazine, hydrazone, a carboxyl group or a salt thereof, a sulfonic acid group or a salt thereof, and a phosphoric acid or a salt thereof; and c is an integer of 1 to 5.

16. The organic light-emitting diode of claim 15, wherein the electron transport layer comprises an anthracene-based compound represented by Formula 10A, and wherein $R_1$ is represented by Formula 11(1).

17. The organic light-emitting diode of claim 15, wherein the electron transport layer comprises an anthracene-based compound represented by Formula 10C, and wherein $R_1$ is represented by Formula 11(1).

18. The organic light-emitting diode of claim 12, wherein the electron transport layer further comprises an n-dopant.

19. The organic light-emitting diode of claim 12, wherein the electron transport layer further comprises at least one of an Li-complex, LiF, CsF, $Al_2O_3$, $SiO_2$, $Si_3N_4$, and $Cs_2CO_3$.

20. The organic light-emitting diode of claim 18, wherein the n-dopant comprises Compound 250 or 251 below:

<Compound 250>

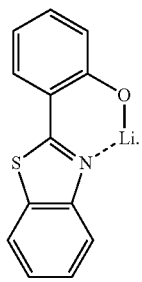

<Compound 251>

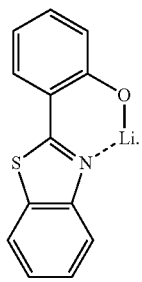

21. The organic light-emitting diode of claim 1, wherein $Ar_1$ and $Ar_2$ are each independently one of Formulae 3(1) through 3(8), 3(10) through 3(15) and 3(17) through 3(28) below and at least one of $Ar_1$ and $Ar_2$ is one of Formulae 3(10) to 3(15) and 3(17) to 3(28):

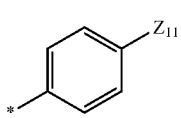
Formula 3(1)

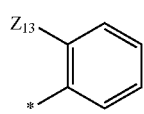
Formula 3(2)

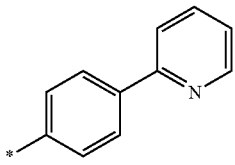
Formula 3(3)

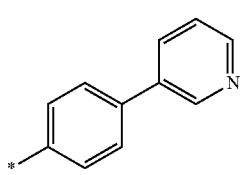
Formula 3(4)

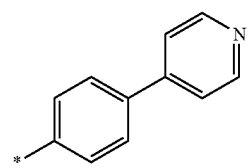
Formula 3(5)

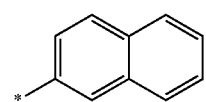
Formula 3(6)

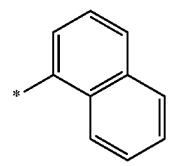
Formula 3(7)

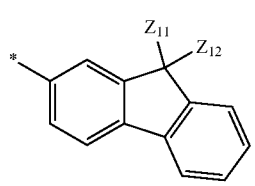
Formula 3(8)

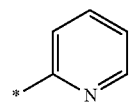
Formula 3(9)

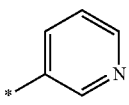
Formula 3(10)

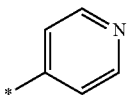
Formula 3(11)

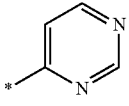
Formula 3(12)

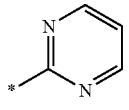
Formula 3(13)

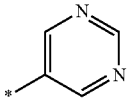
Formula 3(14)

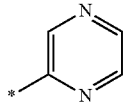
Formula 3(15)

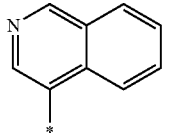
Formula 3(17)

-continued

Formula 3(18)
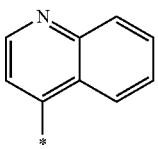

Formula 3(19)
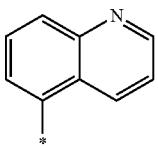

Formula 3(20)
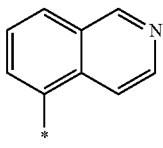

Formula 3(21)
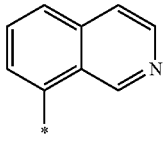

Formula 3(22)
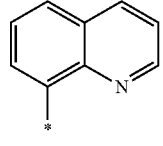

Formula 3(23)
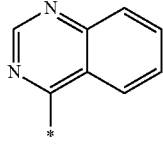

-continued

Formula 3(24)
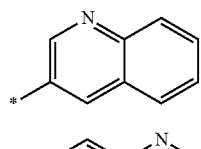

Formula 3(25)
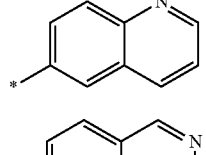

Formula 3(26)
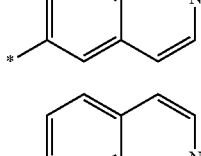

Formula 3(27)
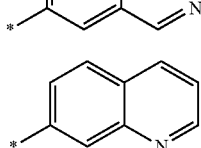

Formula 3(28)
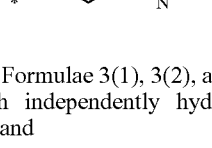

wherein in Formulae 3(1), 3(2), and 3(8), $Z_{11}$ through $Z_{13}$ are each independently hydrogen, —F, —CN, or —NO$_2$; and in Formulae 3(1) through 3(30), * denotes a binding site with N of Formula 1.

22. The organic light-emitting diode of claim 1, wherein at least one of Ar$_1$ and Ar$_2$ is one of Formulae 2F to 2K, 2M and 2O to 2X.

23. The organic light-emitting diode of claim 1, wherein at least one of Ar$_1$ and Ar$_2$ is one of Formulae 2F, 2G, 2J, 2M to 2R and 2T to 2X.

* * * * *